United States Patent
Randazzo et al.

(10) Patent No.: US 12,394,971 B2
(45) Date of Patent: Aug. 19, 2025

(54) ELECTRONIC FUSE SYSTEMS AND DEVICES

(71) Applicants: STMICROELECTRONICS S.r.l., Agrate Brianza (IT); STMICROELECTRONICS (ROUSSET) SAS, Rousset (FR)

(72) Inventors: Vincenzo Randazzo, Biancavilla (IT); Alberto Marzo, Giarre (IT); Giovanni Susinna, Catania (IT); Vanni Poletto, Milan (IT); Antoine Pavlin, Puyricard (FR); Calogero Andrea Trecarichi, Gela (IT); Mirko Dondini, Catania (IT); Roberto Crisafulli, San Gregorio di Catania (IT); Enrico Castro, Catania (IT); Romeo Letor, Mascalucia (IT)

(73) Assignees: STMICROELECTRONICS S.r.l., Agrate Brianza (IT); STMICROELECTRONICS (ROUSSET) SAS, Rousset (FR)

( * ) Notice: Subject to any disclaimer, the term of this patent is extended or adjusted under 35 U.S.C. 154(b) by 448 days.

(21) Appl. No.: 18/064,861

(22) Filed: Dec. 12, 2022

(65) Prior Publication Data

US 2023/0187922 A1     Jun. 15, 2023

Related U.S. Application Data

(60) Provisional application No. 63/289,061, filed on Dec. 13, 2021.

(51) Int. Cl.
*H02H 3/00*     (2006.01)
*H02H 1/00*     (2006.01)
(Continued)

(52) U.S. Cl.
CPC ............ *H02H 3/08* (2013.01); *H02H 1/0007* (2013.01); *H03K 17/687* (2013.01); *H03K 19/20* (2013.01)

(58) Field of Classification Search
None
See application file for complete search history.

(56) References Cited

U.S. PATENT DOCUMENTS

| | | |
|---|---|---|
| 5,030,844 A | 7/1991 | Li et al. |
| 6,373,671 B1 | 4/2002 | Watanabe et al. |
(Continued)

FOREIGN PATENT DOCUMENTS

| | | |
|---|---|---|
| CN | 101910856 A | 12/2010 |
| CN | 108282234 A | 7/2018 |
(Continued)

OTHER PUBLICATIONS

Chen et al., "Built-in self-test and self-calibration for analog and mixed signal circuits," 2019 IEEE International Test Conference, pp. 1-8.

*Primary Examiner* — Stephen W Jackson
(74) *Attorney, Agent, or Firm* — Seed Intellectual Property Group LLP

(57) ABSTRACT

Embodiments are directed to electronic fuse devices and systems. One such electronic fuse includes current sensing circuitry that senses a current in a conductor coupled between a power supply and a load, and generates a current sensing signal indicative of the sensed current. I2t circuitry receives the current sensing signal and determines whether the sensed current exceeds an I2t curve of the conductor. The electronic fuse further includes at least one of external MOSFET temperature sensing circuitry that senses a temperature of an external MOSFET coupled to the conductor, low current bypass circuitry that supplies a reduced current to the load in a low power consumption mode during which (Continued)

the external MOSFET is in a non-conductive state, or desaturation sensing circuitry that senses a drain-source voltage of the external MOSFET.

26 Claims, 36 Drawing Sheets

(51) Int. Cl.
*H02H 3/08* (2006.01)
*H03K 17/687* (2006.01)
*H03K 19/20* (2006.01)

(56) References Cited

U.S. PATENT DOCUMENTS

| | | | |
|---|---|---|---|
| 7,340,662 B1 | 3/2008 | McElwee et al. | |
| 7,813,096 B2 | 10/2010 | Takahashi et al. | |
| 8,283,877 B2 | 10/2012 | Lenk et al. | |
| 10,566,781 B2 | 2/2020 | Wang et al. | |
| 11,005,253 B2 | 5/2021 | Donath | |
| 11,955,790 B2* | 4/2024 | Wortberg | H03K 17/12 |
| 2002/0149972 A1 | 10/2002 | Lamb et al. | |
| 2002/0174382 A1 | 11/2002 | Ledford et al. | |
| 2008/0150671 A1* | 6/2008 | Lindqvist | H02H 3/08 |
| | | | 337/159 |
| 2009/0257162 A1 | 10/2009 | Garrett | |
| 2014/0347774 A1 | 11/2014 | Uehara | |
| 2015/0009597 A1* | 1/2015 | Su | H02H 3/087 |
| | | | 361/87 |
| 2016/0172841 A1 | 6/2016 | Lee et al. | |
| 2017/0160764 A1 | 6/2017 | Suzuki | |
| 2017/0294774 A1 | 10/2017 | Illing et al. | |
| 2018/0294643 A1 | 10/2018 | Donath | |
| 2019/0026205 A1 | 1/2019 | Jin et al. | |
| 2019/0178938 A1 | 6/2019 | Jin et al. | |
| 2020/0266623 A1 | 8/2020 | Letor | |
| 2021/0210953 A1 | 7/2021 | Letor | |
| 2021/0278288 A1 | 9/2021 | Galy et al. | |
| 2022/0065923 A1 | 3/2022 | Dondini et al. | |
| 2022/0190816 A1 | 6/2022 | Castro et al. | |
| 2022/0352705 A1 | 11/2022 | Ramsauer et al. | |
| 2023/0198514 A1 | 6/2023 | Pavlin et al. | |

FOREIGN PATENT DOCUMENTS

| | | |
|---|---|---|
| CN | 110415751 A | 11/2019 |
| EP | 3159992 A1 | 4/2017 |
| JP | 2001298861 A | 10/2001 |

* cited by examiner

ELECTRONIC FUSE SYSTEMS AND DEVICES

BACKGROUND

Technical Field

The present disclosure generally relates to electronic fuse systems and devices.

Description of the Related Art

Fuses are used in many products to avoid current surges and to prevent or reduce the damage that overcurrent may cause. The traditional thermal-based fuses used in the automotive field are generally low in accuracy and response time.

The low accuracy and high spread response time can result in damage to loads and series path components (e.g., wiring, semiconductors, and connectors). To reduce or avoid such damage, manufacturers may design the system with additional safety margins for components, which increases cost, weight (e.g., indirect fuel costs), and pollution (e.g., increasing $CO_2$ emissions) of the vehicle.

Traditional thermal-based fuses are designed for single-use protection against overcurrent events. That is, once such a fuse "blows," it cannot be reset. Instead, the blown fuse is manually replaced with a new fuse.

BRIEF SUMMARY

The present disclosure is generally directed to electronic fuse systems and devices in which the electronic fuse is operable to mimic the electrical characteristics of a traditional external fuse (e.g., a thermal fuse), but provides the significant advantage of being reusable, as opposed to traditional thermal fuses that can only be tripped or "blown" once and cannot be reused after such an event.

The electronic fuse systems and devices provided herein may be utilized to protect any electrical circuitry, and in some embodiments, may be used or incorporated within an automobile. For example, the electronic fuse systems and devices provided herein may be used as fuses in the fuse box of a car or other vehicle.

In various embodiments, the electronic fuse systems and devices include an external switch, such as an external MOSFET transistor that is operable to switch on and off current that is provided to a load through a cable. The external switch may be located within or otherwise electrically coupled to the cable. The cable electrically couples a power supply to the load. A gate driver within the electronic fuse device may be utilized to selectively control the switching on and off of the external switch. The electronic fuse includes circuitry that senses a variety of parameters, and the sensed parameters are processed by circuitry within the electronic fuse in order to determine whether an overcurrent, overload, or other condition exists which could pose a safety issue or that otherwise may cause damage to the load 106. In such a case, a microcontroller within the electronic fuse may control the gate driver to switch off the external switch, thereby protecting the load from the potentially unsafe condition.

In some embodiments, the electronic fuse systems and devices include a shunt resistor that is configured to sense the current in the cable, and provides the sensed current to I2t function circuitry, which allows the electronic fuse systems and devices to mimic the actual electrical characteristics inside the cable.

In some embodiments, the electronic fuse systems and devices are configured to count an amount of time within which a certain current is flowing through the cable, and in response to determining that the current flow has exceeded an allowable time, the external switch is switched off in order to interrupt the current and protect the cable and the load. In some embodiments, multiple thresholds are included and utilized by the electronic fuse systems and devices, and each of the thresholds may be associated with a current intensity and a corresponding duration that is allowable. This facilitates switching off currents at various intensities if they exceed their respective associated allowable duration. In some embodiments, the current may be immediately switched off if the current exceeds a threshold that is associated with immediate action (e.g., a threshold that represents current not be exceeded for any duration of time).

In some embodiments, the electronic fuse systems and devices includes one or more resistors configured to sense the temperature of the external switch (which may be an external power MOSFET). If the sensed temperature is outside an allowed range (e.g., as determined by temperature monitoring or sensing circuitry within the electronic fuse), the electronic fuse may switch off the external switch. In some embodiments, the temperature is translated into a number or numerical value that may be interpreted by logic within the electronic fuse and utilized to control the switching off of the external switch.

In some embodiments, the temperature sensing circuitry switches off the external switch when the sensed temperature reaches a temperature threshold, facilitates avoidance of operation of the external switch at temperatures which may cause unreliable or poor operation of the switch.

In some embodiments, the temperature sensing circuitry may include an NTC (Negative Temperature Coefficient) thermistor, which is a variable resistor having a resistance that varies according to the temperature of the external switch.

In some embodiments, the electronic fuse systems and devices include sensing circuitry configured to sense the drain-source voltage drop of the external switch, and if the drain-source voltage drop is outside of a normal operating range or outside of a range defined by one or more thresholds, then the electronic fuse may switch off the external switch. This facilitates avoidance of operation of the external switch in the saturation region. Avoiding operation in the saturation region is advantageous for power MOSFETs, as operation in the saturation region may result in undesirable power dissipation that could cause internal problems (such as internal or thermal focus problems) in the external switch or external power MOSFET. Accordingly, in some embodiments, the electronic fuse systems and devices provided herein are operable to ensure that the external switch or external power MOSFET operates only in the cut-off or triode regions.

In some embodiments, the electronic fuse systems and devices provided herein include p-channel bypass circuitry which may be utilized to reduce power consumption. For example, if the load is turned off or otherwise is not drawing electrical current or power, it is very inefficient to keep the external power MOSFET switched on, as such operation of the external power MOSFET would result in power losses. The electronic fuse systems and devices include a small internal switch (or bypass MOSFET) that mimics the operation of the external power MOSFET when power of load is turned off, thereby resulting in reduced power losses. When the load is turned on, the bypass MOSFET is turned off and the external power MOSFET is switched on for normal operations.

In some embodiments, the electronic fuse systems and devices include self-test circuitry which may be used to control safety of the whole system. For example, if one or more components in the various sensing circuitry in sensing channels is not reliable or is inaccurate, it could result in faulty operation of the electronic fuse. The self-test circuitry allows the electronic fuse systems and devices to accurate determine such unreliable or inaccurate sensing functions, and facilitates corrective actions that may be taken in response to such determination.

In one or more embodiments, the present disclosure provides an electronic fuse that includes current sensing circuitry configured to sense a current in a conductor coupled between a power supply and a load, and generate a current sensing signal indicative of the sensed current. I2t circuitry emulates an I2t curve of the conductor, and the I2t circuitry is configured to receive the current sensing signal and determine whether the sensed current exceeds the I2t curve of the conductor. The electronic fuse further includes at least one of: external MOSFET temperature sensing circuitry configured to sense a temperature of an external MOSFET coupled to the conductor; low current bypass circuitry configured to supply a reduced current to the load in a low power consumption mode during which the external MOSFET is in a non-conductive state; or desaturation sensing circuitry configured to sense a drain-source voltage of the external MOSFET.

In one or more embodiments, the present disclosure provides a device that includes current sensing circuitry configured to sense a current in a conductor coupled between a power supply and a load, and generate a current sensing signal indicative of the sensed current. I2t circuitry is included that emulates an I2t curve of the conductor, and the I2t circuitry is configured to receive the current sensing signal and determine whether the sensed current exceeds the I2t curve of the conductor. The device further includes self-testing circuitry configured to test a current sensing function of the current sensing circuitry, and generate a test signal indicating a result of the test.

In one or more embodiments, the present disclosure provides a system that includes a power supply, a load, and a conductor electrically coupled to the power supply and the load. Current sensing circuitry is configured to sense a current in the conductor, and generate a current sensing signal indicative of the sensed current. The system includes I2t circuitry that includes logic circuitry, counter circuitry, and latch-off circuitry. The logic circuitry is configured to compare the sensed current to a plurality of first thresholds, with each of the plurality of first thresholds being different from one another. The counter circuitry is configured to adjust a counting value speed and direction based on the comparison of the sensed current to each of the plurality of first thresholds, and generate an overflow signal in response to the counting value reaching or exceeding a threshold counting value. The latch-off circuitry includes a comparator configured to compare the sensed current to a second threshold, and generate an interrupt signal in response to the sensed current exceeding the second threshold.

In one or more embodiments, a method includes sensing, with current sensing circuitry, a current in a conductor coupled between a power supply and a load and generating a current sensing signal indicative of the sensed current. The method includes emulating, with current squared times time (I2t) circuitry, an I2t curve of the conductor and determining whether the sensed current exceeds the I2t curve of the conductor. The method includes testing, with self-testing circuitry, a current sensing function of the current sensing circuitry and generating a test signal indicating a result of the test.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale. For example, the shapes of various elements and angles are not necessarily drawn to scale, and some of these elements are arbitrarily enlarged and positioned to improve drawing legibility. Further, the particular shapes of the elements as drawn are not necessarily intended to convey any information regarding the actual shape of the particular elements, and have been solely selected for ease of recognition in the drawings.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc.

Unless the context indicates otherwise, throughout the specification and claims that follow, the word "comprise" and variations thereof, such as "comprises" and "comprising" are to be construed in an open, inclusive sense, that is, as "including, but not limited to." Further, the terms "first," "second," and similar indicators of sequence are to be construed as being interchangeable unless the context clearly dictates otherwise.

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same embodiment. Furthermore, the particular features, structures, or characteristics may be combined in any suitable manner in one or more embodiments of the present disclosure.

As used in this specification and the appended claims, the singular forms "a," "an," and "the" include plural referents unless the content clearly dictates otherwise. It should also be noted that the term "or" is generally employed in its broadest sense, that is, as meaning "and/or" unless the content clearly dictates otherwise.

The headings and Abstract of the Disclosure provided herein are for convenience only and do not interpret the scope or meaning of the embodiments.

In recent years, electronic systems have emerged to replace traditional fuses, but most such solutions have been proposed using a discrete approach. Alongside these discrete solutions, some integrated solutions have begun to appear. However, the discrete approach typically implement a relatively large printed circuit board (PCB) with several components to replace a single fuse, while the integrated solutions have a very limited flexibility and fail to emulate the operating principle based on the physical relationship I2t. I2t is current squared times time. This is an electrical quantity that is used to determine energy to a protective device, such as a circuit breaker or fuse.

An electronic fuse (or "eFuse") with high accuracy and low response time increases the safety of system and reduces the need to over design components and the manual replacing is needed.

Figure 1:
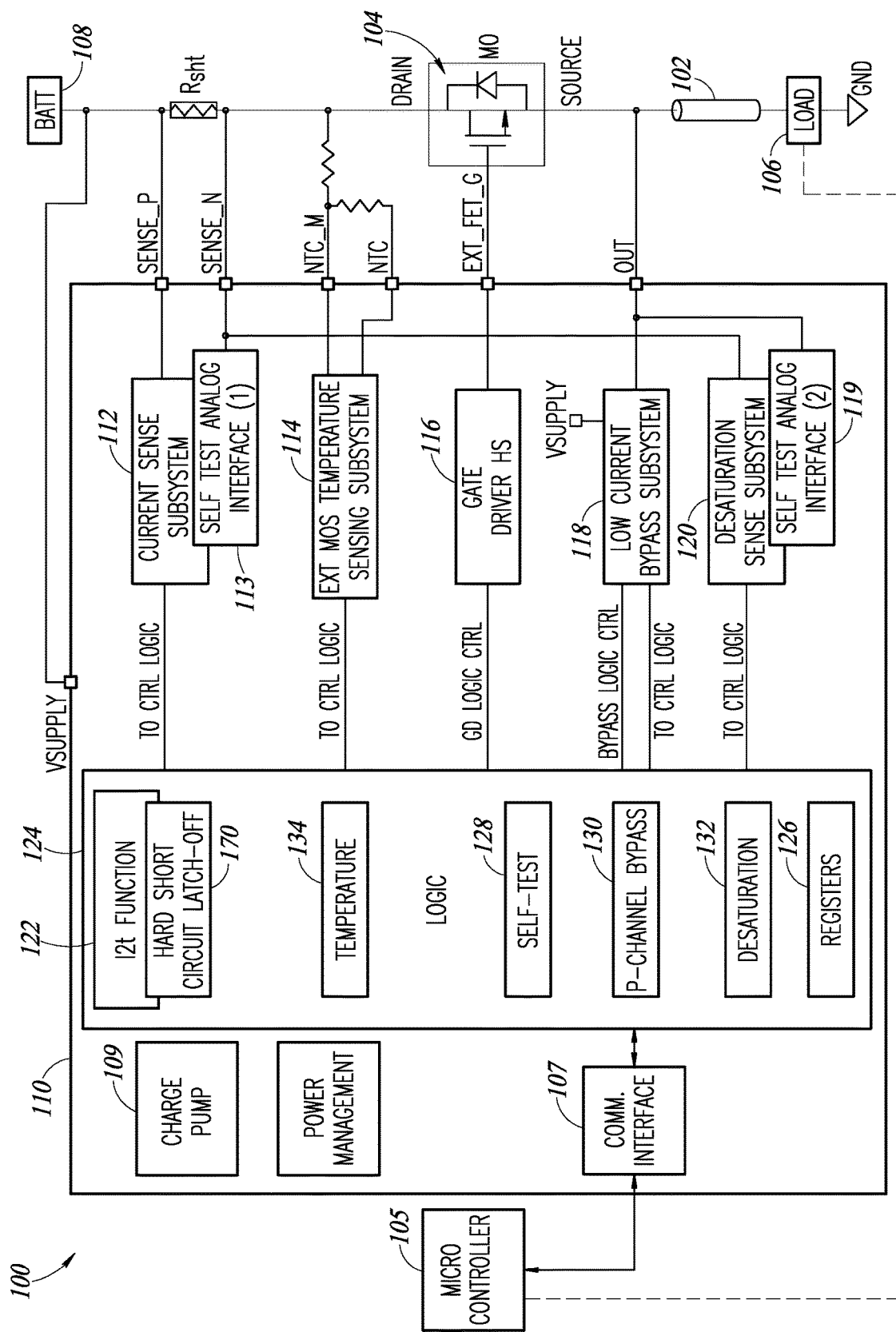
FIG. 1 is a schematic block diagram illustrating an electronic fuse (eFuse) system, in accordance with one or more embodiments.

FIG. 1 is a block diagram illustrating an electronic fuse (eFuse) system 100, in accordance with one or more embodiments. The system 100 may include or be implemented in any device or circuitry in order to provide overcurrent protection. For example, the system 100 may monitor electrical characteristics (e.g., current, voltage, or the like) between a power supply 108 and a load 106, and may protect the load 106 from overcurrent conditions that otherwise may cause damage to the load 106.

The power supply 108 may be any electrical power source, and in some embodiments, the power supply 108 includes one or more batteries. The load 106 may be any electrical component or portion of a circuit that receives or consumes electrical power, such as may be provided by the power supply 108. In some embodiments, the power supply 108 may be an automobile battery and the load 106 may be one or more electrical circuits in the automobile that is electrically connected to the power supply 108 via the cable 102, which may be a wiring harness or other electrical cable or conductor. The power supply 108 may have an output voltage that is greater than 10 V in some embodiments, greater than 20 V in some embodiments, and greater than 40 V in some embodiments. For example, in various embodiments, the power supply 108 may be a 12 V battery, a 24 V battery, or a 48 V battery.

The system 100 includes an electronic fuse 110 that is electrically coupled between the power supply 108 and the load 106. For example, the electronic fuse 110 may be electrically coupled to a cable 102 that is connected to the power supply 108 and the load 106. In some embodiments, the electronic fuse 110 may be electrically coupled to a wire or conductive element that is electrically coupled to the power supply at one end and is electrically coupled to the cable 102 at another end.

As will be described in further detail herein, the electronic fuse 110 is configured to detect and react to overcurrent and overvoltage conditions. When an overload condition occurs, the electronic fuse 110 limits the output current to a safe value, which in some embodiments may be defined by a user. If the overload condition persists, the electronic fuse 110 may control a switching element 104 to go into a non-conductive or open state, thereby electrically disconnecting the load 106 from the power supply 108. In some embodiments, the switching element 104 may be a transistor, such as a MOSFET transistor, and may be referred to herein as "external power MOSFET M0," as labeled in FIG. 1. While the switching element 104 may be described herein as an external power MOSFET, it should be readily appreciated that this is provided as an example, and other types of transistors (including JFET, BJT, IGBT, and using different materials other than silicon like Silicon Carbide or Gallium Nitride) may be utilized as the switching element 104 and driven in accordance with some embodiments.

In some embodiments, the electronic fuse 110 is a single or unitary device, such as a single chip or electronic package. For example, as shown in FIG. 1, the electronic fuse 110 may be a single electronic package including a plurality of pins or electrical leads configured to electrically couple the electronic fuse 110 to electrical elements which may be external to the package. The electronic fuse 110 includes a number of subsystems, each of which includes electrical circuitry for monitoring or controlling particular aspects or characteristics which may be associated with an overload condition between the power supply 108 and the load 106.

In some embodiments, the electronic fuse 110 includes a current sensing subsystem 112 (which may include corresponding self-test circuitry 113), an external MOSFET temperature sensing subsystem 114, a gate driver 116, a low current bypass subsystem 118, and a desaturation sensing subsystem 120 (which may include corresponding self-test circuitry 119). Each of these subsystems may be or include circuitry that is configured to perform the various functions described herein with respect to the subsystems. In some embodiments, one or more of the subsystems may be implemented as circuitry in an integrated circuit, a microprocessor, or the like.

A digital core 122 (which may be referred to herein as logic 122), is included within the electronic fuse 110 and is communicatively coupled to each of the subsystems described herein. More particularly, the logic 122 is configured to receive sensing signals or data from the subsystems and to control operations of the switching element 104 in response to the received sensing signals or data. For example, the logic 122 may include circuitry that is utilized to determine whether an overload, overcurrent, over temperature, saturation threshold, or other condition exists which may be undesirable to deliver to the load 106, and the logic 122 may switch off the switching element 104 thereby protecting the load 106 from such condition.

In some embodiments, the logic 122 may further include registers 126. The registers 126 may include any circuitry configured to implement one or more registers and to carry out any of the associated functionalities as described in further detail herein. In some embodiments, the registers 126 may include digital circuitry (e.g., a cascade of flip-flops, or the like) that implements one or more shift registers. In some embodiments, the logic 122 may further include computer-readable memory configured to store data.

As shown in FIG. 1, in some embodiments, the logic 122 includes I2t function circuitry 124, self-test circuitry 128 (which may be utilized for self-test functionality of any of the various subsystems, as will be described in further detail herein), p-channel bypass circuitry 130, desaturation sensing circuitry 132, and temperature monitoring circuitry 134, each of which will be described in further detail herein.

Figure 2:
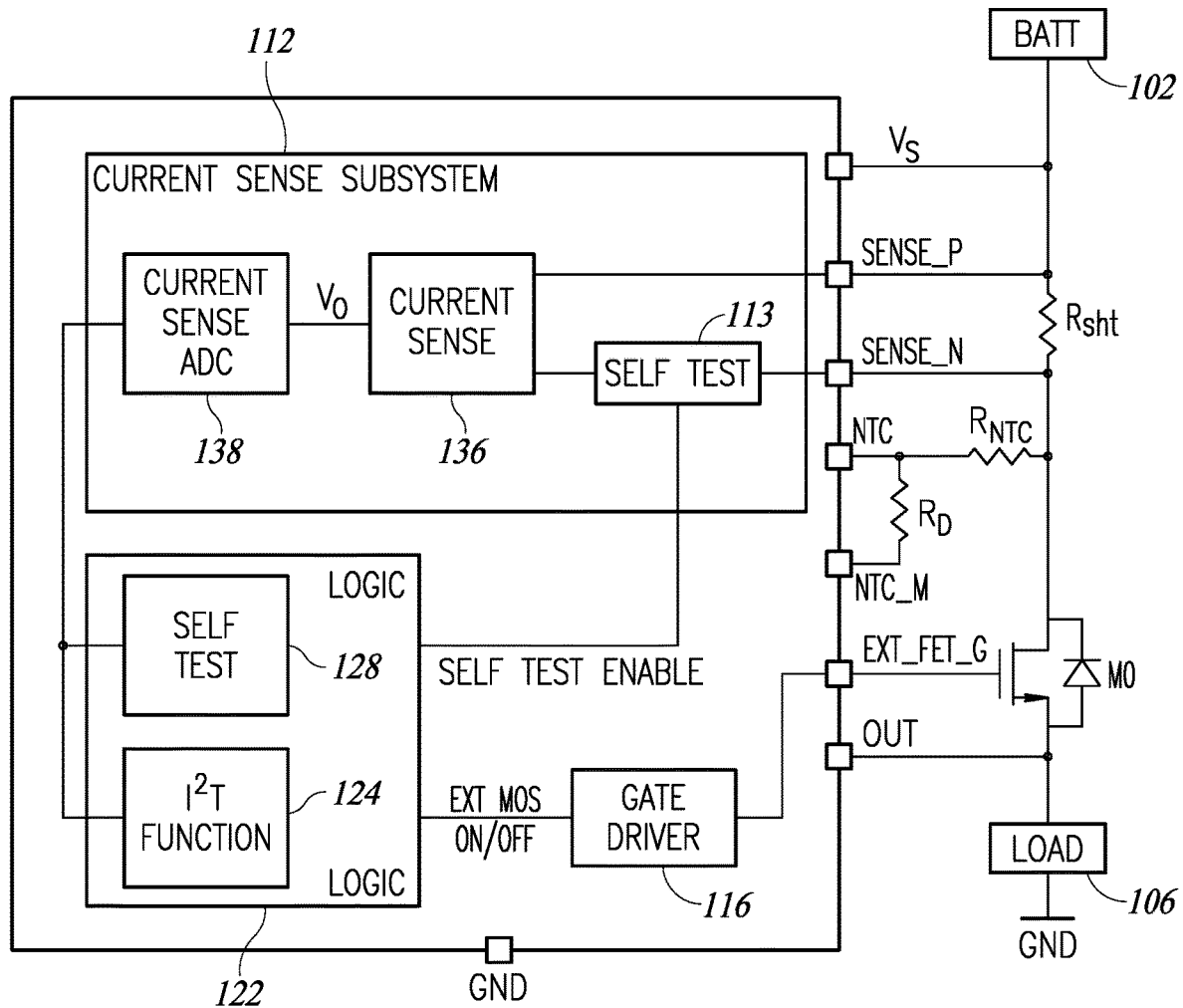
FIG. 2 is a schematic block diagram illustrating a high level view of the current sensing subsystem of the system shown in FIG. 1, in accordance with one or more embodiments.

FIG. 2 is a block diagram illustrating a high level view of the current sensing subsystem 112. As shown in FIG. 2, the current sensing subsystem 112 includes current sensing circuitry 136 that senses the current $I_{OUT}$ flowing through an external shunt resistor Rsht, which in turn is the current flowing through the external power MOSFET M0 (which may be, for example, the current supplied to the load 106). The current sensing circuitry 136 generates a voltage $V_0$ indicative of the current $I_{OUT}$. The current sensing subsystem 112 further includes an analog-to-digital converter (ADC) 138 that converts the sensed value $V_0$ to digital data representative or otherwise associated with the sensed current, and provides this digital data to the I2t function circuitry 124 in order to perform the electronic fuse functionality as described herein.

In some embodiments, the current sensing subsystem 112 includes corresponding self-test circuitry 113 and the logic 122 may include corresponding self-test circuitry 128 for testing the current sensing functionality as described in further detail herein.

Figure 3:
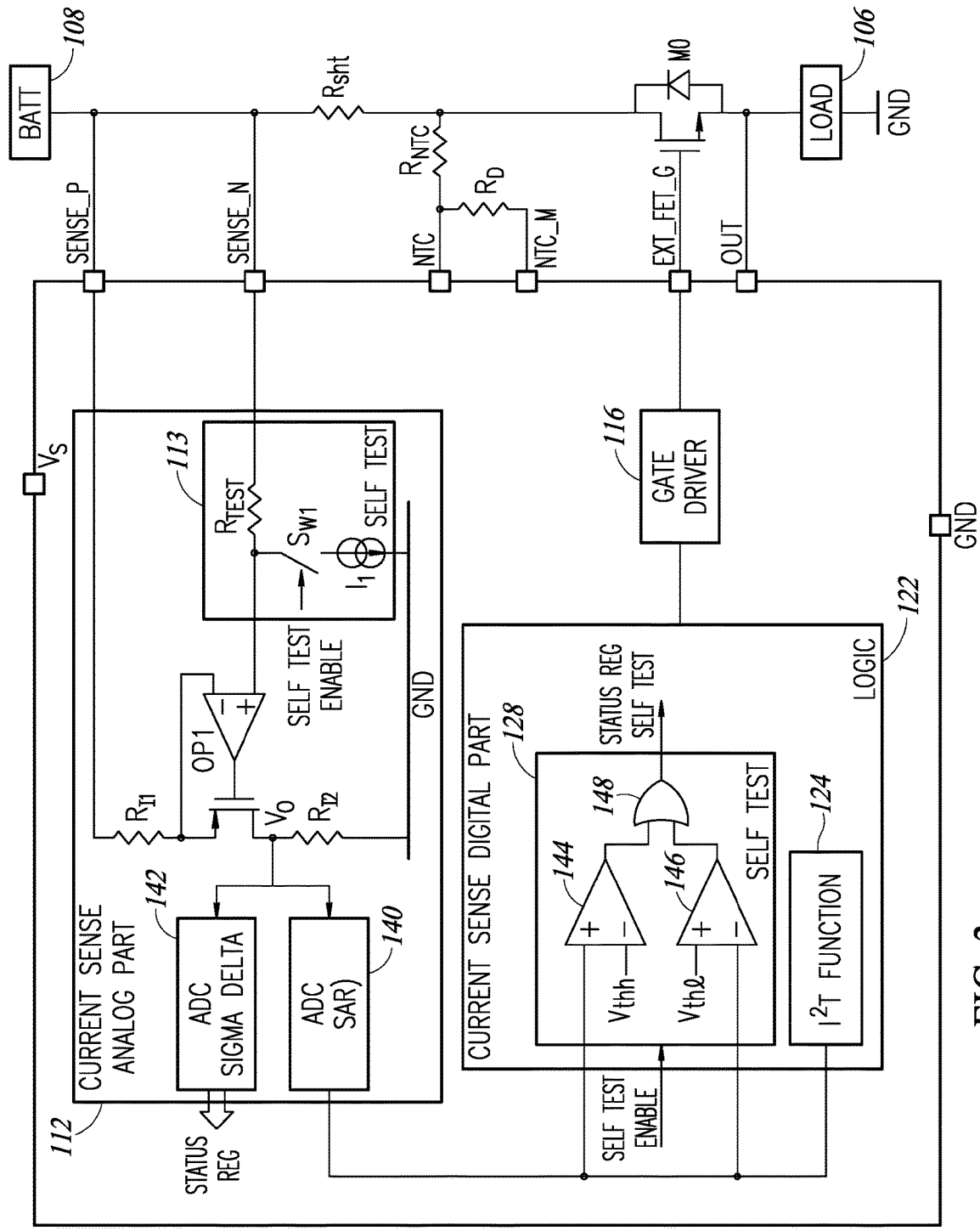
FIG. 3 is a schematic block diagram illustrating further details of the current sensing subsystem of FIG. 2, in accordance with one or more embodiments.

FIG. 3 is a schematic block diagram illustrating further details of the current sensing subsystem 112, in accordance with some embodiments. The current $I_{OUT}$ flowing through the external power MOSFET M0 is monitored by means of the external shunt resistor Rsht. The current sensing subsystem 112 (e.g., the current sensing circuitry 136) senses the floating voltage drop Vshunt across the shunt resistor Rsht and transfers or converts the sensed voltage drop to a voltage $V_O$, which may be referenced to ground. An operational amplifier 244 operably maintains the voltage drop across an internal resistor Ri1 at a voltage that is the same as the voltage drop across the shunt resistor Rsht. Accordingly, the current flowing in the resistor R is Isense=Vshunt/Ri1, while the current flowing in the shunt resistor Rsht (and through the load 106) is Vshunt/Rsht. To minimize the impact of the measurement on the actual Iout current, the resistance of the internal resistor is significantly greater than the resistance of the shunt resistor Rsht (e.g., Ri1>>Rsht). In some embodiments, the internal resistor Ri1 has a resistance that is at least 100 times greater than the resistance of the shunt resistor Rsht. In some embodiments, the internal resistor has a resistance that is at least 1,000 times greater than the resistance of the shunt resistor Rsht. In some embodiments, the internal resistor has a resistance that is at least 10,000 times greater than the resistance of the shunt resistor Rsht.

The voltage drop $V_O$ across a second internal resistor Ri2 is 10*Vshunt, thereby providing a gain factor of 10. The gain factor 10 is provided as just one example, and other gain factors may be utilized in various embodiments. In some embodiments, the second internal resistor Ri2 has a resistance that is ten times the resistance of the internal resistor Ri1; however, embodiments are not limited thereto and other ratios of resistance between the internal resistor Ri1 and the second internal resistor Ri2 may be implemented in accordance with various embodiments.

The voltage drop $V_O$ across the second internal resistor Ri2 (e.g., 10*Vshunt) is continuously sampled according to a given sample frequency by the ADC 138 and the stream of sampled data are passed to the I2t function circuitry 124 to perform the electronic fuse functionality. In particular the voltage drop $V_O$ across the second internal resistor Ri2 may be converted by means of two different ADCs (both of which may be included as part of the current sense ADC 138, in some embodiments). For example, the current sensing subsystem 112 may include a successive-approximation ADC (SAR ADC) 140 and a sigma delta ADC 142. In some embodiments, the SAR ADC 140 has a sample rate of 909 kHz and its output is processed with a moving average of 50 samples and then is sent as input to the I2t function circuitry 124 of the logic 122 (which will be described in further detail later herein). The sigma delta ADC 142, in some embodiments, may be slower but more accurate than the SAR ADC 140. The sigma delta ADC 142 may be used to update a status register readable from a microcontroller (e.g., microcontroller 105) in order to provide an accurate information about the current flowing through the power path.

In some embodiments, the current sense subsystem 112 includes corresponding self-test circuitry 113. The current sense subsystem 112 may be operable to initiate or otherwise be placed in a self-test state, which is a safety state to improve reliability of the system. When the self-test state is enabled by the microcontroller 105, several actions are taken inside the system 100, including: the external power MOSFET M0 is turned off in order to cut-off the current through the power path (e.g., to interrupt current to the load 106); a current source or current generator ($I_1$) is enabled; and a switch ($SW_1$) is closed. These actions create a current which flows from the power supply 108 to the current generator I1, thereby creating a voltage drop across the external shunt resistor Rsht and a test resistor $R_{test}$. The test resistor $R_{test}$ may have a resistance selected to make the voltage drop across the shunt resistor Rsht negligible with respect to the voltage drop across the test resistor $R_{test}$, for example, by selecting values for the test resistor $R_{test}$ and the external shunt resistor Rsht in order to satisfy the relationship $R_{test}$>>Rsht. In some embodiments, the test resistor $R_{test}$ has a resistance that is at least 100 times greater than the resistance of the shunt resistor Rsht. In some embodiments, the test resistor $R_{test}$ has a resistance that is at least 1,000 times greater than the resistance of the shunt resistor Rsht. In some embodiments, the test resistor $R_{test}$ has a resistance that is at least 10,000 times greater than the resistance of the shunt resistor Rsht.

In this condition (e.g., in the self-test mode), the current sensing subsystem 112 senses mainly the voltage drop across the test resistor $R_{test}$, that is $I_1*R_{test}$, which may have a value that is known in advance (e.g., being known by the designed or selected $I_1$ and $R_{test}$ values), and the voltage drop across the test resistor $R_{test}$ then is transferred to a voltage $V_O$ that is referenced to ground and converted by the SAR ADC 140 to a digital voltage (which may be referred to herein as a self-test digital voltage).

The converted digital voltage may be provided to the self-test circuitry 128 within the logic 122. The self-test circuitry 128 includes a first comparator 144, a second comparator 146, and an OR gate 148. The self-test circuitry 128 also receives or generates first and second thresholds Vthh, Vth1 (for example Vthh>Vth1). The first and second thresholds Vthh, Vth1 may have respective voltage levels that may have any selected value in various embodiments, and may be selected based on design considerations. The first comparator 144 receives Vthh on its inverting input and receives the digital voltage from the SAR ADC 140 on its noninverting input. The second comparator 146 receives Vth1 on its noninverting input and receives the digital voltage from the SAR ADC 140 on its inverting input.

The self-test circuitry 128 may determine whether the converted digital voltage is within a range between the first and second thresholds (e.g., within the range [Vth1, Vthh]), for example, by comparing the self-test digital voltage with the first and second thresholds. If the self-test digital voltage is at a voltage level that is between the first and second thresholds, this may indicate that the whole current sense path is not degraded or is within an acceptable tolerance. On the other hand, if the self-test digital voltage is at a voltage level that is greater than the first threshold Vthh or that is less than the second threshold Vth1, then this may indicate that the current sense path is degraded and thus the current sensing function of the current sensing subsystem 112 may not be accurate.

In some embodiments, the first and second thresholds may be voltage thresholds that are provided as reference voltage inputs to respective comparators, as shown in FIG. 3. The self-test circuitry 128 may further include one or more logic gates, such as the OR gate 148 as shown. In some embodiments, the first and second thresholds may be voltage thresholds that are provided as reference voltage inputs to the comparators, as shown, and the comparators provide an output based on the comparisons to the logic gate (e.g., an OR gate). The logic gate receives the output comparison signals and outputs a test signal indicating a result of the self-test (e.g., pass or fail).

In the event that the self-test digital voltage is at a voltage level that is between the first and second thresholds, the self-test circuitry 128 performs a logical function (e.g., OR-ing) based on the output of the two comparators (e.g., outputs indicative of the comparisons of the self-test digital voltage with the first and second thresholds) and will provide a resulting test signal flagging that the test is passed. On the other hand, if the self-test digital voltage is outside the acceptable range [Vth1, Vthh] then the logic circuitry performing the OR-ing of the two comparisons will provide a resulting test signal flagging that the test is failed.

In some embodiments, the test signal is stored in a computer-readable memory or a dedicated status register (e.g., in the registers 126) that can be read by the microcontroller 105 through a communication interface 107. As described, the self-test circuitry 128 may be additional circuitry without modifying the analog and digital chain of current sensing in the current sensing subsystem 112. In some embodiments, any time output from one or both of the ADCs 140, 142 are ready (e.g., when output data is present) they may be written in respective status registers bits (e.g., in the registers 126), and the microcontroller 105 may be advised or notified (e.g., via a signal indicating that new output data is available) such that the microcontroller 105 can read them through the communication interface 107. The microcontroller 105 may write data in a specific register (e.g., 1 bit) to command the electronic fuse 110 to perform the current sense self-test. The result of the self-test may be stored in a dedicated status register (e.g., within the registers 126) that can be read by a microcontroller 105 through the communication interface 107. As such, the microcontroller 105 can both command the electronic fuse 110 to perform the self-test and can read the result of the self-test via the registers 126.

In some embodiments, the first threshold Vthh may be provided as a first reference voltage at an inverting input (−) of the first comparator 144, and the self-test digital voltage is provided at the non-inverting input (+) of the first comparator 144. As such, the first comparator 144 outputs a logical high (or "1") in response to the self-test digital voltage being greater than the voltage level of the first threshold. The second threshold Vth1 may be provided as a second reference voltage at a non-inverting input (+) of the second comparator 146, and the self-test digital voltage is provided at the inverting input (−) of the second comparator 146. As such, the second comparator 146 outputs a logical high (or "1") in response to the self-test digital voltage being less than the voltage level of the second threshold. The OR gate 148 thus outputs a logical high (or "1") indicating that the self-test is failed if either of the outputs of the first and second comparators are high, thereby indicating that the self-test digital voltage is either higher than the first threshold Vthh or lower than the second threshold Vth1.

Figure 4:
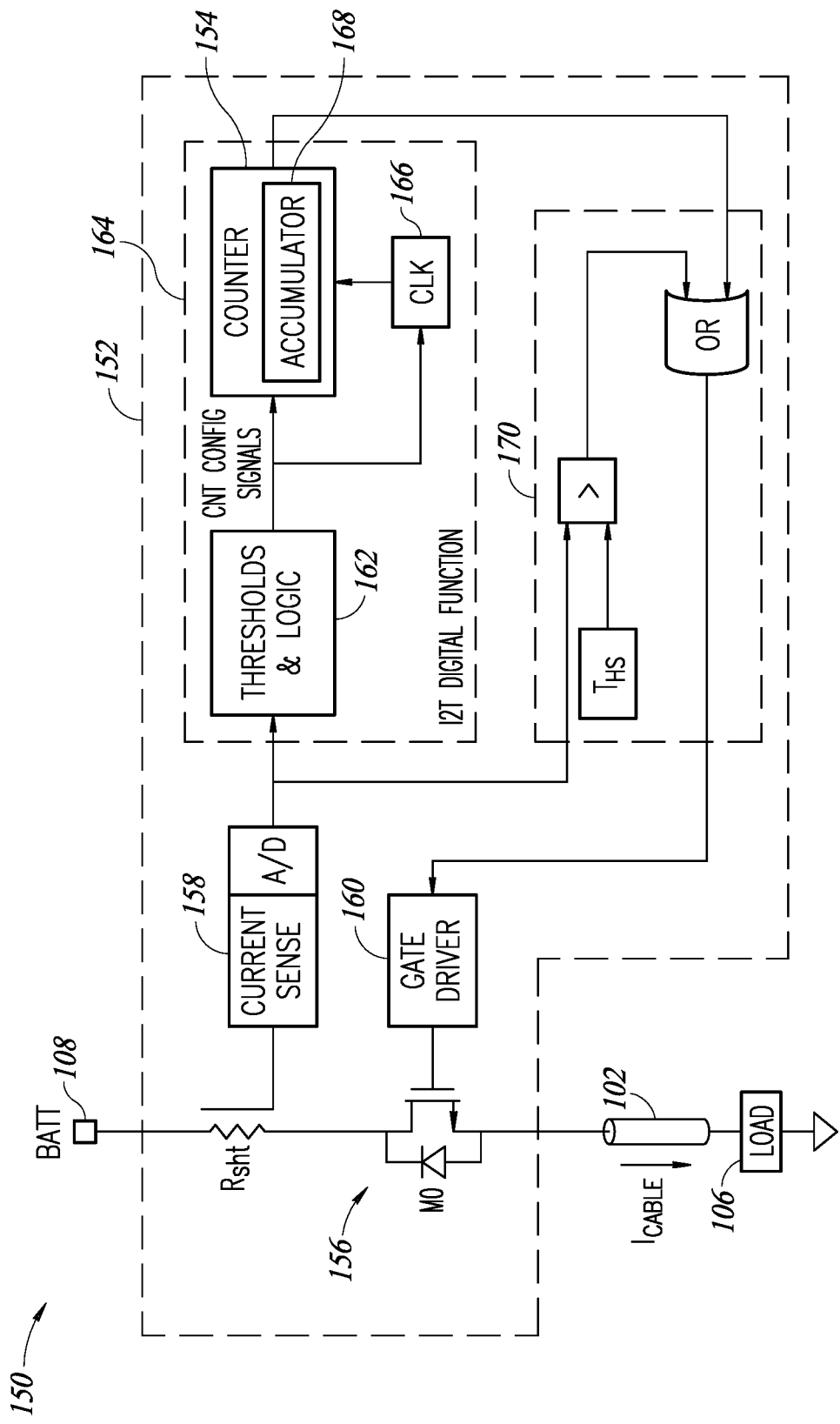
FIG. 4 is a schematic diagram illustrating the I2t functionality of the system shown in FIG. 1, in accordance with one or more embodiments.

FIG. 4 illustrates a high level circuit schematic of an electrical system 150, according to one or more embodiments of the present disclosure. The electrical system 150 includes a whole I2t subsystem 152. FIG. 4 illustrates the connections between the I2t subsystem 152 and other components of electrical system 150 that the I2t subsystem interacts with for performing its function, according to one or more embodiments of the present disclosure. The electrical system 150 may be one example of the system 100 of FIG. 1. The I2t subsystem 152 of the system 150 be at least partially incorporated in or implemented by the I2t function circuitry 124 or the current sense subsystem 112, as shown in FIG. 1.

With reference to FIG. 4, in some embodiments, an Icable overcurrent protection subsystem (or overcurrent protection circuitry) is implemented in order to perform the electronic fuse functionality. The I2t curve of the power cable 102 is emulated through the I2t subsystem 152 by monitoring the current Icable through the cable 102, comparing the current Icable with a plurality of thresholds, and configuring the counting speed and counting direction of a digital counter 154 based on the value of the current intensity Icable that flows through the cable 102. An overflow event of the digital counter 154 or value of the digital counter 154 reaching a predetermined or selected maximum counting value event may indicate that the I2t curve of power cable 102 has been exceeded. The digital counter overflow signal or the event that the value of the digital counter reached the predetermined or selected maximum counting value, may be used to stop or limit the current Icable to protect power cable 102, for example, by controlling an external power MOSFET M0 156 also referred as power switch 156. In some embodiments, the power switch 156 may be the same switching element 104 as shown and described with respect to FIG. 1.

It will be readily appreciated that one or more of the components or features of the I2t subsystem 152 shown in FIG. 4 may be the same or substantially the same as corresponding features of the system 100 previously described herein with respect to FIG. 1. For example, the power supply 108, the cable 102, the load 106, the shunt resistor Rsht, and the power switch 104, 156 may be the same as previously described herein.

Electrical system 150 includes the power supply 108, the I2t subsystem 152, the power cable 102, and the load 106. The I2t subsystem 152 includes the power switch 156, a gate driver 160 (which may be the same as the gate driver 116 shown in FIG. 1), a shunt resistor Rsht, a current sense circuit 158 (which may be the same or substantially the same as the current sensing circuitry or current sensing subsystem 112 previously described herein), and I2t digital function circuitry 164 (which may be the same or substantially the same as the I2t function circuitry 124 shown in FIG. 1). The I2t digital function circuitry 164 in turn includes thresholds & logic circuitry 162, digital counter 154, and a clock or oscillator 166.

During normal operation, power switch 156 is closed, and current Icable may flow from power supply 108, through the shunt resistor Rsht and power cable 102 and into the load 106. The current sense circuit 158 senses current Icable, for example, by measuring a voltage across resistor Rsht. For example, the current sense circuit 158 may be the same or substantially the same as the current sensing circuitry or current sensing subsystem 112 previously described herein.

Threshold & logic circuit 162 includes a plurality of thresholds and periodically or continuously compares the sensed current Icable with each of the plurality of thresholds. According to the value of the current intensity Icable sensed by the current sense circuit 158, the thresholds & logic circuit 162 configures or causes the digital counter 154 to count up, count down, or stop counting. The speed and direction in which the digital counter 154 counts depends on the value of the current intensity Icable sensed by the current sense circuit 158. An overflow of digital counter 154 may be used as a trigger to control the power switch 156 to stop or limit current Icable, for example, by opening the power switch 156 or otherwise controlling the power switch 156 to go into a non-conductive state (e.g., by outputting an overflow signal to the gate driver 160, which controls the power switch 156 to open in response to receiving the overflow signal). In some embodiments, a predetermined or selected maximum counting value may be stored, for example, in non-volatile memory or in a register, such that reaching the predetermined or selected maximum counting value may be used as a trigger to control the power switch 156 to stop or limit current Icable.

The counting speed of the digital counter 154 may be controlled in a variety of ways, in accordance with various embodiments. For example, in some embodiments, a counting step (or counting value) that gets added to accumulator 168 every clock cycle may be changed depending on the value of the current intensity Icable sensed by the current sense circuit 158. A very high current Icable may correspond to a large counting step, a high current Icable may correspond to a small counting step, and a low current Icable may correspond to a negative counting step, in other words, a decrement of accumulator 168.

In some embodiments, the frequency of the oscillator 166, which determines a frequency of adding counting steps (e.g., how fast a counting step gets added to accumulator 168), may be changed depending on the value of the current intensity Icable sensed by the current sense circuit 158. For example, keeping the counting step size (or counting value) constant, a very high current Icable may correspond to a fast clock frequency while signaling digital counter 154 to count up, a high current Icable may correspond to a slow clock frequency while signaling digital counter 154 to count up, and a low current Icable may correspond to a slow clock frequency while signaling digital counter 154 to count down. That is, the oscillator 166 may have a frequency that is variable based on the measured current intensity Icable, such that the counting frequency and therefore the accumulated count value varies based on the current intensity Icable.

In some embodiments, the counting step and the clock frequency may be concurrently varied. In some embodiments, a plurality of counting up and counting down speeds may be implemented by the I2t digital function circuitry 164.

The threshold & logic circuit 162 includes a plurality of thresholds that are compared with the value of the current intensity Icable sensed by the current sense circuit 158. Based on a comparison of the value of the current intensity Icable sensed by the current sense circuit 158 to the plurality of thresholds, a counting step option for the digital counter 154 may be selected or enabled. In various embodiments, the counting step options may include counting up or down, and may further include the speed (e.g., a variable or selected speed) of the counting. The counting speed of the digital counter 154 may have a direct impact on how fast the digital counter 154 overflows or the digital counter value reaches the predetermined or selected maximum counting value. Thresholds may be selected to accurately emulate an I2t curve of power cable 102. For example, the thresholds may be programmed or otherwise selected as may be desired in order to accurately emulate the I2t curve of the power cable 102.

The digital counter 154 may be used as a counter and accumulator, in some embodiments. The digital counter 154 may be capable of counting up and down, and may have a configurable counting step size. A counting step size may be configured, for example, by using two configuration bits, leading to four different counting speeds that may be implemented by the digital counter 154; however, embodiments are not limited thereto. In some embodiments, the counting step size may be represented or controlled by only one configuration bit, or may have more than two configuration bits. Other embodiments may not have a configuration bit and, instead, may have a single counting step size. Not all available counting step size may be used in some embodiments.

In some embodiments, the input frequency of current profile digital counter 154 may also be varied to control the counting speed. Some embodiments may use a hybrid approach, in which the input frequency is varied concurrently with the counting step size.

The digital counter 154 may also include accumulator 168, which increments or decrements each clock cycle depending on the counting step size and the direction of the count.

As shown in FIG. 4, an additional overcurrent protection circuit hard-short latch-off circuit 170 may be included in the overcurrent protection I2t subsystem 152. In detail as shown, the current Icable may be sensed and compared with a specific settable threshold $T_{hs}$ representing an upper limit of the current Icable that the cable 102 can withstand and that is not be exceeded. In case the sensed value of the current Icable exceeds the threshold $T_{hs}$ value, this event immediately triggers the command to the gate driver 160 to turn off the power switch 156, causing the interruption of the current flowing in the cable and irrespective of the status of the digital counter 154. That is, as shown in FIG. 4, an output of the digital counter 154 may be provided as a first input to a logic gate (e.g., an OR gate, as shown) and an output of a comparator of the latch-off circuit 170 may be provided as a second input to the OR gate. As such, the gate driver 160 may be controlled to open the power switch 156 in response to either the sensed current Icable exceeding the threshold $T_{hs}$ or in response to an output of the I2t digital function circuitry 164 (e.g., an output of the digital counter 154). This provides protection against instantaneous current spikes that exceed a threshold current that can be safely withstood by the cable 102, and further provides I2t emulation of the cable 102 thereby facilitating switching-off of the power switch 156 in response to the current Icable exceeding the I2t curve of the cable 102.

Figure 5:
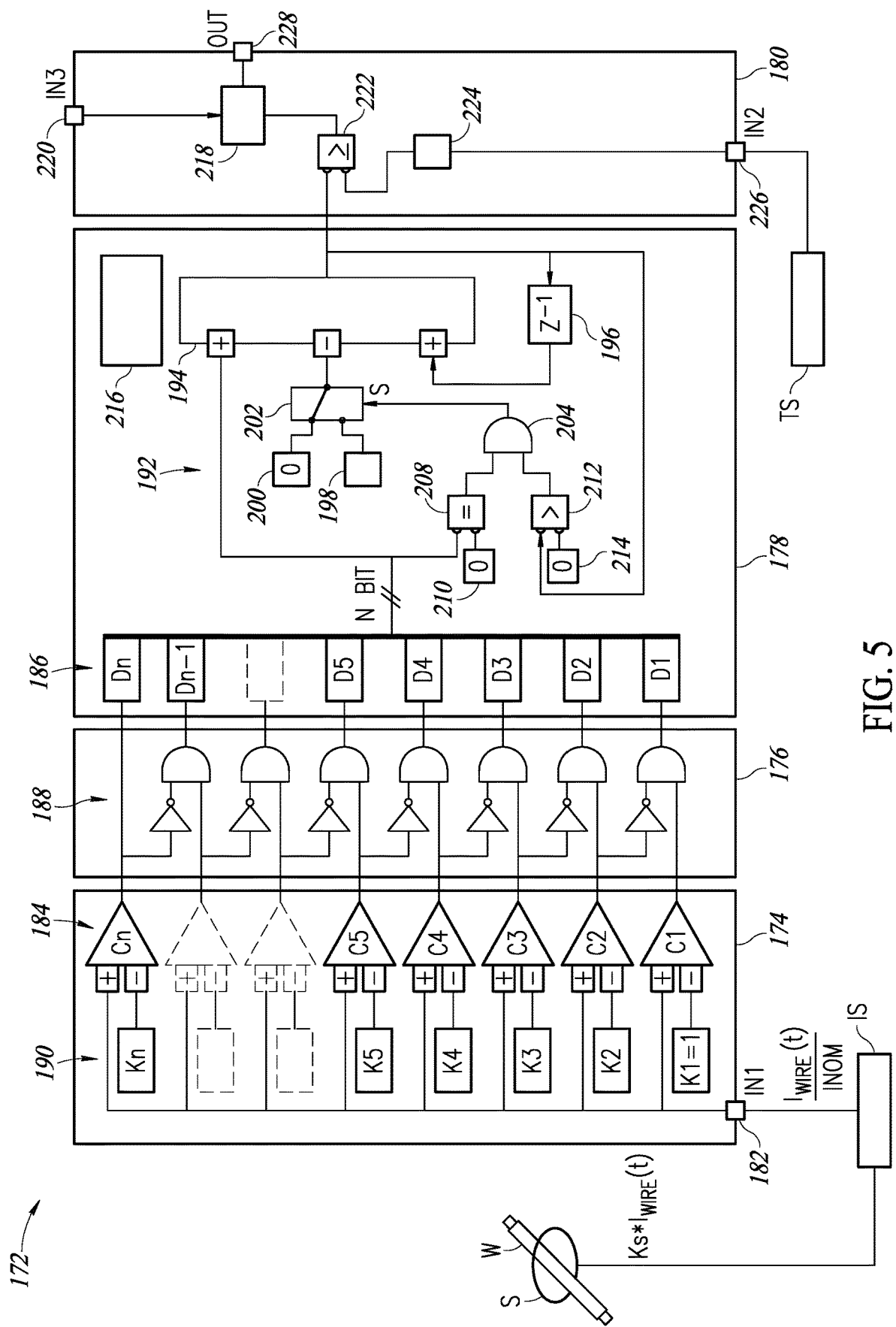
FIG. 5 is a schematic diagram illustrating further details of the I2t digital function circuitry of FIG. 4, in accordance with one or more embodiments.

FIG. 5 is a schematic diagram illustrating further details of the I2t digital function circuitry 164, in accordance with some embodiments. In FIG. 5, reference 172 denotes as a whole a circuit according to one or more embodiments corresponding to the I2t digital function circuitry 164 of FIG. 4. In one or more embodiments as shown in FIG. 5, the circuit 172 includes four circuit sections, namely: a comparator circuit section 174, a logic circuit section 176, a section 178 performing scaled counter up/fixed drop down functions, and a latch section 180.

While exemplified as separate sections for the sake of simplicity and ease of description, one or more of the sections 174 to 180 discussed herein may be either integrated to a higher-level circuit sections or subdivided into circuit sub-sections according to desired implementation options. Also, in one or more embodiments, certain elements exemplified herein as parts of the circuit sections 174 to 180 may be implemented as external elements. Similarly, in one or more embodiments, the circuit 172 may include further elements in addition to those exemplified herein.

In some embodiments, the comparator circuit section 174 may include an input 182 configured to receive an input signal IN1 indicative of the current flowing through a wire W (for instance, the cable 102 which in some embodiments may be an automotive wiring harness). The wire W may have associated a load L (which may be the same as the load 106 previously described herein) and is to be protected against overload and/or short circuit events.

In the diagram of FIG. 5, reference S denotes an amperometric sensor (of any type) configured to generate a sensing signal $Ks*I_{WIRE}(t)$ indicative of the intensity $I_{WIRE}(t)$ of the current flowing through the wire W.

As shown in FIG. 5, the sensor S can be coupled to a setting circuit block IS active between the sensor S and the input 182 so that a normalized value for the current through the wire W, namely $I_{WIRE}(t)/INOM$ may be applied to the input 182.

In one or more embodiments, the value for INOM can thus be set (selectively, for instance) at a nominal value for the current $I_{WIRE}(t)$.

In that way, the circuit 172 may be configured to operate as a sort of "universal" fuse adapted to latch (that is interrupt or at least reduce) the current through the wire W as a result of current being found to reach a safety threshold defined as a function of a (first) setting parameter represented by INOM.

It will be appreciated that both the sensor S and the circuit block IS for setting the nominal value INOM for the current may be distinct elements from some embodiments.

In one or more embodiments, the comparator circuit section 174 may include a bank of comparators C1, . . . , Cn (collectively indicated as 184) configured to compare the (normalized) current value $I_{WIRE}(t)/INOM$ with respective comparison levels or thresholds K1, . . . , Kn which may be calculated as discussed in the following and stored in respective registers in a bank of registers indicated collectively as 190.

For instance, the thresholds K1, . . . , Kn can be set in such a way to produce a correspondence between the number of thresholds and the number of bits associated with a bank of D registers 186 as discussed in the following.

In one or more embodiments, the value for K1 can be set by convention to unity (K1=Kref*KT=1, where KT is a constant defined such that Kref=1/KT corresponds to the maximum DC current INOM permissible to flow through the wire) by referring to a normalized current $I_{WIRE}(t)$/INOM.

Also, normalization may be effected with reference to KT*$I_{WIRE}(t)$/INOM with KT≠1 and the K values correspondingly set as (1*KT, K2*KT, Kn*KT). This implementation can be advantageous when the reference are analog values (voltage), so that a highest (maximum) value can be set for Kn*KT which is compatible with the highest analog value that can be fixed in the associated IC: for instance Kn*KT<5 if the maximum allowed reference value is 5.

The logic circuit section 176 may include a combinatorial network including a plurality of stages collectively indicated as 188 which sense the respective outputs of the comparators C1, C2, . . . , Cn and identify the position of (normalized) current value $I_{WIRE}(t)$/INOM within the (one-dimensional) matrix [K1, K2, . . . , Kn] of the reference thresholds 190 so that one of the outputs of the logic circuit section 176 is set to a given value, such as logic_out (I)=1 corresponding to KI−1<$I_{WIRE}(t)$/INOM<KI, with I designating the I-th reference threshold in the matrix [K1, K2, . . . , Kn] while the other logic outputs are set to another value, for instance zero.

Figure 15:
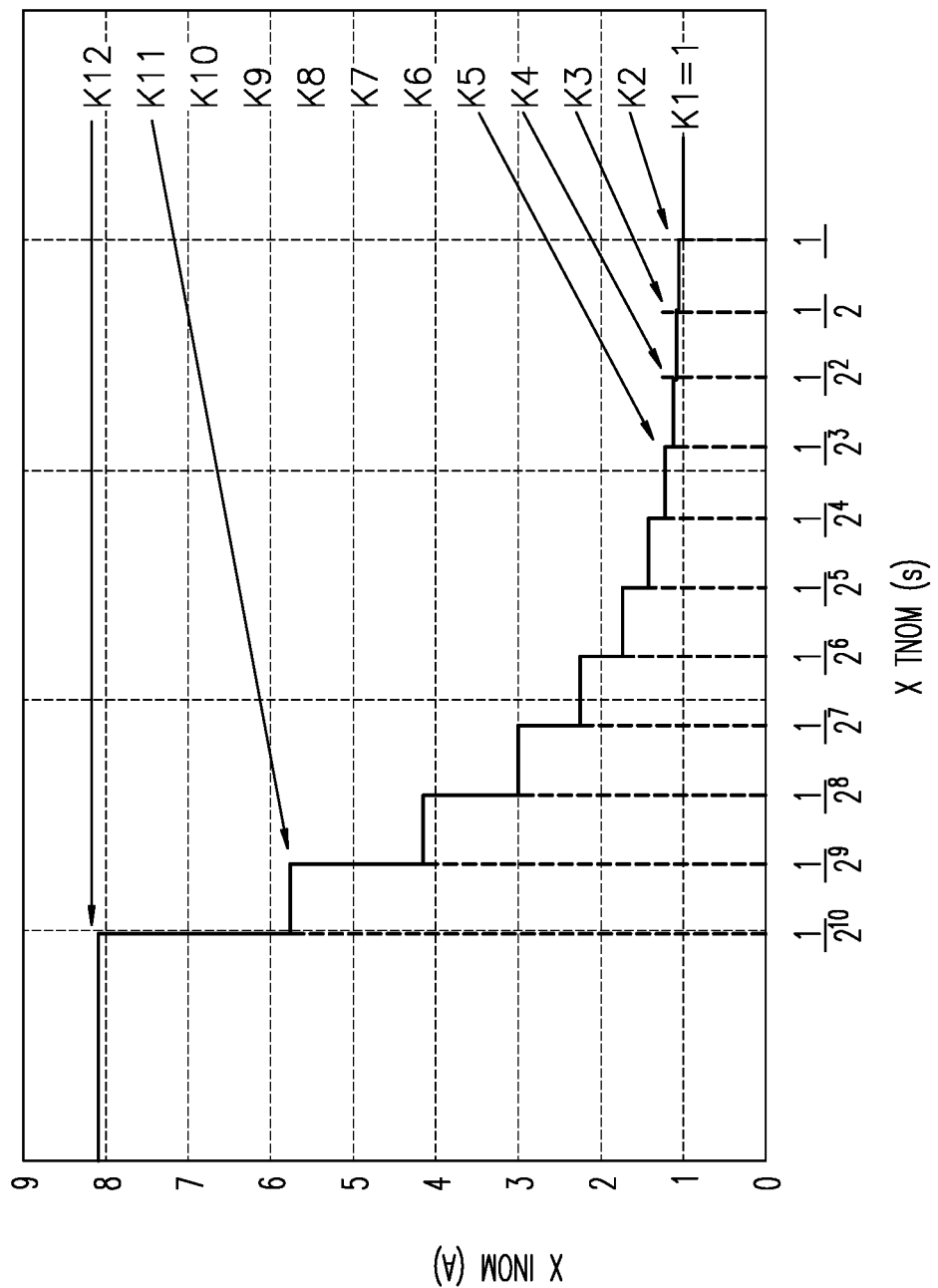
FIGS. 15-17 are diagrams exemplary of criteria underlying one or more embodiments.
Figure 16:
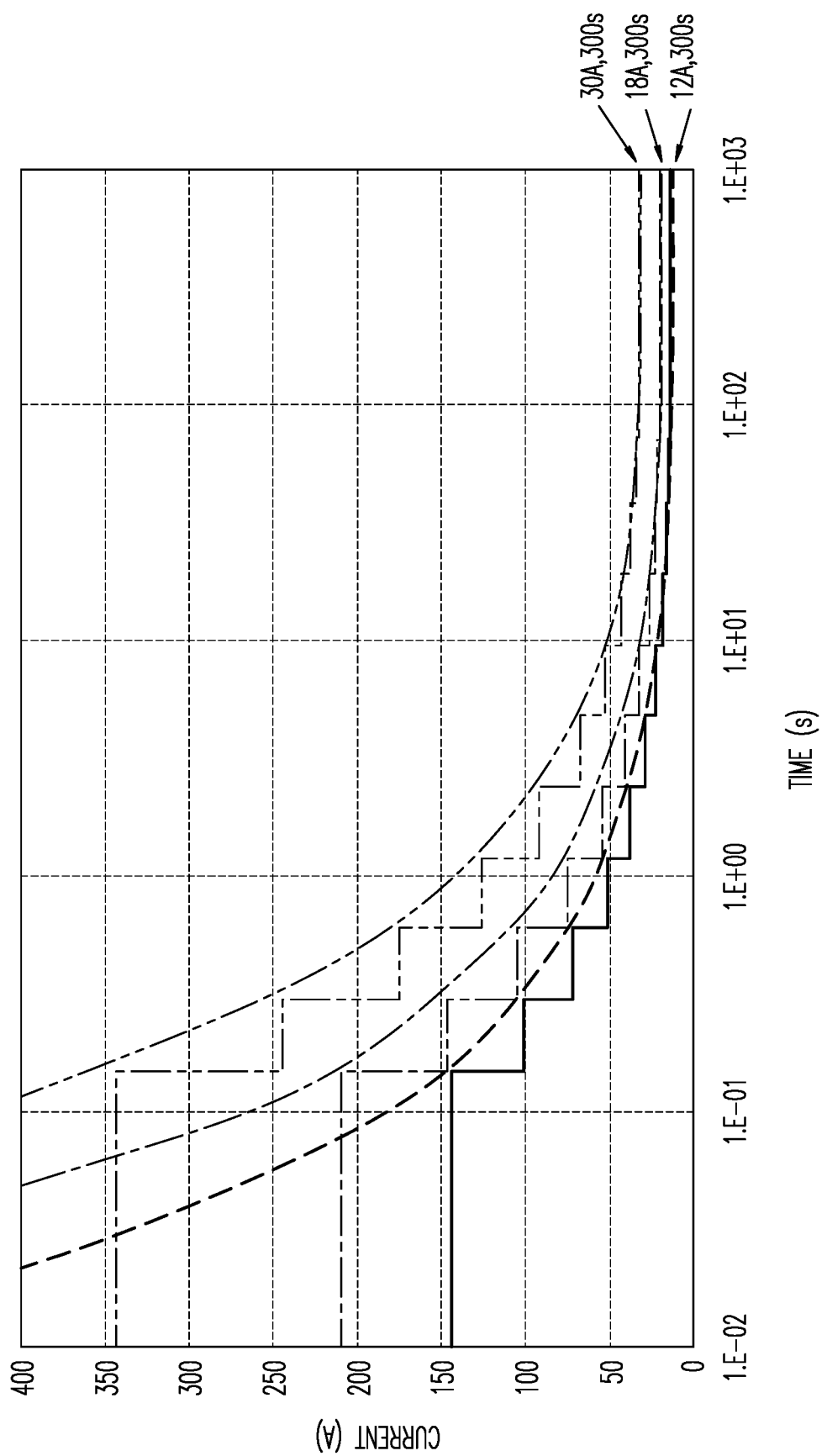
Figure 17:
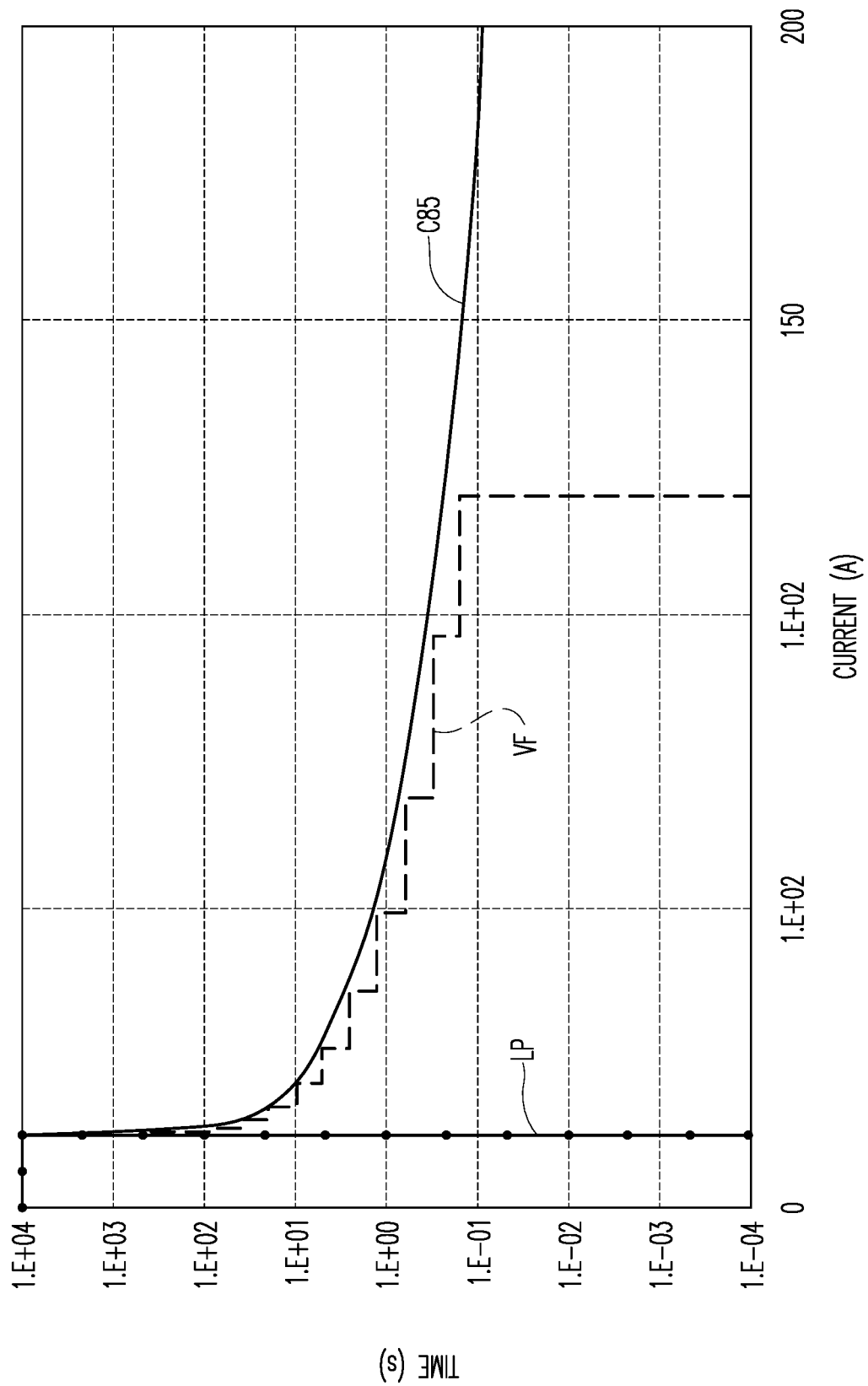

Setting of the thresholds may occur on the basis of the criteria discussed, for example, with reference to FIGS. 15-17.

The circuit block 178 operates with a fixed clock frequency provided by a clock circuit block 1782 (here exemplified as included in the circuit section 178) and includes an input bank of flip-flops D (collectively indicated as 186) which are driven by respective outputs of the logic circuit block 188.

The output of the flip-flop bank 186 may thus include an n-bit binary word used to drive a (fixed drop) counter 192.

In some embodiments, the counter 192 performs a cumulative adder function via an adder circuit 194 and the memory delay (z−1) designated 196. This is a configuration for such digital circuitry where the block 178 (z−1) is a memory for the current cumulative result.

In some embodiments, the counter 192 is driven to count "up" by the word at the output of the flip-flop register 186 (at a "+" input at the top of the block 194 in FIG. 5). The counter 192 is driven to either decrease its count by a fixed drop (as provided by a drop circuit block 198) or to maintain the current count value (0 drop as exemplified by a block 200) as a function of the position of a switch 202 which couples to a negative count input "−" of the adder circuit 194 either the output of the fixed drop circuit 198 or the output of the zero drop circuit block 200.

Operation of the switch 202 is controlled by an AND logic gate 204 which in turn receives the outputs of a first equality block 208 and a "greater than" circuit block 212.

The first equality block 208 is sensitive to the output from the flip-flop register 186 and a first zero reference block 210.

The "greater than" circuit block 212 is in turn sensitive to the input from another zero reference block 214 and the output from the adder circuit 194.

As discussed previously, the delay block 196 (z−1) is a memory block that stores the output of the adder 194 and feeds this value back to the input of the adder, thus implementing a cumulative adder with digital circuitry (essentially as a digital integrator).

In some embodiments, the circuit block 178 as shown in FIG. 5 may be operated such that when $I_{WIRE}(t)$/INOM is higher than 1, that is, as a result of $I_{WIRE}(t)$ having reached a threshold value INOM set via the parameter INOM, the flip-flop corresponding to the I-th D register in the bank 186 is clocked to one so that the value of the register 186 is $2^I$ and the count of the counter 192 is varied in a first direction, e.g., "up", by increasing the count by $2^I$, so that the increase in the count is indicative of "how much" $I_{WIRE}(t)$ is higher than INOM. If D=0, that is, as a result of $I_{WIRE}(t)$ failing to reach the threshold value represented by INOM, then if the count of the counter 192 is different from (e.g. higher than) zero, the count of the counter 192 is varied in a second direction, e.g. "down", with the counter 192 decreasing at each clock pulse from the clock 216 of a constant value (fixed drop), that is by the fixed value set by the circuit block 198 until the count value of the counter 192 reaches zero. If the count of the counter 192 is (already) at zero the output from the counter 192 can be assumed to be NOP (No Operation).

Those of skill in the art will appreciate that "up" and "down" as exemplified herein for the opposite counting directions for the counter 192 do not represent per se a mandatory choice insofar as one or more embodiments may adopt, mutatis mutandis, a complementary choice.

The latch circuit section 180 as shown in FIG. 5 includes a latch circuit 218 which can be reset via an input 220 (IN3) and which is sensitive via a comparison circuit block 222 (a "higher of equal" comparison circuit, for instance) to the output from the counter 192 in the circuit block 178 and to a limit value (for instance an upper or maximum counter value Counter_MAX) as provided by a circuit block 224. The circuit block is in turn coupled to an input 226 (labelled IN2) configured to receive a (time) setting value TNOM from a setting block TS.

The value for TNOM can thus be set (selectively, for instance) at a nominal value corresponding to a desired time for the latch circuit section 180 to latch when a certain constant current (K2·$I_{NOM}$, by way of non-limiting example) is sensed to flow through the wire W. The circuit 172 may thus be configured to operate as a sort of adjustable slow-blow/fast-blow fuse whose time of intervention can be selectively adjusted.

It will be again appreciated that, as is the case for the circuit block IS for setting the nominal value INOM for the current, the setting block TS for TNOM, may be a distinct block from some of the embodiments. In some embodiments, the setting block IS will fix the value of Counter_MAX=TNOM*Clock frequency. This can be implemented with any of a variety of suitable circuitry (e.g., look-up table or SPI register or A/D, and so on . . . ) in various embodiments.

A latch circuit section 180 as exemplified herein will latch its output signal Out (at a node indicated as 228 in FIG. 5) to a certain logic value ("1" for instance) as result of the value of the counter 192 reaching a limit value (the upper value Counter_MAX set via the block 224, for instance) determined as a function of the setting signal TNOM received at the input 226.

In one or more embodiments, the value for the limit value Counter_MAX (an upper or maximum value will be considered herein for simplicity) can be set based on the relationship Counter_MAX=TNOM*clock frequency, where clock frequency designates the frequency of the clock 216 which, while represented as included in the circuit block 178, may be configured to clock operation of the whole circuit 172.

As indicated, the counter 192 may be scaled to $2^I$ so that a time matrix can be found to correspond to the matrix for the "K" values in the comparator circuit section 174 so that $T_{NOM}*[\infty, 2^0, 2^1, 2^2 \ldots, 2^{n-2})]$, $I_{NOM}(K1, K2, K3, \ldots, Kn)$, where $T_{NOM}*2^{(I-2)}$ may be held to correspond to the time to latch when a constant current $I_{NOM}*KI$ is sensed to flow through the wire W.

The notation above takes into account the shift in the K indexes, with K1 becoming K2 and so on. Also the nominal time is held to correspond to the first step. After the shift, the first step is K2 and the value 1=K1 is associated to T=∞.

The elements in such a matrix can be regarded as defining a reaction time vs. current curve which can be approximated by N steps as discussed in the following in connection with FIG. 15.

In some embodiments, when the electronic fuse 110 detects a current flowing in the wire or cable 102 that is above the first current threshold INOM (e.g., when $I_{WIRE}$(t)/INOM>1) such that the counter 192 starts to count then the electronic fuse 110 may write a specific data (e.g., a single bit) in a register (e.g., within the registers 126) to flag this event to the microcontroller 105. If the counter reaches the limit value Counter_MAX causing the control of the power switch 156 in order to latch (that is interrupt or at least reduce) the current Icable flowing in the cable, then the electronic fuse 110 may write an additional specific data (e.g., a single bit) in a register to flag this event to the microcontroller 105. When the electronic fuse 110 detects a current flowing in the cable 102 that is above hard-short latch-off threshold Ths representing an upper limit of the current Icable that the cable 102 can withstand and that should never be exceeded, then the electronic fuse 110 may write a further specific data (e.g., a single bit) in a register to flag this specific condition. All these data can be read by the microcontroller 105 through the communication interface 107 (e.g. SPI interface). In some embodiments, the microcontroller 105 can configure the circuit 172 by providing INOM, TNOM and Ths parameters by writing respective values in respective registers through the communication interface (e.g. SPI interface) such that the electronic fuse 110 can read and configure the circuit 172 accordingly.

Figure 13A:
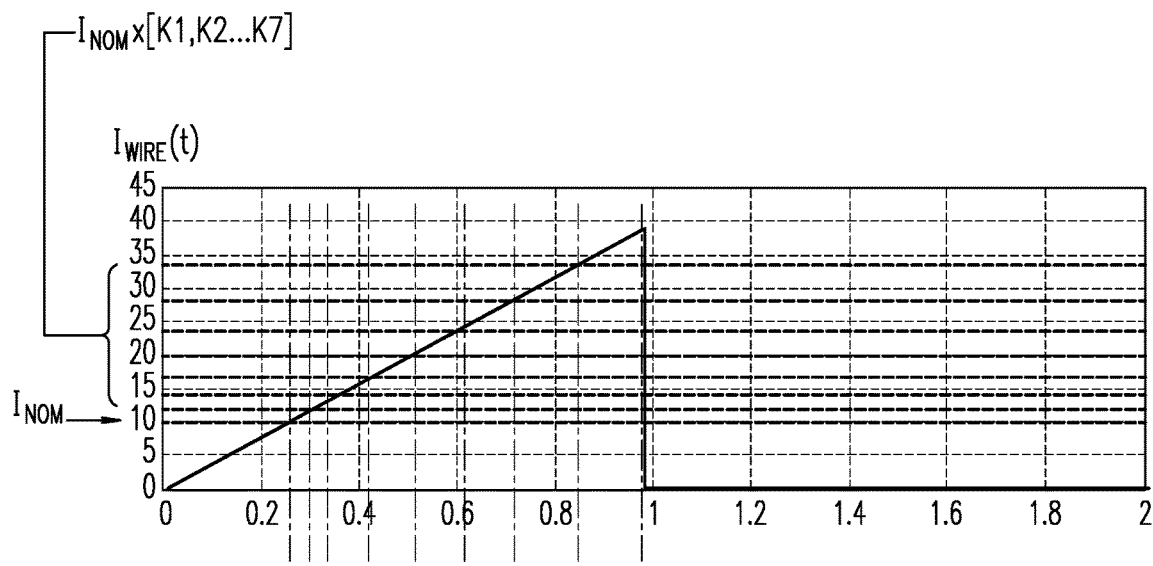
FIGS. 13A and 13B are graphs representing possible behaviors of embodiments of the present description in the presence of a current varying continuously over time, in accordance with one or more embodiments.
Figure 13B:
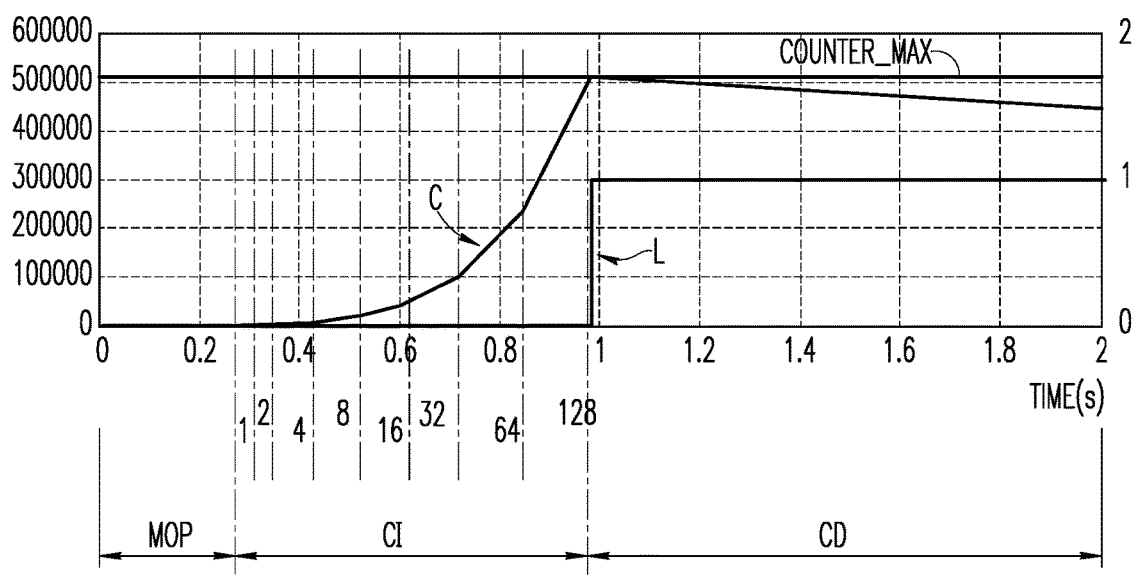

The diagrams of FIGS. 13A and 13B are exemplary of the possible behavior of a circuit as exemplified in FIG. 16 by assuming that the current flowing through the wire W increases ramp-like (triangular wave) as exemplified in the left-hand portion of FIG. 13A by increasing from zero to the nominal value $I_{NOM}$ and on through the various thresholds INOM*[K1, K2, ... ] up to a limit value (peak level) at which the latch section 180 is activated in order to interrupt (or at least reduce) the current $I_{WIRE}$(t). This may occur via the intervention of a power switch as discussed in the following in connection with the FIG. 20.

The diagram of FIG. 13B is exemplary of the corresponding time behavior of the count value C of the counter 192, with the count value C increasing as the current $I_{WIRE}$(t) increases until the (upper) limit value Counter_MAX=TNOM*clock frequency is reached at which the latch circuit section 180 intervenes as indicated by L in FIG. 13B.

Operation of a circuit as exemplified in FIG. 16 in the case of a current $I_{WIRE}$(t) varying with continuity over time (sawtooth-like, for instance) involves operation cycles including: a NOP phase (for $I_{WIRE}$(t) lower than $I_{NOM}$), a counter scaled increase phase CI (until intervention of the latch as indicated at L), and a counter decrease (fixed drop) phase indicated as CD.

Figure 14A:
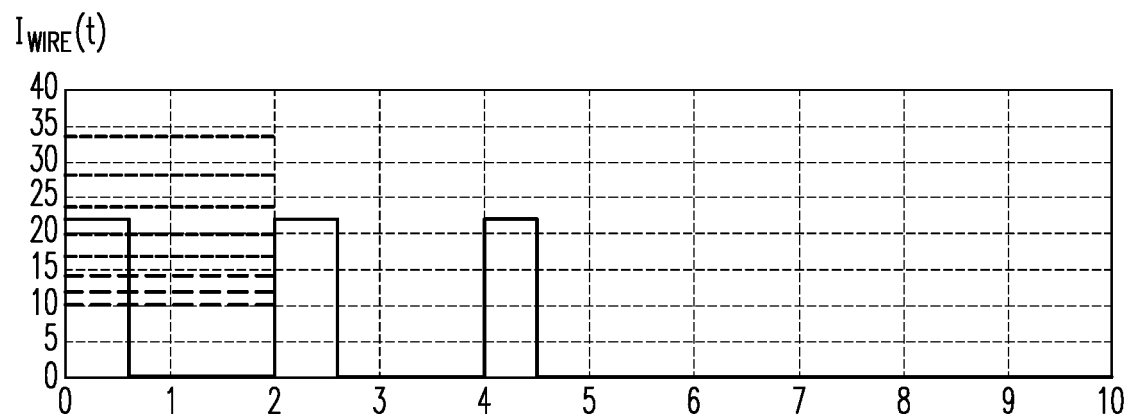
FIGS. 14A and 14B are graphs representing possible behaviors of embodiments of the present description in the presence of a pulsed current, in accordance with one or more embodiments.
Figure 14B:
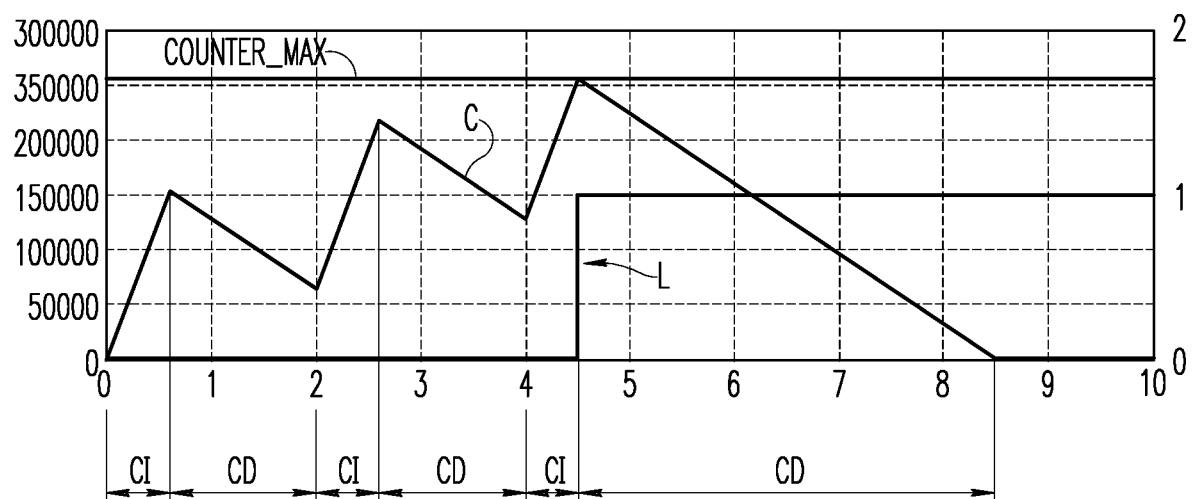

The diagrams of FIGS. 14A and 14B portray an exemplary corresponding behavior of a circuit as 172 in the case of a pulsed current $I_{WIRE}$(t) with a such pulsed current switching between a "zero" value (thus lower than $I_{NOM}$) and an upper value lying somewhere in the matrix established by the values K1, K2, .... FIG. 14B highlights that the counting phases of the counter 192 in opposite directions (e.g. "up" CI and "down" CD) may alternate and the latch circuit section 180 intervene at L as result of the count value of the counter 192 reaching the limit value Counter_MAX.

The diagram of FIG. 15 is exemplary of the possibility of intervening on the "time axis"/"current axis" matrix namely $T_{NOM}*[\infty, 2^0, 2^1, 2^2 \ldots, 2^{n-2}]$, $I_{NOM}(K1, K2, K3, \ldots, Kn)$ in order to generate a notionally infinite number of current/time (IT) curves by setting the two parameters INOM (circuit block IS and input 182 in FIG. 5) and TNOM (input circuit block TS an input 190 in FIG. 5).

By acting on the value of the thresholds KI (which may be assumed to be identical for simplicity, but may even be selected to be different to pursue an even finer matching) such IT curves can be caused to fit with the characteristics of a certain wire W to be protected (e.g. a wiring harness). Such characteristics are currently found to exhibit a sort of hyperbole-like behavior (as exemplified in FIG. 16), which lends itself to be fitted by a $\frac{1}{2}^I$ (I=0, 1, 2, ...) behavior of the relationship which may link INOM and TNOM in a circuit such as the circuit 172 of FIG. 5.

The current and time values in the curve may define a current amplitude and a pulse duration which may lead the temperature of the wire to reach a specified limit (maximum) temperature. In that respect it will be appreciated that while a "wire" is referred to for the sake of simplicity throughout this description, the wire W can be regarded as exemplary of any electrical component configured to be traversed by a certain current ($I_{WIRE}$(t) being exemplary of such a current) and desired to be protected.

For instance, as exemplified in FIG. 16, the IT response of a circuit as the circuit 172 can be fitted to a desired behavior by setting a value for INOM with reference to a highest (maximum) DC current rate. By way of example the diagram of FIG. 16 refers to three possibilities: 12A (dashed line), 18A (chain line), and 30A (double dotted chain line). These values may correspond, for instance, to wire section areas corresponding to 0.5 mm², 1.0 mm² and 2.5 mm². Of course, the values indicated are merely exemplary and non-limiting for the embodiments. For instance these IT curves may be rated at a maximum wire temperature of 150° C. (and an ambient temperature of 85° C. maximum) so that the value for INOM may be caused to correspond to a highest (acceptable) current root mean square (rms) value $I_{RMS}$ with all the IT values of the circuit 172 adapted to be automatically fitted to the wire IT curve and the time of intervention of the latch circuit section 180 correspondingly adjusted (by setting TNOM) to be gradually reduced as the value of the current decreases (from right to left in the diagram of FIG. 16) to increasingly higher values with respect to the "asymptotic" value possibly related to long times such as 300 s. Of course, the indicated figure of 300 s as the time corresponding to the first step is merely by way of example. That value can change in a manner coordinated with the constant value used for the fixed drop (count down) operation of the counter 192. For instance, 300 s may be a value fitting with a certain cable when the fixed drop is set, for instance to 16. If the value of fixed drop is changed, fitting will still be possible by fixing a different time value.

FIG. 17 is exemplary of the same concept portrayed in the form of a graph where the time (ordinate scale) is portrayed as a function of current (abscissa scale). The continuous line C85 portrays the behavior of a wire W at an ambient temperature of 85° C. and the dashed line is exemplary of the behavior of the circuit 172 acting as a "smart" fuse and the chain line is exemplary of the application of a load pulse LP.

Figure 18A:
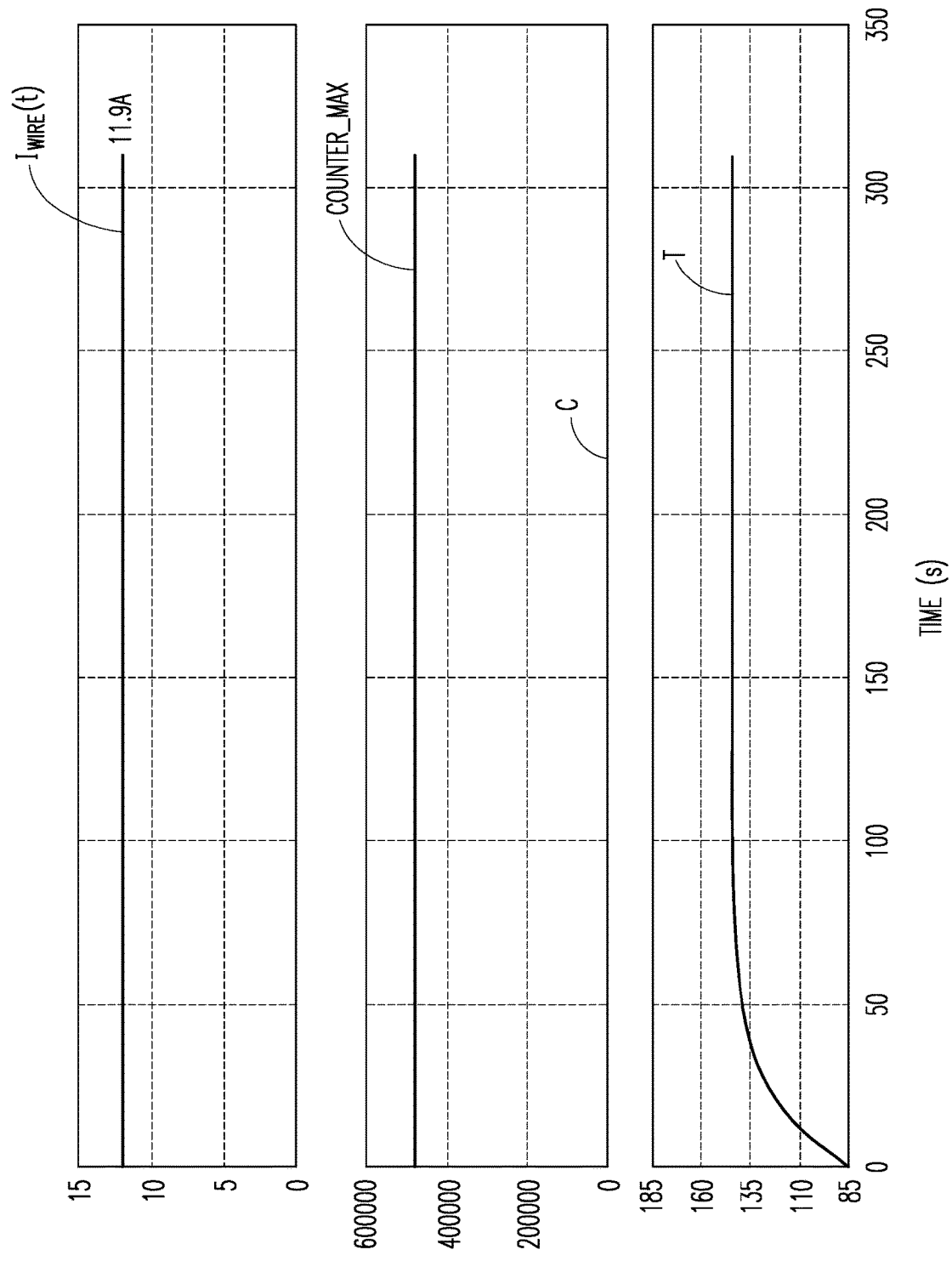
FIGS. 18A and 18B each include three superposed diagrams with a common time scale exemplifying the possible behavior of a circuit according to one or more embodiments.
Figure 18B:
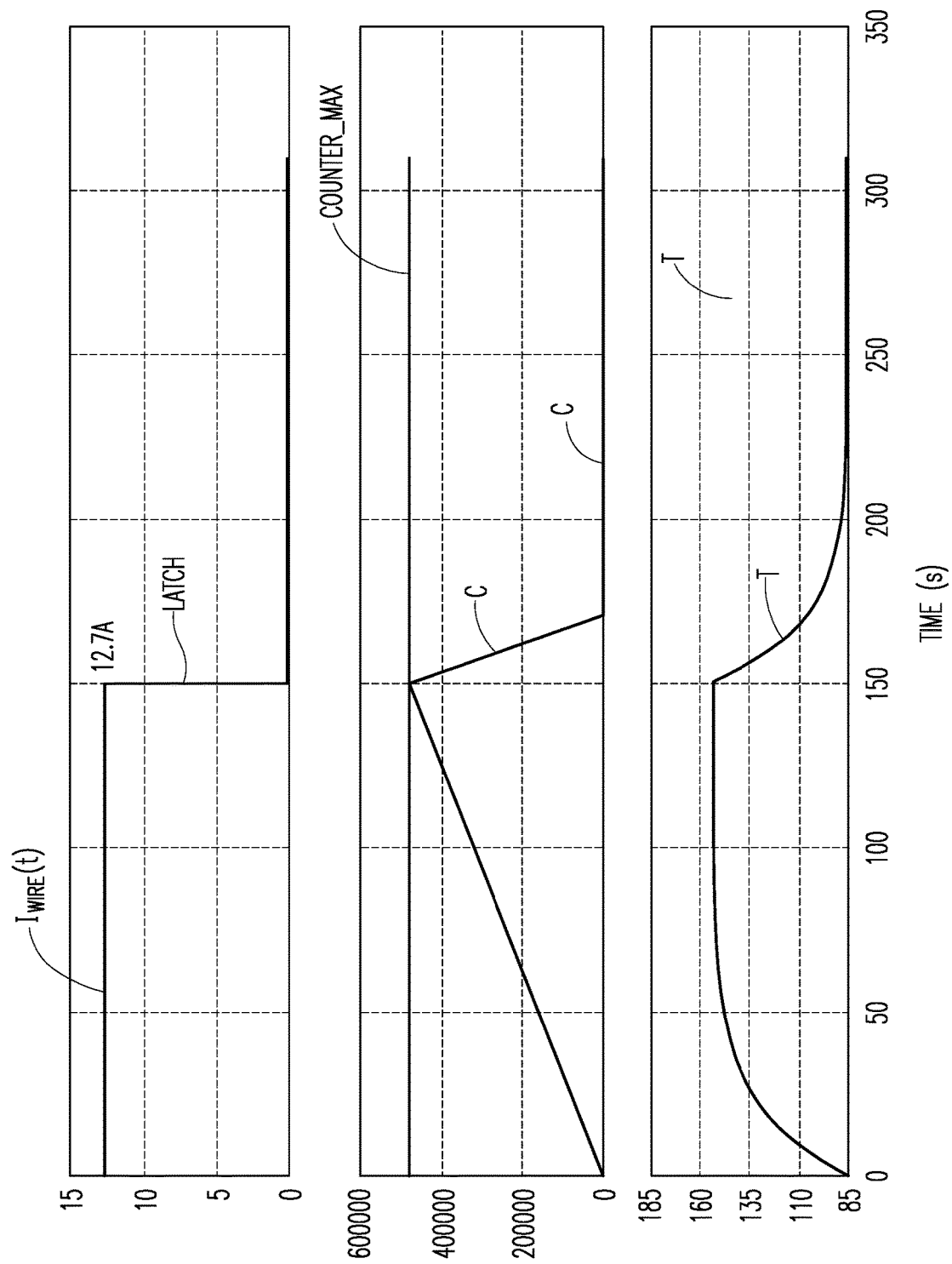

The diagram of FIG. 17 refers, by way of example, to an "asymptotic" time of 300 s for INOM=12 A (wire size 0.5 mm² with maximum DC current 12 A) by assuming an initial current equal to zero. Stated otherwise, 300 s may correspond to the first step: INOM*K2 while when $I_{WIRE}$<12 A→T=infinite; the asymptotic timing will thus change with the value of fixed drop changed. The diagrams of FIGS. 18A and 18B are further exemplary of the behavior of a circuit 172 as exemplified in FIG. 5. In a case where the current $I_{WIRE}(t)$ does not cause the count value of the counter 192 to reach an upper limit value Counter_MAX (FIG. 18A). In a case were the current $I_{WIRE}(t)$ does conversely cause the count value of the counter 192 to reach such a limit value thus causing the latch circuit section 180 to intervene to interrupt the current (FIG. 18B). In both FIGS. 18A and 18B the upper diagram is exemplary of a possible time behavior of the current $I_{WIRE}(t)$ which in FIG. 18A is held to remain at a "safe" value of, e.g. 11.9 A which is less than a limit of 12.0 A and in FIG. 18B is assumed to reach a value of 12.7 A in excess of the limit of 12 A. Correspondingly, the count value C of the counter 192 remains practically at 0 (and thus does not reach the limit value Counter_MAX in FIG. 18A) while in FIG. 18B the count value increases and reaches the limit value Counter_MAX to eventually decrease after the intervention of the latch. In FIG. 18A, the wire temperature (° C.) T is shown to remain at a value somewhere between 135° C. and 160° C. held to be acceptable, while in FIG. 18B the wire temperature is shown to rise to a higher level nearer to 160° C. and to drop subsequently as a result of the current being interrupted by the intervention of the latch circuit section. Once again the numerical values reported in the foregoing are merely exemplary and non-limiting.

Designing a circuit 172 as exemplified in FIG. 5 may involve calculating the values for the thresholds K2 to Kn in the comparator circuit section 174 with the criterion of causing the rms value for the current $I_{WIRE}(t)$ to remain below a specified current value $I_{NOM}$ as set via the parameter INOM. In the case of a pulsed current (see, for instance, FIGS. 14A and 14B) the counting action of the counter 192 may be subjected to cumulative increase (see especially FIG. 3B) as a result of the counter 192 possibly starting to count from a non-zero value when the pulses have their rising edges. Such a cumulative effect may eventually cause the counter value to reach the value Counter_MAX to produce undesired intervention of the latch. In one or more embodiments, a maximum value for the duty cycle of a pulsed current can be identified which represents a limit condition before a counter accumulation as exemplified in FIG. 14B sets in. In that way the possibility exists of facilitating scaled up, fixed drop-down operation of the counter 192 in such a way that the counter 192 starts counting (e.g. up) from zero at each rising edge of the pulsed current and returns to zero (e.g. due to fixed drop-down) just before a subsequent pulse.

Figure 19:
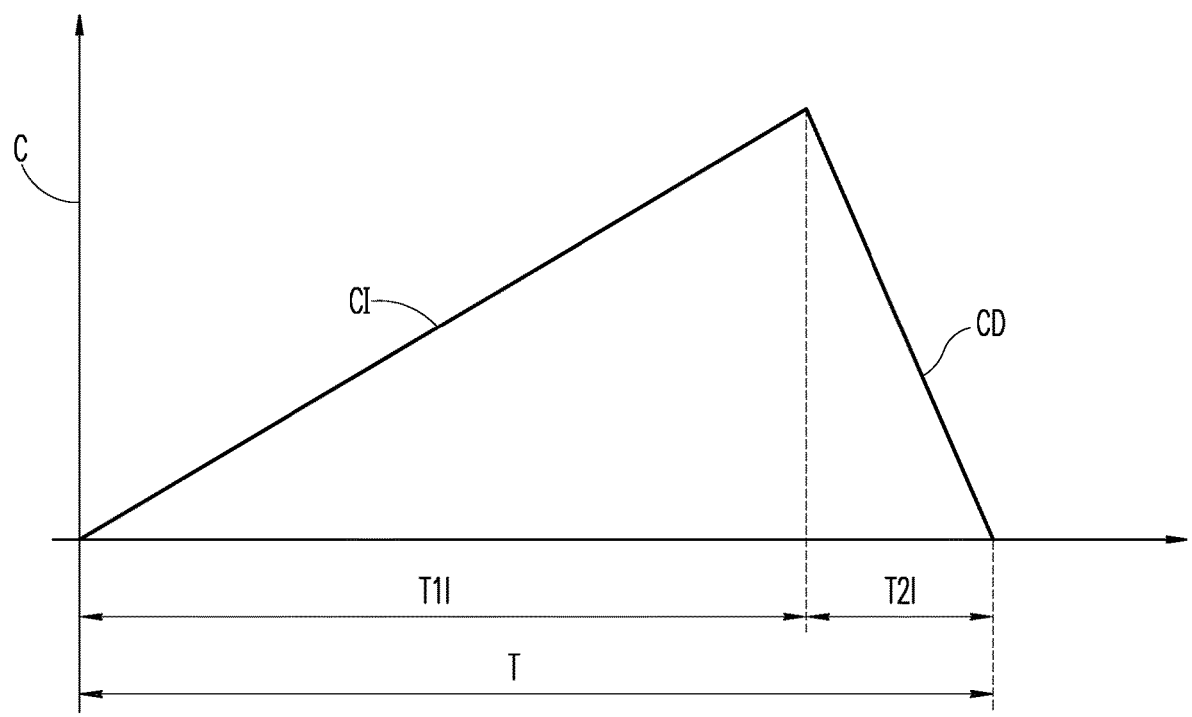
FIG. 19 is a graph associated with one or more counters, in accordance with one or more embodiments.

The diagram of FIG. 19 refers to the exemplary case of current pulses including square wave pulses with a period T given by the sum of an "on" time T1I and an "off" time T2I. The diagram of the FIG. 19 is exemplary of the possibility of defining a relationship linking the step counter value I*T1I (with Step Counter I=$2^{(I-2)}$), the parameter INOM and the amplitude INOM*KI of the pulsed current such that the product Step counter I*T1*clock frequency over the on-time T1I (increase phase CI) is compensated by the product Fixed drop*T2I*clock frequency over the off-time T2I (drop phase CD) with Fixed drop set by the block 188 in FIG. 5. Application of that criteria leads to setting KI (by assuming a uniform distribution within the matrix of the thresholds in the comparator circuit section 174) such that:

KI=1 MAX ⊠ ⊠ duty ⊠ ⊠ cycle=2 (I−2)+Fixed ⊠
 ⊠ Drop Fixed ⊠ ⊠ Drop with the values for KI independent from TNOM.

Figure 20:
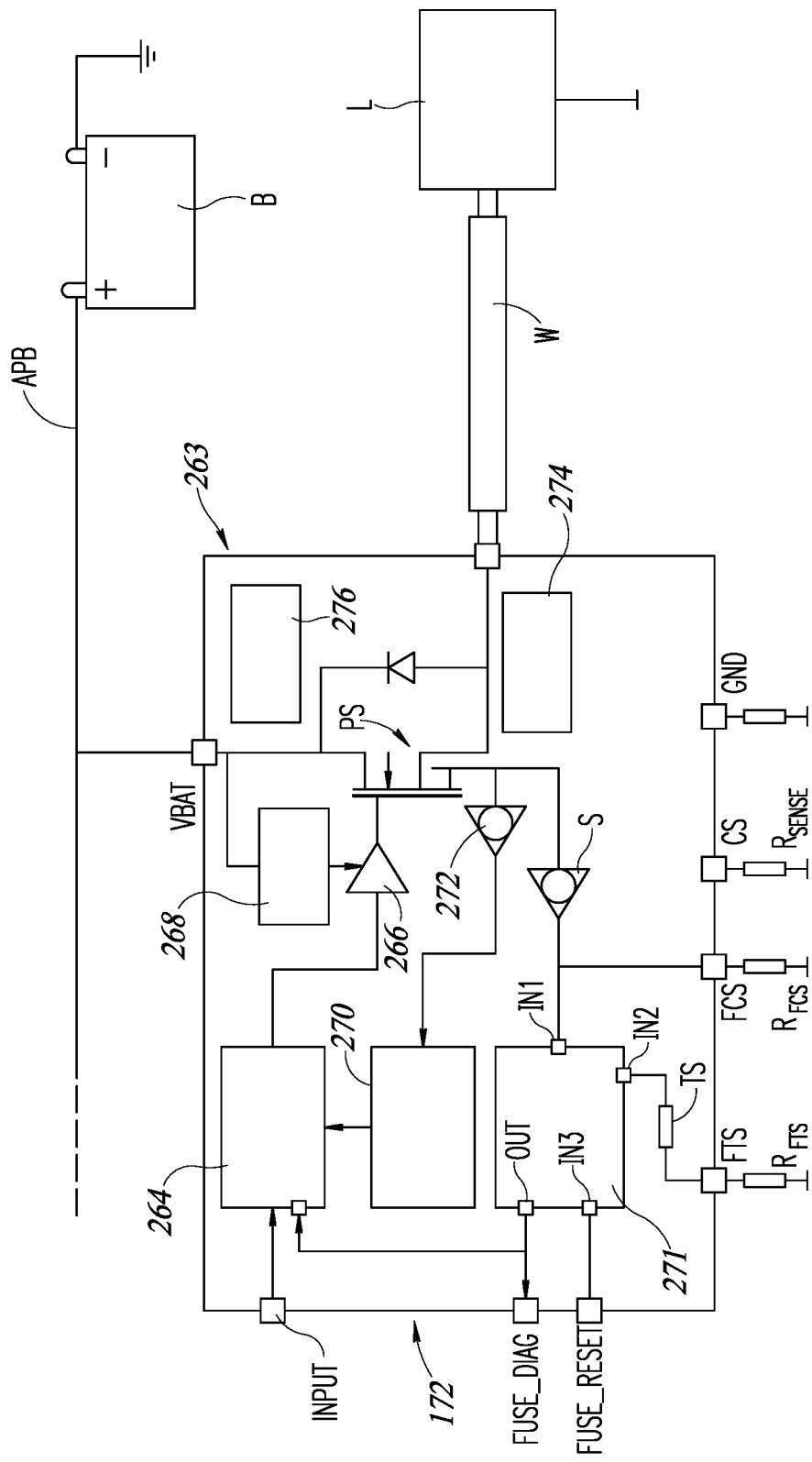
FIG. 20 is a block diagram of a system incorporating a circuit, in accordance with one or more embodiments.

FIG. 20 is exemplary of the possible use of a circuit 172 as exemplified in FIG. 5 within the framework of a system 263 which facilitates protection of a wiring harness W supplying a load L. As exemplified in FIG. 20, such a system may include a "smart" power switch and a power supply source (such as an Automotive Power Bus APB) coupled to the positive pole B+ of a battery B at a voltage VBAT.

In one or more embodiments, a system 263 as exemplified in FIG. 20 may include a power switch PS such as, for instance, a power MOSFET transistor having the current path therethrough (source-drain in the case of a field-effect transistor such as a MOSFET transistor) coupling the power supply VBAT with the wiring harness W and the control terminal of the power transistors PS (gate, in the case of field-effect transistor such as a MOSFET transistor) driven via a (logic) circuitry 180 which is sensitive to a drive signal of the load L as received at a drive node indicated as Input as well the output signal Out at the node 192 of the latch section of the circuit 172.

In FIG. 20 parts or elements like parts or elements already discussed in connection with the previous figures are indicated by like references: a detailed description of these parts or elements will not be repeated for brevity. The representation of FIG. 20 exemplifies that the control electrode (gate, for instance) of the power transistor PS may be controlled by the circuitry 180 via a control stage 266 coupled to a VDS clamp circuit block 268 which is in turn sensitive to the battery voltage VBAT with the ensuing possibility of disconnecting the wiring harness W in the presence of an over-voltage condition over the voltage VBAT. The representation of FIG. 20 also highlights the possibility for the circuitry 180 to be sensitive to the output of a silicon protection block 270 which is in turn sensitive via a current sense block 272 to the current through the power transistor PS (and thus through the wiring harness W). The same current can be sensed by the sensor S configured to be coupled to the input 182 (IN1) as exemplified in FIG. 5). The representation in FIG. 20 (which also refers to the possible presence of a charge pump 274) exemplifies that, in addition to being sent to the circuitry 180 to possibly reduce/interrupt the current through the wire W the output signal Out from the latch section 180 of the circuit 172 can be sent to an output pin Fuse_DIAG, which may be used for diagnostic purposes, e.g. by being set high when the fuse is in latch state. In FIG. 20, F_CTRL denotes a pin available for fuse control, which can be connected to the input node IN3 (node 220 FIG. 5) as a reset pin for the latch.

In FIG. 20, a pin designated FTS is shown connecting a resistance $R_{FTS}$ to ground GND with the purpose of setting the value of TNOM, so that the TS block may contribute to calculating the value of the Counter_MAX value discussed previously as a function of $R_{FTS}$. In FIG. 20, a pin designated FCS is also shown which may be used to set the value of INOM (see the block IS in FIG. 5). For instance, in one or more embodiments, the block S may be implemented as a current generator that generates a current $Ks*I_{WIRE}(t)$ proportional to the current $I_{WIRE}(t)$ in the wire W: this may occur, for instance, via a sensfet feature associated to the transistor PS. A resistance $R_{FCS}$ between the pin FCS and ground may be used to set the value for INOM so that, for instance, the voltage at the input node 182 in FIG. 5 (that is, IN1) is equal to 1 when $I_{WIRE}$ equals INOM.

The representation of FIG. 20 also refers to the possible presence of further pins designated CS (a function that may be provided in "smart" power devices) and GND (the ground of the IC of the system 263). This representation is merely for the sake of completeness, insofar as neither of the pins are of relevance to the instant description. FIG. 20 is exemplary of one possible, non-limiting application of certain embodiments to a control circuit embedded in an otherwise conventional "smart" power IC. Reference to this possible application is merely exemplary of one of a variety of possible applications which may benefit from the capability of controlling the temperature-over-time budget of a conductor having a current flowing therethrough.

A circuit 172 as exemplified herein may thus be included (embedded, for instance) is a system having a different configuration from the one exemplified in FIG. 20. For instance, a circuit 172 as exemplified herein may be embedded in a gate driver not including a power switch. Also, in one or more embodiments, the operating parameters can be set in a manner different form the manner presented herein by way of example. For instance, INOM and/or TNOM can be set via serial bus communication and/or as an alternative to the analog implementation exemplified in FIG. 20, the blocks IS, TS can be implemented as digital circuitry.

Likewise, sensing the current $I_{wire}(t)$ may be via a shunt amperometric arrangement. Analog-to-digital (A/D) conversion of the current $I_{wire}(t)$ may be facilitate current management in a (wholly) digital manner. In various possible applications, a circuit 172 as exemplified herein may provide a simple circuit able to evaluate the $I_{RMS}$ (root-mean-square value of the current) flowing in a cable. A circuit 172 as exemplified herein may be used either to interact with a driver to interrupt a current (when $I_{RMS}$>INOM, for instance), to limit the current flowing in a wire by PWM modulation or just to issue a warning that may be communicated by a diagnostic. As noted, a circuit 172 as exemplified herein is able to measure the $I_{RMS}$ value insofar as the parameters (thresholds) K2 to Kn can be selected as normalized values of a current defined for normalized values of the timing (1 to $2^{n-2}$). The values K2 to Kn may be fixed values such that, if multiplied by INOM, may define an IT curve fitting with the wire IT characteristics where the wire IT characteristics are defined for a maximum temperature of the wires with a given ambient temperature, which is facilitated by the fact that K2 to Kn can be calculated for a constant value of $I_{RMS}$. One or more embodiments as exemplified herein facilitate the $I_{RMS}$ calculation/evaluation by implementing the calculation of the integral of $i^2(t)$ over time (that is $\int i^2(t)dt$) as a simple counter where the incremental value dt is discrete and made variable as a function of the current. One or more embodiments take advantage of using power of 2 ($2^I$) incremental values as this facilitates a simple implementation of the counter. Determining (calculating) the current thresholds as INOM*(K1, . . . , Kn) facilitates obtaining a counting result which is representative of $I_{RMS}$. One or more embodiments were found to operate correctly also when the current i(t) is variable with fast transients insofar as a system clock frequency can be selected which is (much) higher (ten time higher, for instance) than the frequency bandwidth of i(t). In that way, the incremental value ($2^I$) is updated many times during a transient. This facilitates achieving a high degree of precision as a function of the resolution of the references INOM* (K1, . . . Kn).

A circuit (for instance, 172) as exemplified herein may include an input node (for instance, 182) configured to receive a sensing signal (for instance, IN1) indicative of a current intensity (for instance, $I_{WIRE}(t)$ of a current flowing in a conductor (for instance, W) and an output node (for instance, 192) configured to emit an output signal (for instance, Out). The circuit may include signal processing circuitry (for instance, 174 and 176 coupled to the input node to receive the sensing signal therefrom, the signal processing circuitry configured to compare (for instance, 184, 190) the current intensity with a reference value (for instance, INOM) for the current intensity in the conductor and to produce (for instance, 188) a comparison signal (for instance, D1, . . . , Dn) indicative of whether the current intensity exceeds the reference value. The circuit may include counter circuitry (for instance, 192) coupled to the signal processing circuitry, the counter circuitry driven by the comparison signal and configured to count in a first count direction (for instance, upward) as a result of the comparison signal indicating that the current intensity exceeds the reference value. The circuit may include latch circuitry (for instance, 180 coupled (for instance at 222) to the counter circuitry, the latch circuitry sensitive to the count value of the counter circuitry and configured, as a result of the count value of the counter circuitry reaching a limit value (for instance, Counter_MAX), to emit the output signal at the output node.

In some embodiments, the output node may be configured to emit a current control output signal (for instance, towards the logic circuitry 180) to reduce (for instance, to interrupt) the current flowing in the conductor and/or a warning output signal (for instance, Fuse_DIAG) indicative of a current intensity value (for instance instantaneous, $I_{WIRE}(t)$, or root-mean-square, $I_{RMS}$) of the current flowing in the conductor having reached a limit value.

In some embodiments, the counter circuitry may be configured to count in a second count direction (for instance, downward), opposite the first count direction, as result of the comparison signal indicating that the current intensity fails to reach the reference value. In some embodiments In some embodiments the first and second count directions of the counter circuitry may include increasing and decreasing, respectively, the count value of the counter circuitry, and/or the counter circuitry may be configured to omit counting in the second count direction, opposite the first count direction, in the presence of a zero count value of the counter circuitry.

In some embodiments the circuit may include first parameter setting circuitry (for instance, IS) coupled to the first input node, the first parameter setting circuitry configured to set the reference value for the current intensity in the conductor. The first parameter setting circuitry may comprise a normalization block configured to supply the first input node with a sensing signal normalized to the reference value for the current intensity in the conductor.

In some embodiments, the signal processing circuitry may include a comparator bank (for instance, 184) coupled to the first input node and configured to compare the current intensity with a plurality of thresholds, wherein the comparison signal may comprise a multi-bit binary word, wherein the counter circuitry may be configured to vary its count in the first count direction as a function of the multi-bit binary word. In some embodiments, the counter circuit may be configured to vary its count in the second count direction in fixed variation steps (for instance, as set by 198).

In some embodiments, the latch circuitry may comprise second parameter setting circuitry (for instance, TS, 188) configured to set the limit value (for instance, Counter_MAX) for the latch circuitry to emit the current control signal. In some embodiments, the second parameter setting circuitry may be configured to receive (for instance, 190) a time setting signal (for instance, IN2, TNOM) which is a function of a latch time for the latch circuitry to emit the current control signal for a certain constant current intensity in the conductor and to set the limit value for the latch circuitry to emit the current control signal as a function of the time setting signal.

In some embodiments, the thresholds in the plurality of thresholds (for instance, K1, . . . Kn) in the comparator bank have values wherein the time setting signal multiplied by $2^{(I-2)}$ equals a latch time for the latch circuitry to emit the current control signal for a constant current intensity in the conductor equal to the product of the reference value and the I-th threshold in the plurality of thresholds in the comparator bank.

A system (for instance, 263) as exemplified herein for supplying electrical power to a load (for instance, L) via a conductor may include an electronic switch (for instance, PS) having a control terminal as well as a current path therethrough, the electronic switch configured to be arranged with the current path therethrough between an electrical power supply source (for instance, APB) and the conductor to control current flow between the electrical power supply source and the conductor. The system may include a circuit (for instance, 172) as exemplified herein having the input node configured to receive a sensing signal indicative of a current intensity of a current flowing in the conductor and the output node coupled (for instance, via the logic circuit 180) to the control terminal of the electronic switch and configured to apply thereto the current control signal to reduce (for instance, to interrupt) the current flowing in the conductor.

In some embodiments, a method of operating a circuit or a system may include selecting an upper limit for a DC current intensity in the conductor and adopting the upper limit for DC current intensity in the conductor as the reference value for the current intensity in the conductor.

Figure 6:
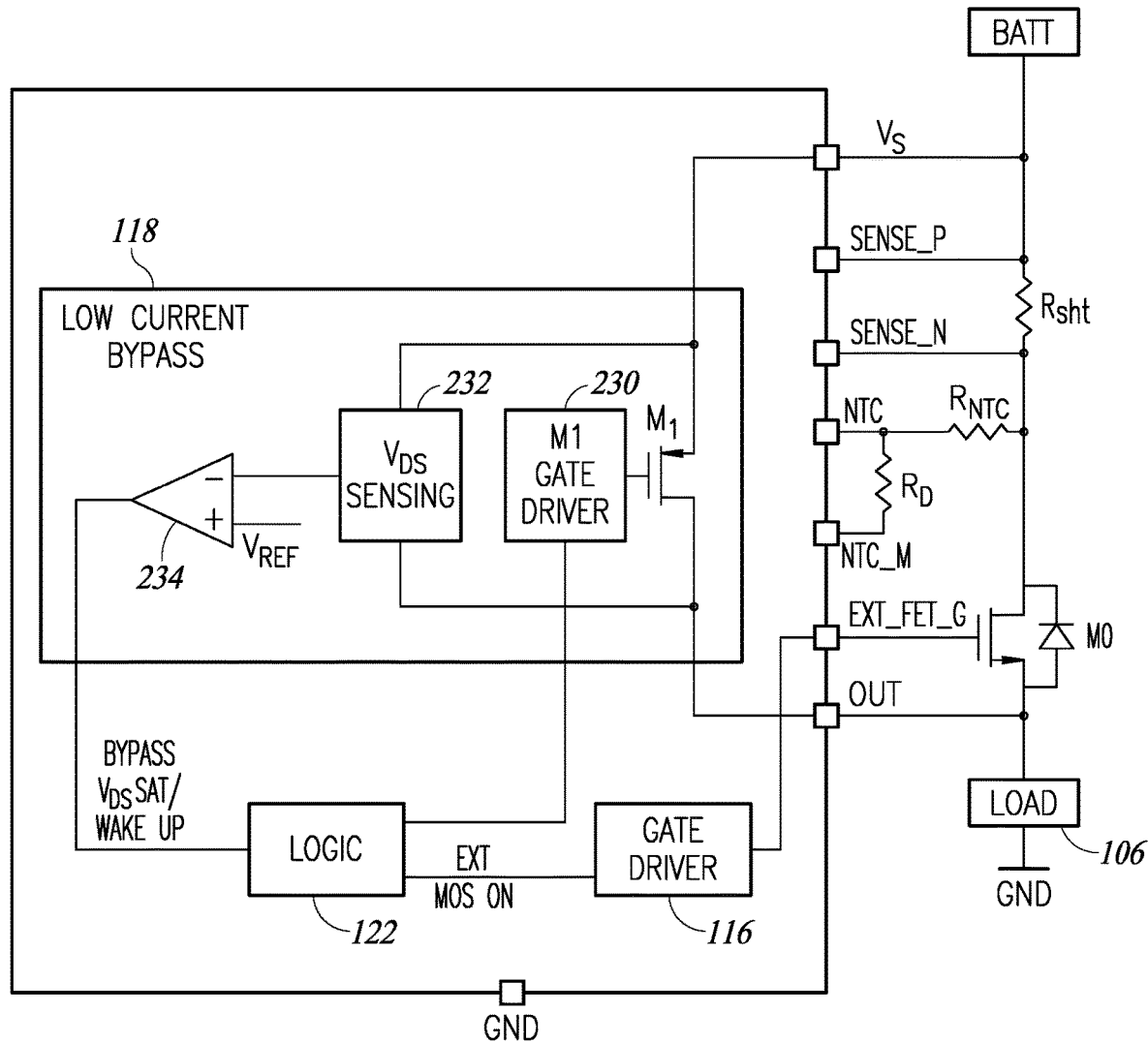
FIG. 6 is a schematic diagram illustrating further details of the low current bypass subsystem of the system shown in FIG. 1, in accordance with one or more embodiments.

FIG. 6 is a schematic diagram illustrating further details of the low current bypass subsystem 118, in accordance with some embodiments. As shown in FIG. 6, the low current bypass subsystem 118 includes an internal path that may be used to supply the load 106 when it beneficial or otherwise may advantageously be provided with low current even if the external power MOSFET M0 is turned off.

The low current bypass subsystem 118 includes a low current bypass transistor M1 which is selectively enabled from the digital part (e.g., from the logic 122, and in some embodiments, from the p-channel bypass circuitry 130 within the logic 122). For example, in some embodiments, the p-channel bypass circuitry 130 in the logic 122 may transmit a control signal to the M1 gate driver circuitry, which causes the M1 gate driver circuitry 230 to selectively enable the low current bypass transistor M1 via a control signal delivered to a gate terminal of the bypass transistor M1.

Once M1 is activated (e.g., placed in a conductive state) the microcontroller 105 could decide in which state the device (e.g., the electronic fuse 110 or system 100) should stay maintaining the bypass activated. In some embodiments, the device is operable in a low consumption mode, and in this condition or mode the current consumption of the device is minimized or reduced, all the features and diagnostics are disabled, and the device is just feeding the load with current via the low current bypass and sensing its drain-source voltage (e.g., sensing the drain-source voltage across the low current bypass transistor M1).

In some embodiments, the microcontroller 105 could maintain the device in an active state even when the low current bypass transistor M1 is enabled, in which case the current consumption from the battery is higher than the previous state (e.g., higher than the low consumption mode), but all device features (e.g., the features and functionalities of the system 100 and the electronic fuse 110 described herein) are active.

An advantage of the active state during the condition when low current bypass is activated is that when the external power MOSFET M0 is automatically turned on the charge pump 109 is already ready to switch on the external power MOSFET M0. On the other hand, in the low consumption mode, before the external power MOSFET M0 can be switched on the device may experience some delay or wait a certain amount of time before certain features like the charge pump 109 can be turned on and capable of switching on the external power MOSFET M0. The system 100 also includes a power management module 111.

The low current bypass subsystem 118 includes Vds sensing circuitry 232 configured to continuously sense the voltage drop across the low current bypass transistor M1, and when the load 106 is trying to sink current (e.g., when the load becomes operational or otherwise is turned on), the current initially flows through the low current bypass transistor M1, and consequently the voltage drop Vds of the low current bypass transistor M1 starts to increase. The sensed voltage drop Vds may be compared with a reference threshold Vref, for example, by a comparator 234. When the sensed voltage drop Vds is greater than the reference threshold Vref, the low current bypass subsystem 118 provides an output signal (e.g., via an output of the comparator 234) to the digital core or logic 122, which causes the logic 122 to switch on the external power MOSFET M0 (e.g., via a control signal output by the gate driver 116), and to switch off the low current bypass transistor M1 (e.g., via a control signal output by the M1 gate driver 230), and in a case where the electronic fuse 110 is in low consumption mode, it goes in active mode autonomously or automatically. This latter event causes also the electronic fuse to write a specific data (e.g., a single bit) in a specific register location (e.g., within the registers 126) such that the microcontroller 105 can read it and become aware of this specific event, in some embodiments.

Figure 7:
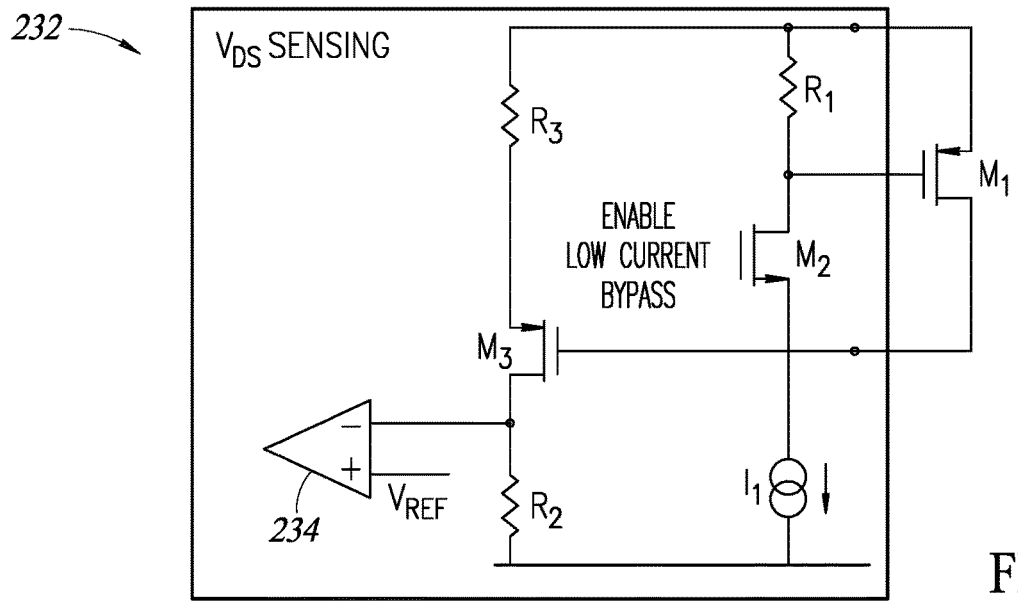
FIG. 7 is a schematic diagram illustrating further details of the Vds sensing circuitry of the low current bypass subsystem of FIG. 5, in accordance with one or more embodiments.

FIG. 7 illustrates further details of the Vds sensing circuitry 232, in accordance with some embodiments. As shown in FIG. 7, the low current bypass functionality is activated by a voltage drop across resistor R1. The voltage drop across resistor R1 is generated through the switching on of transistor M2, which allows the current I1 to flow through resistor R1, thereby creating the voltage drop across resistor R1. The voltage drop across R1 may be designed to generate the appropriate Vgs to switch on the low current bypass transistor M1.

When the load 106 is trying to sink current, the current initially is flowing through the low current bypass transistor M1, and consequently the Vds of the low current bypass transistor M1 starts to increase carrying down the gate of transistor M3. As soon as the Vgs of transistor M3 is greater than the threshold voltage Vth of transistor M3, the transistor M3 allows to the current to flow through it, moreover the current will follow the equation IR3=(VDSM1−VGSM3)/R3=IR2. The current creates a voltage drop across resistor R2 which is compared with a threshold or reference voltage Vref (e.g., by the comparator 234), and the equation of VR2 is VR2=(R2/R3)*(VDSM1−VGSM3). As soon as the voltage across R2 becomes greater than Vref, the logic 122 that receives that information from the low current bypass subsystem 118 (e.g., from an output of the comparator 234) will trigger the device to wake up and automatically switch on the external power MOSFET M0 in order to feed the current needed or desired to power the load and to switch off the low current bypass transistor M1.

Figure 8:
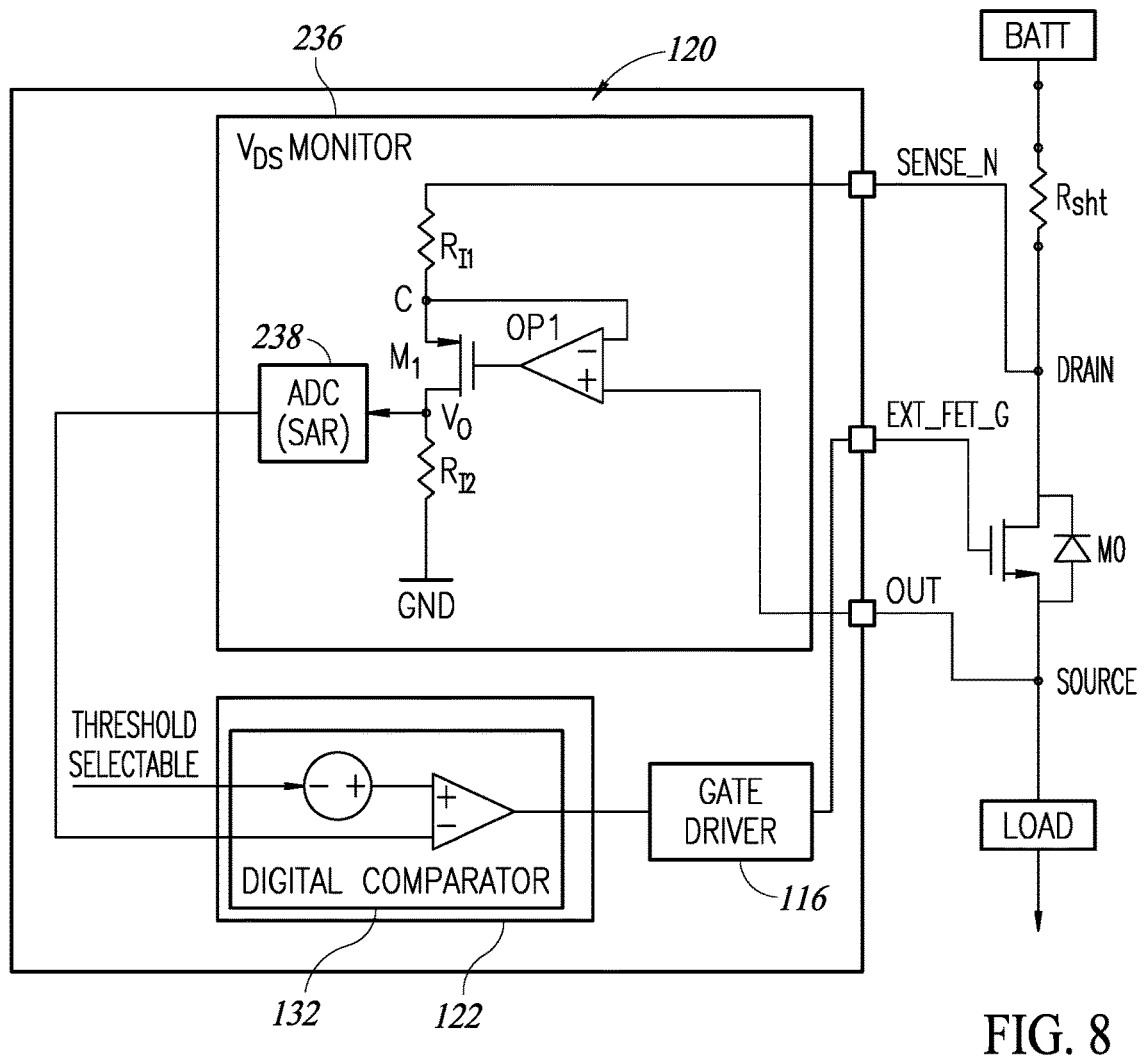
FIG. 8 is a schematic diagram illustrating further details of the external MOSFET desaturation sensing subsystem of the system shown in FIG. 1, in accordance with one or more embodiments.

FIG. 8 is a schematic diagram illustrating further details of the external MOSFET desaturation sensing subsystem 120. In particular, the desaturation sensing subsystem 120 monitors the external MOSFET M0 drain-source voltage in order to avoid an exit from the ohmic MOSFET region and entrance into the saturation region, because in the saturation region a Vds increase causes an increase of the power dissipated by the external MOSFET M0 that in turn may generate overheating of the same. For this reason, the Vds voltage of the external MOSFET M0 is continuously monitored by the Vds monitoring circuitry 236 when the external MOSFET M0 is turned on. The Vds monitoring circuitry 236 senses the floating voltage Vds and transforms it to a voltage $V_O$ referenced to ground. $V_O$ is then converted to digital data by an ADC 238 and the output of the ADC 238 is compared with a selectable threshold (e.g., by the digital comparator, which in some embodiments may be included within the logic 122, such as within the desaturation sensing circuitry 132 within the logic 122). In some embodiments, the selectable threshold may be written by the microcontroller 105 into a specific register (e.g., within the registers 126). In the event that $V_O$ (the corresponding digital converted value) is above the selectable threshold, the external MOSFET M0 is switched off. In some embodiments, this event (i.e., switching off the external MOSFET MO in response to $V_O$ exceeding the selectable threshold) also causes the electronic fuse 110 to write a specific data (e.g., a single bit) in a specific register location such that the microcontroller 105 can read it and become aware of this specific event (i.e., Vds overcoming the selected threshold value). In other words, a desaturation shut-down of the external MOSFET occurs when the Vds exceeds the selectable threshold. In this case, both the external MOSFET M0 and the bypass switch (e.g., the low current bypass transistor M1) may be turned off. For example, the external MOSFET M0 may be turned off by an output of the digital comparator in the logic 122 which is transmitted to the gate driver 116, which in turn outputs a control signal to switch off the external MOSFET M0. The low current bypass transistor M1 may be switched off by a control signal issued by the logic 122 which causes the M1 gate driver 230 to control the low current bypass transistor M1 to switch off.

Moreover, the $V_O$ voltage digital converted value may be stored in a status register and can be read by the microcontroller 105 via the communication interface 107 (e.g. an SPI interface).

As shown in FIG. 8, the Vds monitoring circuitry 236 senses the floating voltage drop Vds across the drain and source terminals of the external MOSFET M0 and convert it to a corresponding voltage $V_O$ referenced to ground. The operational amplifier 244 is configured to cause the voltage drop Vds to be "copied" as a same voltage drop across the terminals of the internal resistor Ri1. The current flowing in Ri1 is Isense=Vds/Ri1. The current flowing across the external MOSFET is Vds/RdsON, and to minimize the impact of the measurement on the Vds value the circuited may be designed such that the condition Ri1>>Ron is met (e.g., with Ri1 is 10×, 100×, and in some embodiments 1000× greater than Ron). The voltage drop Vo across the resistor Ri2 is 10*Vds (the gain factor 10 is just an example) and is periodically sampled and digitized according to a given sampling frequency by the ADC 238 which generates a stream of digital samples representing Vo that are passed to the logic 122. In the event that the sampled digital signal representing Vo is above the selectable threshold, the logic 122 (e.g., the desaturation sensing circuitry 132) commands or otherwise controls the external MOSFET to switch off.

In some embodiments, the desaturation sensing subsystem 120 which performs the Vds sensing may be equipped with a dedicated self-test functionality in order to periodically check the status of the Vds monitoring.

Figure 9:
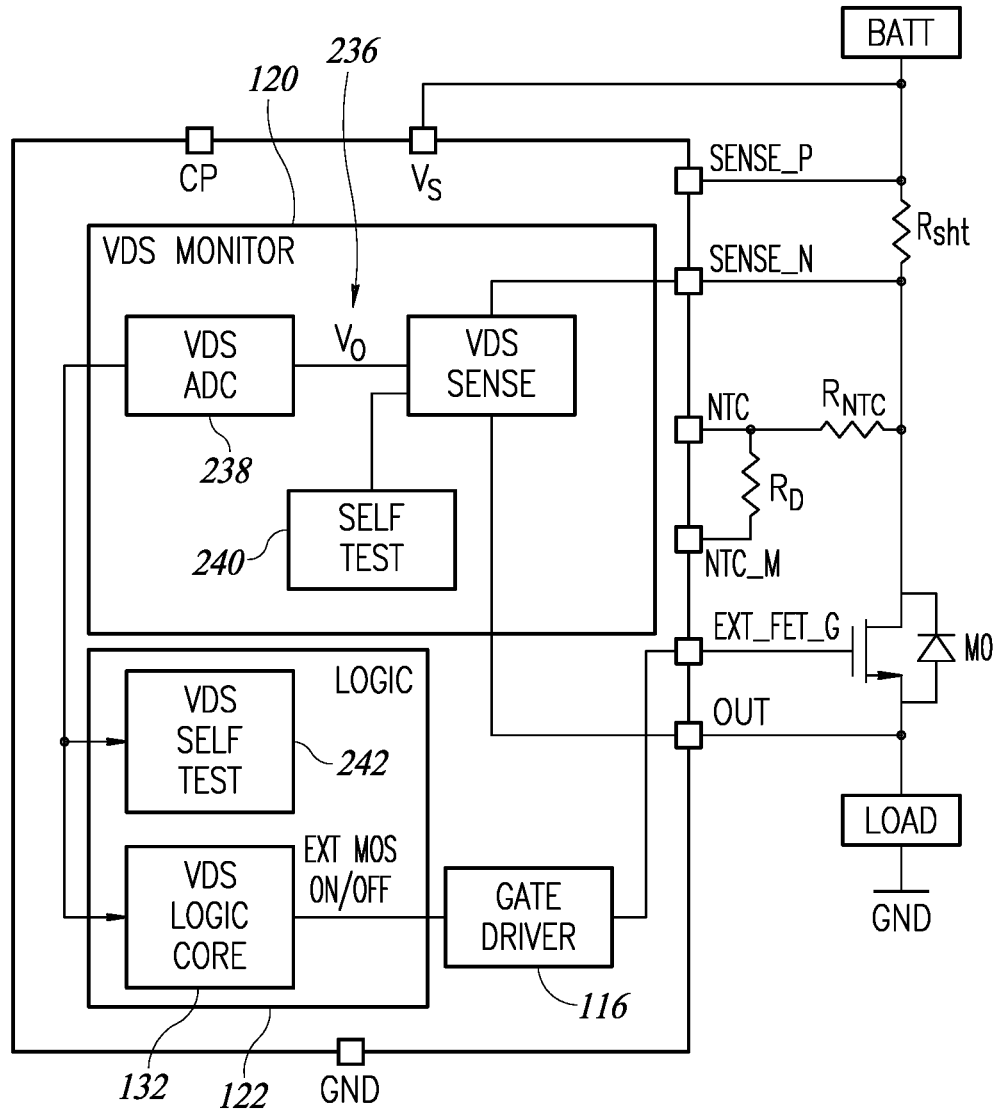
FIG. 9 is a schematic diagram illustrating the desaturation sensing subsystem of the system shown in FIG. 1, and corresponding desaturation sensing circuitry in the logic including self-test features, in accordance with one or more embodiments.
Figure 10:
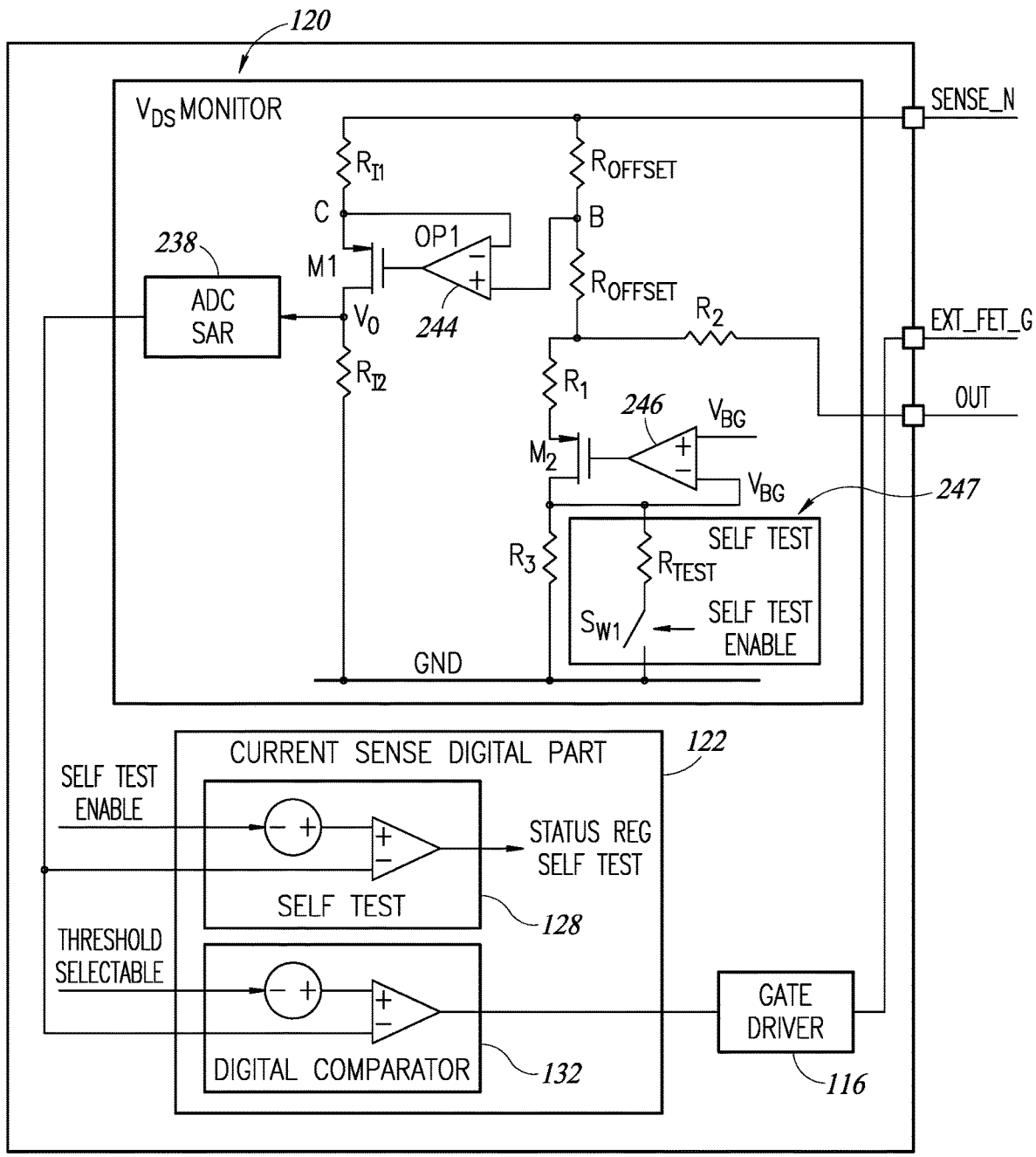
FIG. 10 is a schematic diagram illustrating further details of the self-test features shown in FIG. 9, in accordance with one or more embodiments.

FIG. 9 is a schematic diagram illustrating the desaturation sensing subsystem 120 and corresponding desaturation sensing circuitry 132 in the logic 122 including self-test features, in accordance with some embodiments. FIG. 10 is a schematic diagram illustrating further details of the self-test features shown in FIG. 9, in accordance with some embodiments.

As shown in FIG. 9, the desaturation sensing subsystem 120 may including Vds sensing circuitry and an ADC 238, which may be the same or substantially the same as the Vds monitoring circuitry 236 previously described herein with respect to FIG. 8. However, as shown in FIG. 9, in some embodiments, the desaturation sensing subsystem 120 may further include self-test circuitry 240 (which in some embodiments may be the same as the self-test circuitry 119 shown in FIG. 1) and corresponding Vds self-test circuitry 242 within the logic 122. In some embodiments, the Vds self-test circuitry 242 may be included as part of the self-test circuitry 128 shown in FIG. 1.

As shown in FIG. 10, the Vds monitoring circuitry implements a current generator via the elements R3, M2, 246, and Vbg, which creates a current $I_{R3}$ through resistor R3 that is equal to $V_{bg}/R3$. As such, considering $2*R_{offset}>>R2$ and thus the current flowing through $R_{offset}$ is negligible versus the current on R2, the point or node "A" has an offset voltage with respect to the OUT pin of $I_{R3}*R2=V_{OFF}$. The voltage drop $V_{Roff}$ across the upper resistor $R_{offset}$ (e.g., between the terminal SENSE_N and the non-inverting (+) terminal of 244 (or node "B") can be determined as follows $V_{DS}+V_{OFF}=2*V_{Roff}=>V_{Roff}=(V_{DS}+V_{OFF})/2$.

The operational amplifier 244 in operation "copies" the voltage at node B to node C and thus the voltage drop across the resistor R is forced to the value of the voltage drop across the upper resistor $R_{offset}$. As a consequence, a current $V_{Roff}/Ri1$ flows through Ri1 and in turn through M1 and Ri2 causing a voltage drop on the resistor Ri2 that is (by way of example) 10 times the voltage drop across Ri1, so (by way of example) equal to 10VRoff.

The voltage drop across the resistor Ri2 is then converted to a digital value by the ADC 238. The output of ADC is digitally compared with a selectable threshold by a digital comparator (e.g., which may be included within the desaturation sensing circuitry 132 of the logic 122), and if the output is greater than the selectable threshold this means that the VDS of the external power MOSFET M0 is too high. Thus, in order to avoid maintaining the external power MOSFET M0 in the saturation region it is switched off, for example, by controlling the gate driver 116 to switch off the external power MOSFET M0.

As it can be noticed in the previous equations the value $V_{OFF}/2$ offset voltage (the voltage drop across R2 divided by 2) created for the purpose of the self-test functionality may cause an undesired bias on the voltage drop value across the Ri2 resistor that is indicative of the Vds value. To avoid or mitigate this problem in normal mode operation (in other words when the device is not in the self-test mode) the $V_{OFF}$ offset voltage may be cancelled or removed from the voltage, and this is done in some embodiments through a calibration phase of the ADC 238 (e.g., a SAR converter) for example during the testing during manufacturing phase.

The self-test circuitry 240 includes a test resistor $R_{test}$ that during the self-test mode is connected in parallel to the resistor R3 by closing the switch $SW_1$, while during the normal operation mode is disconnected by opening the switch $SW_1$. In the self-test mode when the switch $SW_1$ is closed the equivalent resistance $R3 \| R_{test}$ is lower than the resistance of resistor R3 when in normal operation mode, in this way increasing the intensity of the current $I_{R3}$ flowing through resistor R3 with respect to the intensity level when in normal operation mode. Consequently, the voltage $V_{OFF}$ (voltage drop across R2) increases in self-test mode with respect to the level when in normal operation mode. Since the increased $V_{OFF}$ is well-know, the digital comparator of self-test circuitry 128 checks if the $V_{DS}$ measured before the self-test is increased of the added $V_{OFF}$.

Those skilled in the art will readily appreciate that the above mentioned Vds monitoring self-test mode does not imply that the whole application needs to be in a mode that precludes the external power MOSFET M0 being in an operative mode condition meaning switched on and supplying current to a load. In fact, in some embodiments, the above-described Vds monitoring self-test mode is fully operational and works in particular when the external power MOSFET M0 is switched on as in normal operating condition.

In some embodiments, the microcontroller 105 is configured to write a data in a specific register (e.g., 1 bit) to command the electronic fuse 110 to perform the Vds sense self-test. The result of the Vds sense self-test may be stored in a dedicated status register (e.g., within the registers 126) that can be read by the microcontroller 105 through the communication interface 107.

Figure 11:
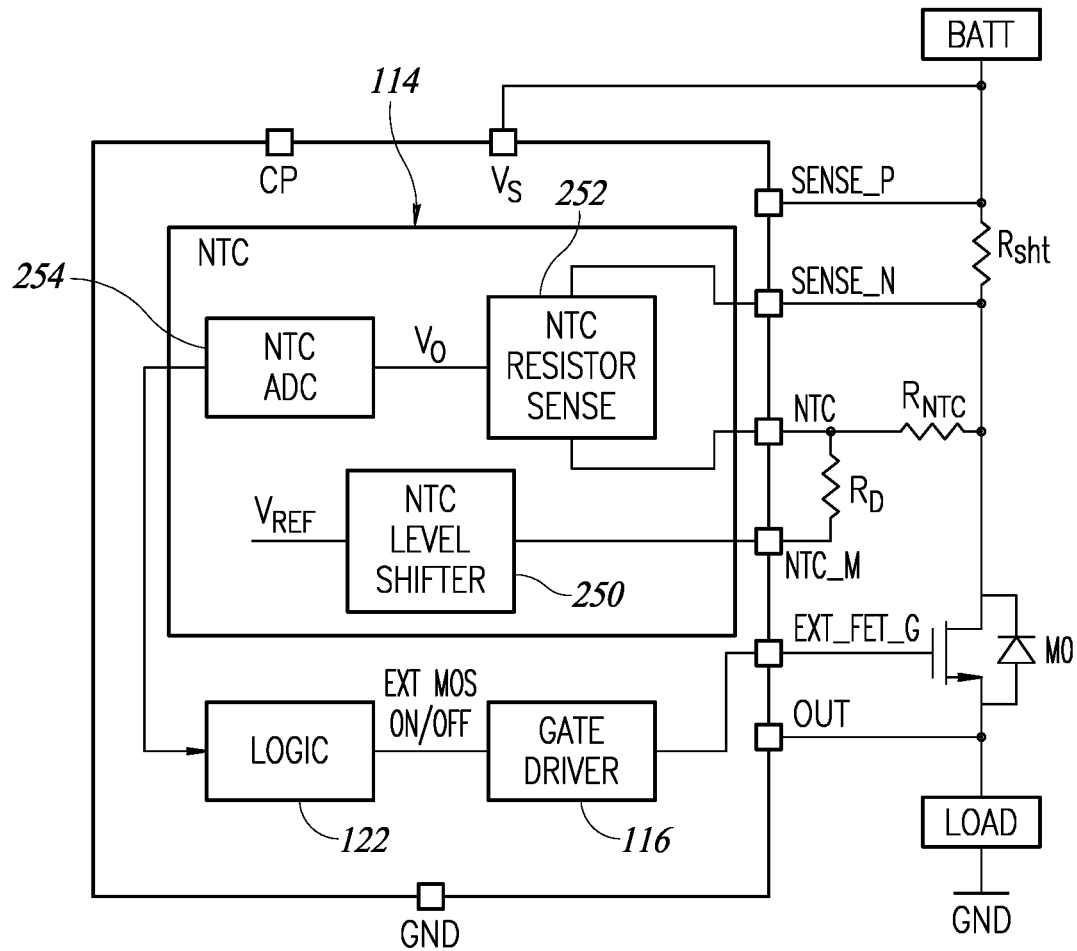
FIG. 11 is a schematic diagram illustrating further details of the external MOSFET over-temperature shutdown features of the system shown in FIG. 1, in accordance with one or more embodiments.

FIG. 11 is a schematic diagram illustrating further details of the external MOSFET over-temperature shutdown features of the system 100, in accordance with one or more embodiments. As shown in FIG. 11, the external power MOSFET M0 temperature is monitored through a temperature sensitive resistor or thermistor (which in some embodiments may be NTC (Negative Temperature Coefficient) thermistor), represented as $R_{NTC}$ with one terminal connected to the drain of the external power MOSFET M0. The direct connection of the NTC thermistor to the drain of the external power MOSFET M0 allows an optimal heat exchange between them, thereby facilitating a faster response of thermistor to temperature variation of the external power MOSFET M0 with respect to the usual case where an NTC thermistor is biased to a lower voltage than the drain of the external power MOSFET M0 and so an electrical isolation would otherwise be needed or desired between them.

This direct connection is allowed at least in part due to the NTC level shifter circuitry 250, which may be included within or as part of the external MOS temperature sensing subsystem 114. In particular, the NTC level shifter circuitry 250 creates a biasing voltage NTC_M which is equal to the voltage at the external MOSFET M0 drain $V_{DRAIN\_MOS}$ minus an internal voltage reference $V_{ref}$, so $V_{NTC\_M} = V_{DRAIN\_MOS} - V_{ref}$.

The NTC thermistor and $R_{bias}$ (shown in FIGS. 11 and 12 as $R_D$) are configured as a resistor ladder between the external MOSFET drain and NTC_M, thus the voltage $V_{NTC}$ of the central point of the resistor ladder (NTC terminal) with respect to the voltage of the drain of the external MOSFET M0 will follow the equation:

$$V_{NTC} = (V_{DRAIN\_FET} - V_{NTC\_M}) * (R_{NTC}/(R_{NTC} + R_{BIAS})),$$

where $$V_{ref} = (V_{DRAIN\_FET} - V_{NTC\_M})$$

The external MOS temperature sensing subsystem 114 includes temperature sensitive resistor circuitry 252 (which may be referred to herein as NTC resistor sense circuitry 252) that senses and transfers the differential voltage across the temperature sensitive resistor (e.g., a NTC resistor) to a voltage referenced to ground $V_0$, which is digitally converted through an ADC 254.

The converted voltage is compared with a selectable threshold inside the NTC logic core (e.g., within the temperature monitoring circuitry 134 within the logic 122), and if the voltage exceeds the threshold, the external power MOSFET M0 is automatically switched off (e.g., through control of the gate driver 116).

In some embodiments, the switch-off of the external power MOSFET M0 is actuated autonomously by the electronic fuse 110 without instruction or intervention by the microcontroller 105, thus reducing the reaction time and increasing the level of safety provided by the electronic fuse 110

In the event that the converted voltage exceeds the selectable threshold and the external power MOSFET M0 is automatically switched off, in some embodiments, the electronic fuse 110 writes a specific data (e.g., 1 bit) into a specific memory location (e.g., within the computer-readable memory or the registers 126) to record that an external power MOSFET over-temperature condition has occurred, which the microcontroller 105 can read and become aware of this specific condition. The electronic fuse 110 writes an additional specific data (e.g., 1 bit) into an additional specific memory location (e.g., within the computer-readable memory or the registers 126) to record that the external power MOSFET M0 has been shut-down or switched off, which the microcontroller 105 can read and become aware of this specific event.

The selected threshold to adopt (e.g., the threshold that is selected, which in some embodiments may be selected from among a plurality of possible thresholds) may be communicated by the microcontroller 105 to the electronic fuse 110 (e.g., to the logic 122) by writing the corresponding value (e.g., a threshold voltage value or the like) in a specific register (e.g., within the registers 126). In some embodiments, the converted voltage $V_0$ is also stored in a status register which may be readable by the microcontroller 105, e.g., through the communication interface 107 (e.g., SPI).

Figure 12:
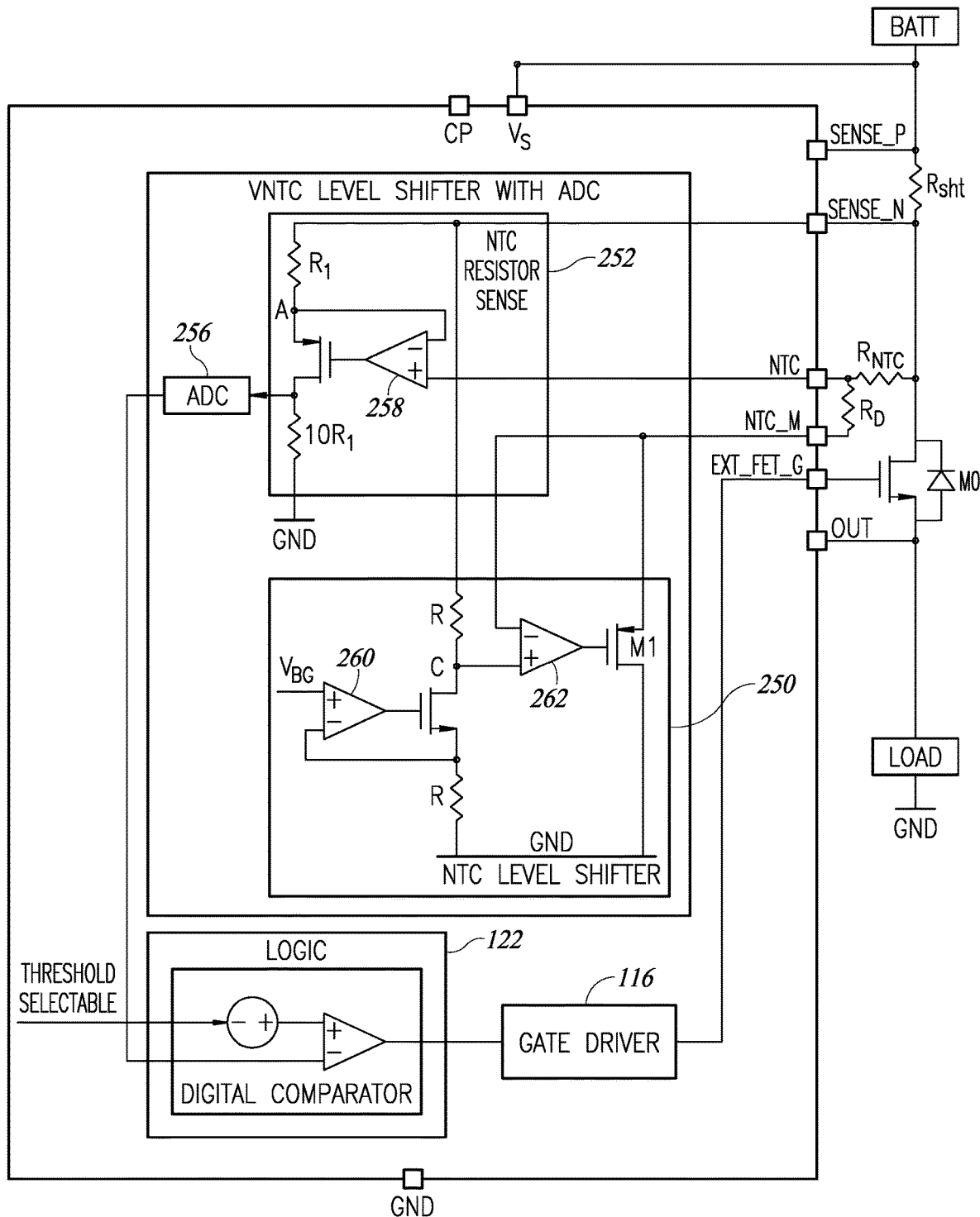
FIG. 12 is a schematic diagram illustrating further details of the NTC resistor sense circuitry, the NTC level shifter circuitry, and the temperature monitoring circuitry of the external MOSFET over-temperature shutdown features shown in FIG. 11, in accordance with one or more embodiments.

FIG. 12 is a schematic diagram illustrating further details of the NTC resistor sense circuitry 252, the NTC level shifter circuitry 250, and the temperature monitoring circuitry 134, in accordance with one or more embodiments.

As shown in FIG. 12, the biasing voltage NTC_M is generated through NTC level shifter circuitry 250 with a current generator (e.g., including $V_{BG}$, operational amplifier 260, "lower" R resistor connected to the ground) equal to $V_{BG}/R$ which is sinked from $V_{SENSE\_N}$ through another resistor ("upper") R whose terminals are connected to SENSE_N and node C, and equal to the one used for the current generator. Thus, the voltage drop across the upper resistor R is equal to $V_{BG}$ and so the voltage at node C is $V_C=V_{SENSE\_N}-V_{BG}$. Finally, it is buffered (e.g., by operational amplifier 262 and MOS M1) to node NTC_M in order to be used as the biasing voltage for the thermal sensor ($R_{NTC}$).

The NTC resistor $R_{NTC}$ voltage sensing can be implemented, in at least some embodiments, with an operational amplifier 258 which transfers the voltage $V_{NTC}$ on node A creating a drop across resistor R1 equal to the drop across $R_{NTC}$.

The current generated from the drop across resistor $R_1$ equal to $IR_1=V_{RTC}/R_1$ will flow over a resistor which is (by way of example) 10 times $R_1$, thereby gaining or increasing the voltage across $R_1$, e.g., by a factor of 10. Accordingly, this block or circuitry senses the drop on the NTC resistor and transfers it to a voltage referenced to ground.

The voltage gained is digitally converted by the ADC 254 and read from a digital comparator (e.g., within the temperature monitoring circuitry 134) which compares it with a selectable threshold in order to switch off the external power MOSFET M0 in case of the NTC voltage exceeds the preset or selected threshold. It will be readily appreciated that the thermal sensor NTC is just an example of a thermal sensor which may be implemented in accordance with some embodiments; however, embodiments are not limited thereto. Any other suitable thermal sensors may be utilized in various embodiments, including, for example, a PTC (Positive Temperature Sensor) and even a diode can be used in combination with the described solution.

As described herein, the present application provides electronic fuse devices and systems having a variety of advantageous features and functionalities. One such feature may include the capability of the electronic fuse 110 of emulating the so called I2t characteristic curve of a cable, acting in this way as an "electronic fuse."

Another feature of some embodiments includes the particular electrical connection of the temperature sensitive resistor (e.g., $R_{NTC}$) to the external network (e.g., to the electrical network including the power supply 108 and the load 106), as well as the particular circuitry to manage the temperature sensitive resistor $R_{NTC}$ sensing (e.g., the circuitry of the external MOS temperature sensing subsystem 114). It will be readily appreciated that in some embodiments, the temperature sensitive resistor may be a NTC thermistor, but embodiments are not limited thereto. For example, in some embodiments, the temperature sensitive resistor may be a positive temperature coefficient (PTC) thermistor, a diode, or any other circuitry or circuit element suitable to sense temperature.

In some embodiments, one of the two terminals of the temperature sensitive resistor $R_{NTC}$ is electrically connected to the drain of the external power MOSFET M0 which is at "high voltage" connected to the power supply 108 (such as, for example, a car battery that can be 12 V, 24 V, 48 V, in some embodiments). This ensures an optimal heat exchange and facilitates protection of the temperature sensitive resistor in embodiments of the present disclosure. In contrast, circuits in which the same terminal of a temperature sensitive resistor is connected to a low voltage supply (e.g., 5 V) for compatibility with the low voltage used in the internal device may have a large voltage gap existing between the external power MOSFET (e.g., 48 V) and the voltage supply which the temperature sensitive resistor is connected to (e.g., 5 V), which may cause damage to the temperature sensitive resistor in such circuits.

In some embodiments, the external power MOSFET switch-off may be performed autonomously by the electronic fuse 110 without the intervention of the outside microcontroller when the external power MOSFET reaches an over-temperature condition, and the over-temperature condition may be detected by the electronic fuse when the voltage across the terminal of the temperature sensitive resistor $R_{NTC}$ excess a threshold voltage.

Another feature of some embodiments includes the presence of a combination of a communication interface (e.g., the communication interface 107) and a set of registers (e.g., the registers 126) that ensures a high level of configurability of the device (e.g., the electronic fuse 110) and a sophisticated capability of monitoring the same from a system integrator perspective. The inclusion of these two technical features in the electronic fuse, in some embodiments, allows the microcontroller 105 to configure the electronic fuse 110 in a variety of ways according to different parameters whose values can be set or selectively programmed, e.g., by the microcontroller 105 writing the values as data in respective register memory locations (e.g., within the registers 126). Moreover, the electronic fuse 110 may communicate to the microcontroller 105 (e.g., via the communication interface 107) a variety of status/conditions related to the electronic fuse 110 and/or to the external power MOSFET, or physical parameter values that the electronic fuse 110 may measure by writing all the data representing that information in respective registers memory location such that the microcontroller 105 can read and so acquire them for monitoring purpose and subsequent decision making process and/or actuation.

Yet another feature of some embodiments includes the low current bypass path, which in some embodiments may be an alternative current path (internal through the electronic fuse 110) that includes an internal "small" MOS (e.g., the low current bypass transistor M1) to provide a current to the load when the load calls for or otherwise utilizes a very low level of current. In this condition, the main external power MOSFET is switched off. The activation of the low current bypass circuitry is advantageous in terms of overall power consumption (i.e., reduces power consumption) as compared to the situation where the external power MOSFET (as well as the additional circuitry to drive the external power MOSFET) are utilized to supply the same low current.

In some embodiments, the electronic fuse 110 may be switched to the active mode (from the Stand-by On mode) and the external power MOSFET may be switched on autonomously by the electronic fuse 110 itself without the intervention of the outside microcontroller in the event that the load starts to sink a high level of current that cannot or otherwise is desired not to be provided by the small internal MOS, this event being captured by the electronic fuse 110 detecting that the voltage across the drain and source terminals of the internal "small" MOS M1 exceeds a threshold.

Another feature of some embodiments includes the desaturation shut-down of the external MOSFET, e.g., by the external MOSFET desaturation sensing subsystem 120 as previously described herein.

Further features include the self-testing circuitry, such as the self-test circuitry 113 of the current sensing subsystem 112 and the self-test circuitry 240 of the desaturation sensing subsystem 120 as described herein.

Moreover, embodiments of the present disclosure may include the hard-short latch-off circuitry 170, which may be included in the overcurrent protection I2t subsystem 152. In case the sensed value of the current Icable exceeds a threshold value Ths, this event immediately triggers the command to the gate driver to turn off the external power MOSFET, causing the interruption of the current flow.

FIGS. 21-24 and the corresponding description illustrate components, circuits, systems, and processes that may be incorporated within or utilized by the low current bypass subsystem 118, in some embodiments.

Figure 21:
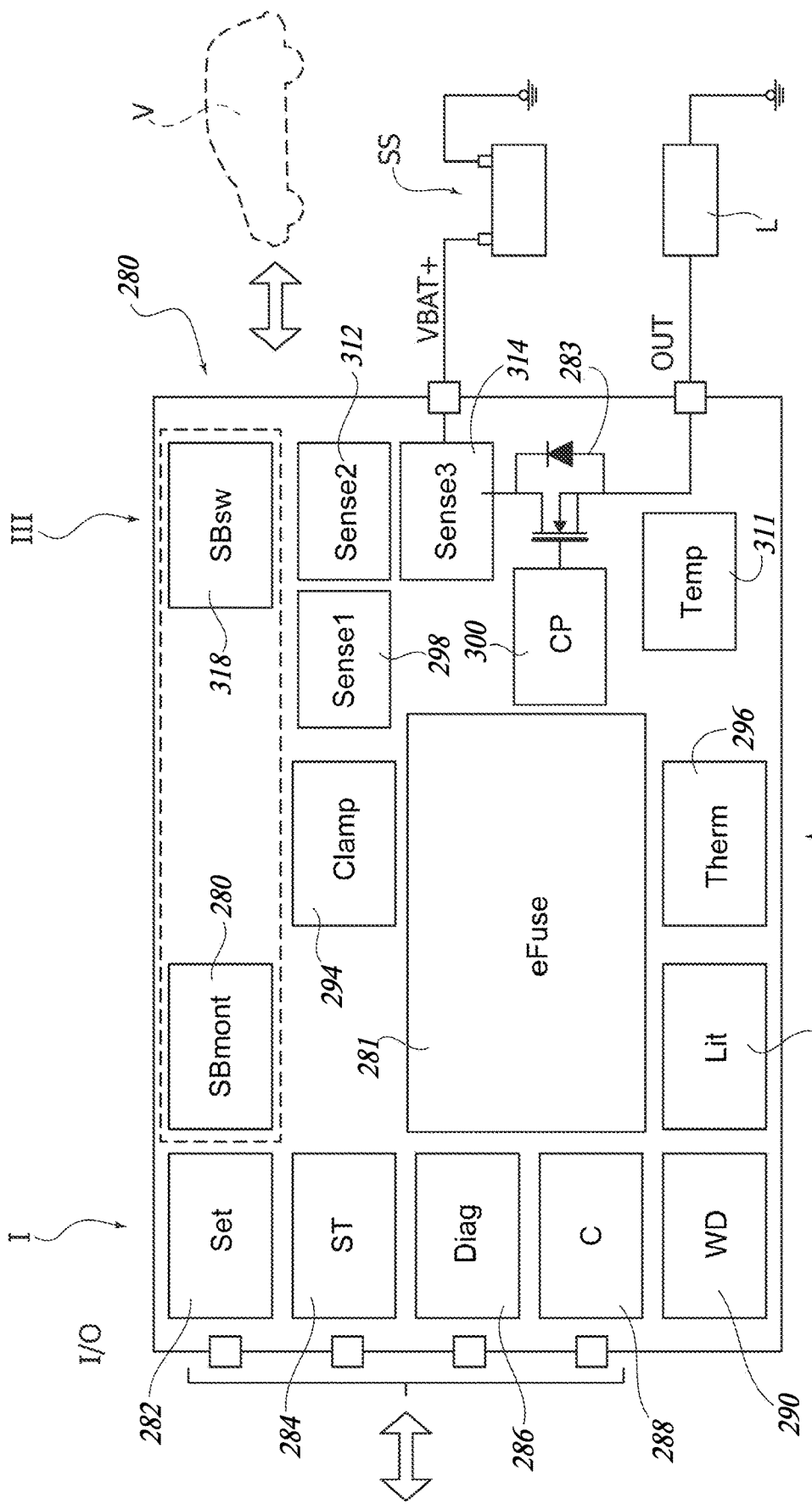
FIG. 21 is a functional block diagram of a system which may employ a current absorption management circuit, accordance with one or more embodiments.
Figure 22:
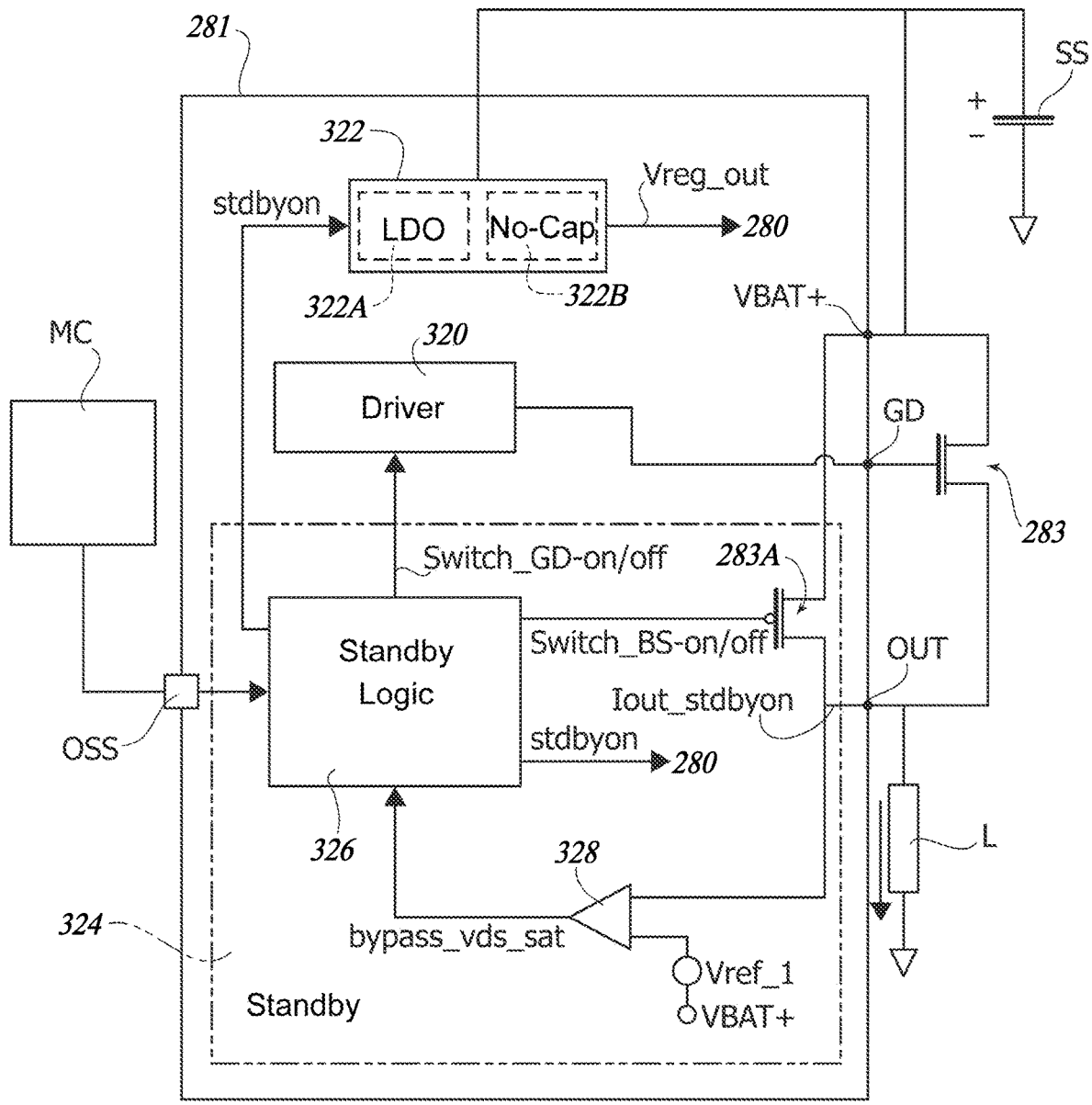
FIG. 22 is a block diagram of a circuit, in accordance with one or more embodiments.

FIG. 22 is a functional block diagram, in accordance with some embodiments. The functional block diagram of FIG. 21 is generally illustrative of a system 280 which employs an "intelligent" current absorption management circuit 281. The current absorption management system may correspond to an eFuse. A system 280 as illustrated in FIG. 21 is configured to controllably supply to an electrical load L energy drawn from a supply source SS. In the (purely illustrative) representation of FIG. 21, the supply source SS is provided by a battery as may be the case of a system 280 equipping a vehicle V. It will be appreciated that both the source SS and the load L may be distinct elements from the embodiments, and the system 280 may be utilized to be coupled to the supply source SS (at a node VBAT+) and to the load L (at a node OUT) only when the system is installed and configured for operation.

As illustrated in FIG. 21, electrical supply of the load L is controlled via a (power) 283. A power MOS transistor (power MOSFET) may be exemplary of such a switch, such a device being capable of conducting a relatively high current between source and drain. For simplicity and ease of explanation, the 283 is represented in FIG. 21 as an integral part of the system 280. The 283 may however be a distinct element from the embodiments.

As otherwise conventional in the art, a system 280 as illustrated in the functional block diagram of FIG. 21 may include a wide palette of functionalities. As illustrated in FIG. 21, these functionalities may be arranged in: a first section I, which includes system and safety-related functions co-operating with an I/O interface (on the left-hand side of FIG. 21) such as, for instance, parameter setting (Set) 282, self-test (ST) 284, diagnostic (Diag) 286, control (C) 288, watchdog (WD) 290 and limp-home (LH) 292 functionalities; a second section II, which includes power MOSFET protections such as, for instance, back electro-motive force (BEMF) clamping (Clamp) 294 and thermal protection (Therm) 296 functionalities; and a third section III, which includes power MOSFET gate driver and sensor functionalities such as, for instance, output voltage sensing (Sense1) 298, charge pump (CP) 300, junction temperature sensing (Temp) 311, supply voltage (VBAT+) sensing (Sense2) 312 and current sensing (Sense3) 314 functionalities.

Embodiments as exemplified herein are primarily concerned with possible interplay of the functionality 281 with the other functionalities in the architecture, for instance with the power 283 and the current sensing functionality 314. This may occur, for instance, via standby monitoring (SBmont) and standby switch (SBsw) functionalities as generally represented by blocks 316 and 318 in FIG. 21 and suited to be implemented as exemplified in FIGS. 2 and 3. For that reason, various possible implementation options of the functional architecture of FIG. 21 will now be discussed by placing emphasis on co-operation of the functionality 281 with the other functionalities in the architecture with the power 283. To that effect, the power 283 is shown having a current path therethrough (source-drain in the case of a field-effect transistor such as a MOSFET transistor) coupled between the supply source SS (at a node VBAT+) and the load L (at a node OUT). As noted, the load L can be notionally any kind of electrical load; the embodiments are thus largely "transparent" to the nature and characteristics of the load L.

By way of general reference, two types of implementation options will be discussed in connection with FIGS. 22 to 24 as exemplary of possible variants where: the power 283 may be external to (and thus distinct from) the circuit 281, in contrast to the representation of FIG. 21, where the 283 is included in the circuit 281, and/or the circuit 281 can switch to a low-current consumption state (ON standby state) where a small current is delivered to the load, either in response to a command from an external controller (a microcontroller or μC, for instance, as discussed in connection with FIG. 22) or as a result of automatic enablement of that state in the absence of an external command (as discussed in connection with FIG. 24). As noted, for the sake of simplicity and ease of explanation, unless indicated otherwise, throughout the figures like parts or elements are indicated with like reference symbols and a corresponding description will not be repeated for each and every figure for brevity.

Also, features and details discussed in connection with one implementation option can be applied, singly or in combination, in another implementation option. That is, a feature or detail being here illustrated, singly or in combination, within the framework of one implementation option shall not be construed as an indication that such a feature or detail can be used exclusively in the implementation option where the features or detail is illustrated herein.

In FIG. 22, a current absorption management circuit 281 is illustrated coupled to a supply source SS (at a node VBAT+) and to a load L (at a node OUT) in order to control current supply to the load L via a power 283. The current path through the power 283 (source-drain in the case of a field-effect transistor such as a MOSFET transistor) is thus coupled between the supply source SS and the load L, so that load energization, that is current flow through the load, is: facilitated (permitted) in response to the 283 being turned ON, namely made conductive, and countered (prevented) in response to the 283 being turned OFF, namely made non-conductive.

The power 283 can be alternatively switched on (that is, made conductive) and off (that is, made non-conductive) via a drive signal produced by a driver 320 and applied via a node GD to the control node (gate, in the case of a field-effect transistor such as a MOSFET transistor) of the power 283. Reference 322 indicates a voltage regulator coupled to the supply source SS and configured (in a manner known per se to those of skill in the art) to provide a regulated supply voltage Vreg_out to the other parts of the device 280 as illustrated in the functional block diagram of FIG. 21. As discussed in the following, the voltage regulator may comprise a high-power section 322A (LDO, for instance) and a low-power section 322B (a no-cap pre-regulator, for instance). Reference 324 denotes as a whole a part (subsystem) of the circuit 281 devoted to managing a standby state of the circuit 281 as discussed in the following. This may occur in response to a standby signal received at an input node OSS from a controller MC (a microcontroller or μC, for instance). As illustrated, the controller MC may be an external controller, distinct from the circuit 281.

As illustrated in FIG. 22, the subsystem 324 comprises active standby logic circuitry 326 sensitive to a signal received at the node OSS from the controller MC as well as to a wake-up signal bypass_vds_sat from a comparator 328 which compares with a reference (voltage) threshold Vref_1 a signal which indicates the intensity of the current flowing into the load L at the node OUT and which, as discussed in the following, can be used to facilitate (quick) re-activation of the main 283 to a conductive state. Such a re-activation signal may be obtained (in a manner known per se to those of skill in the art) via a current sensing functionality such as 314 in FIG. 21.

As illustrated herein, such a re-activation signal may be simply obtained as a result of a feedback action based on the value of the voltage at the node OUT compared in a comparator 328 with a (possibly adjustable) threshold Vref_1 referred to the supply voltage VBAT+. The voltage at the node OUT (and thus the voltage drop between the voltage at the node VBAT+ and the voltage at the node OUT) can be reasonably assumed to be a function of the output current. In fact, an electronic switch in a conductive state can be regarded as a resistor having a resistance value, such as RDSon in the case of a field-effect transistor such as a MOSFET transistor. Consequently, a signal adapted to be supplied to the comparator 328 for comparison with the threshold Vref_1 can be simply obtained by monitoring the voltage at the node OUT.

In one or more embodiments, a secondary bypass 283A such as a (low-power) MOSFET transistor (p-channel for instance) may be coupled across the nodes VBAT+ and OUT thus having the current path therethrough (source-drain in the case of a field-effect transistor such as a MOSFET transistor) coupled between the supply source SS and the load L. The 283A device being capable of conducting a relatively low current between source and drain (i.e., substantially lower than the high current capability of the power 283). Stated otherwise, the re-activation signal may be simply obtained as a result of a feedback action based on the value of the voltage at the node OUT, that is by monitoring the (source-drain) voltage drop across the secondary bypass 283A.

As illustrated in FIG. 22 the logic circuitry 326 is configured to produce: a first signal Switch_GD-on/off which is applied (via the driver circuit 320) to the control node (gate, in the case of a field-effect transistor such as a MOSFET transistor) of the power 283 to turn it alternatively on (conductive) and off (non-conductive), a second signal Switch_BS-on/off which is applied to the control node (gate, in the case of a field-effect transistor such as a MOSFET transistor) of the secondary 283A to turn it alternatively on (conductive) and off (non-conductive), a third signal stdbyon which is distributed to the other parts of the device 280 as illustrated in the functional block diagram of FIG. 21 (supply of the signal stdbyon to the voltage regulator 322 is explicitly represented in the upper portion of FIG. 22).

A possible sequence of operation of the circuit 281 may contemplate an ON active-standby state. This may be in addition to the conventional ON and OFF states of an electronic fuse, that is: an ON state (see also block 330 in the flow-chart of FIG. 23, discussed in the following), during which the load L (fully) energized with the load L coupled to the supply source SS through the 283 made conductive (with the 283A non-conductive), and an OFF state (see also block 330A in the flow-chart of FIG. 23), during which the 283 de-couples the load L from the supply source SS as a result of the 283 (as well as the 283A) being made non-conductive; such an OFF state may be entered into in response to an overcurrent event as detected at 314 in FIG. 21, for instance.

Operation of a device 280 as illustrated in FIG. 21 in those two ON and OFF states (see blocks 330 and 330A in the flow-chart of FIG. 23) is conventional in the art, which makes it unnecessary to provide a more detailed description herein. Also, it will be again recalled that application to an electronic fuse is considered herein merely by way of non-limiting example. The embodiments are not linked by way of necessity to being applied in electronic fuses in so far as an ON active-standby state may be advantageous in various devices where it is desired that a small current may still flow to a load such as L while the overall current consumption of the circuit 281 is very low (less than 50 µA, for instance, thus improving battery lifetime). The capability of switching to a (full) ON state with the power 283 turned quickly on (within 50-100 µs since a normal load current is requested, for instance) is likewise desirable.

Figure 23:
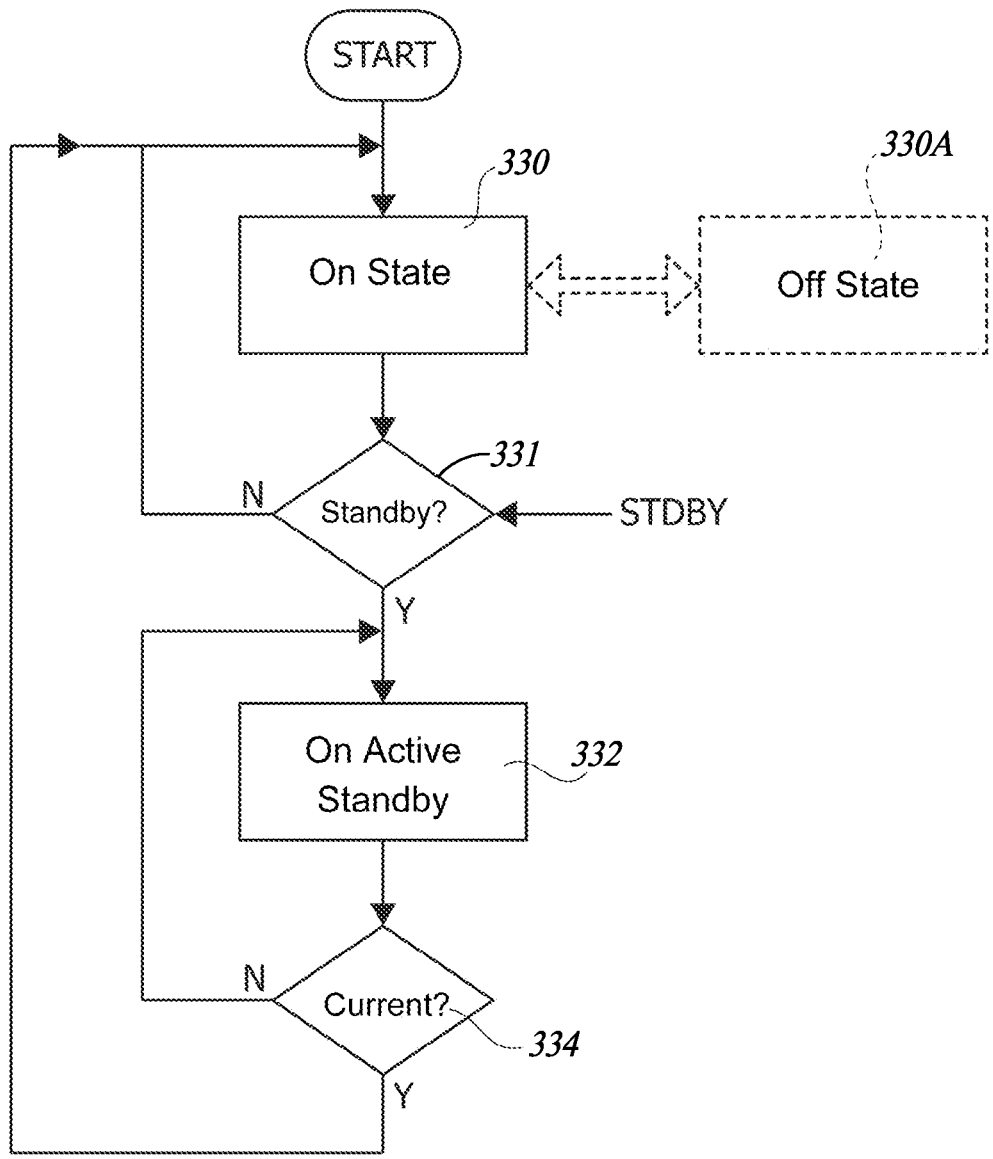
FIG. 23 is a flow-chart, in accordance with one or more embodiments.

Operation of an implementation option as illustrated in FIG. 22 is exemplified in the flowchart of FIG. 23 assuming that after START the circuit 281 is in the (full) ON state as exemplified by block 330. As noted, the 283 may be turned off (made non-conductive—OFF state 330A) in order to de-couple the load L from the supply source SS in response to an overcurrent event in eFuse operation. As noted, this is conventional in the art (which makes it unnecessary to provide a more detailed description herein) and likewise not mandatory for the embodiments. Switching to the low-power-consumption ON active-standby state may be prompted by the occurrence of a triggering action as exemplified at STDBY. This may be indicated by a positive outcome Y of a check at block 331; in the presence of a negative outcome N the circuit simply loops back upstream thus maintaining the (full) ON state. The triggering action exemplified at STDBY may involve the input node OSS being asserted (brought high, for instance) for a minimum time by the controller MC, while the circuit 281 is in the ON state, with the 283 conductive and the load L energized by the supply source SS. The input node OSS being asserted may be recognized by the device 281 as a command to enable the ON active-standby state. This command may be validated, for instance, as a result of the input node OSS being pulled-down, that is, brought to a low level.

In response to entering the ON active-standby state (as exemplified by block 332 in FIG. 23), the logic circuitry 326 may: on the one hand, disable the main 283 via the driver 320 (signal Switch_GD-on/off indicating an off condition desired where the supply source SS is no longer coupled to the load L via the 283), and on the other hand, enable the secondary 283A to maintain a reduced current supply (350 mA-500 mA, for instance) to the load L. During the ON active-standby state, if the current supplied to the load L exceeds a threshold Iout_stdbyon (500 mA @ VBAT+=13V, T=25° C., for instance)—which corresponds to a positive outcome Y of a check exemplified by block 334 in FIG. 23—the logic circuitry 326 may switch back to the (full) ON state by: on the one hand, re-enabling the main 283 via the driver 320 (signal Switch_GD-on/off indicating an on condition desired), which can occur very rapidly; on the other hand, disabling the secondary 283A.

In the presence of a negative outcome N of the check represented by block 334, the circuit simply loops back upstream thus maintaining the ON active-standby state. The related information on the intensity of the current supplied to the load L can be provided to the logic circuitry 326 via the comparator 328 in response to the comparison therein indicating that intensity of the current through the load L (indicated, for instance, by the re-activation signal which—as discussed in the foregoing—can be obtained as a result of a feedback action based on the voltage at the node OUT) has increased up to an intensity threshold as represented by Vref_1. For instance, the circuit 281 can be configured so that if, during the ON active-standby state with, e.g., Iout<350 mA any pin (with possible exceptions as represented, for instance, by the OSS node) is pulled up, the device 280 will go back to the (full) ON state, re-activating the power 283 and de-activating the secondary 283A.

Of course, the quantitative figures given herein are merely exemplary and non-limiting of the embodiments. The signal stdbyon (which is indicative of the ON active-standby state being enabled and is distributed by the logic circuitry to the other parts of the device 280) can be exploited in the voltage regulator 322 to selectively enable: the high-power (and higher consumption) regulator 322A, such as a low dropout (LDO) regulator, during the (full) ON state with the power 283 turned on and the secondary 283A turned off; or a low-power (and low-consumption) voltage pre-regulator 322B, during the ON active-standby state with the power 283 turned off and the secondary 283A turned on.

More generally, as represented in FIG. 22 by the signal stdbyon from the logic circuitry 326 distributed to the various other functionalities in the architecture 280 of FIG. 21, a current absorption management circuit as illustrated herein facilitates switching to a low-consumption state (notionally turning-off) these functionalities, thus dramatically reducing energy absorption. This advantageously facilitates further reducing energy absorption from the supply source SS during the ON active-standby state. Also, waking-up from such a low-consumption state to a full operating state may take place quickly, with no appreciable discontinuities for the load L and the system as a whole. In FIG. 24, unless the context indicates otherwise, parts or elements like parts or elements already discussed in connection with the previous figures are indicated with like reference symbols, so that a corresponding description will not be repeated for brevity.

Figure 24:
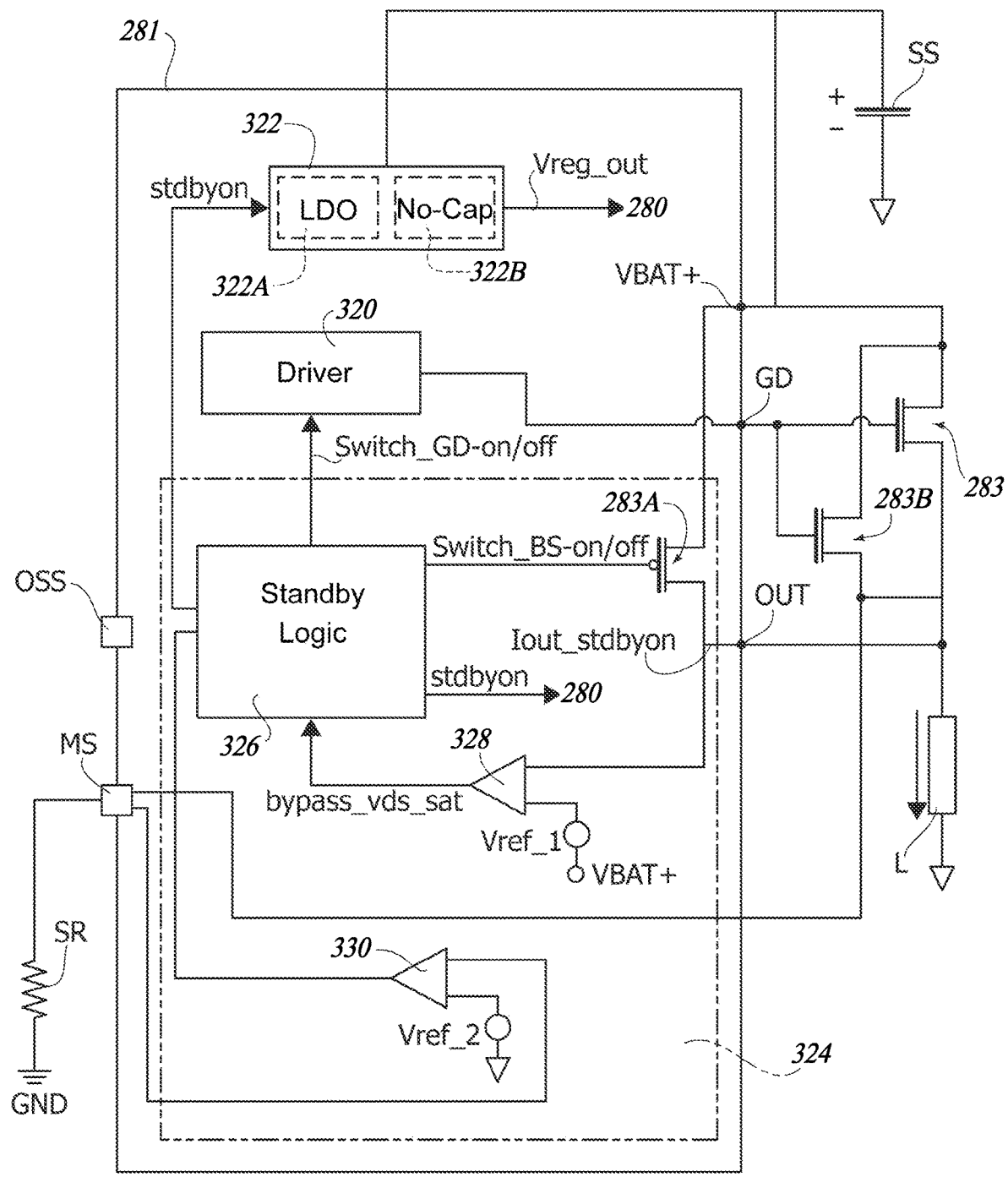
FIG. 24 is a block diagram of a circuit, in accordance with one or more embodiments.

FIG. 24 is exemplary of an implementation where the triggering action as exemplified at STDBY in the flowchart of FIG. 23 may result from a sensing action of the current through the load L with a command provided by an external controller MC no longer involved. In a circuit 281 as illustrated in FIG. 24, a sensing transistor 283B (a MOSFET transistor, for instance) is provided having the current path therethrough (source-drain in the case of a field-effect transistor such as a MOSFET transistor, for instance) coupled across the nodes VBAT+ and OUT and the control node (gate, in the case of a field-effect transistor such as a MOSFET transistor, for instance) coupled to the control node GD (again gate, in the case of a field-effect transistor such as a MOSFET transistor) of the power 283.

The current (feedback) path through the sensing transistor 283B is also coupled to a (multi)sensing node MS configured to be coupled to ground GND, optionally via an (e.g., external) sensing resistor SR. Reference 335 denotes in FIG. 24 a further comparator which compares the (e.g., voltage) signal at the node MS with a further (possibly adjustable) threshold Vref_2 referenced to ground. The output signal from the comparator 335 is applied to the logic circuitry 326. During the (full) ON state, a device as illustrated in FIG. 24 will be able to detect (via the feedback current sensing network 283B, SR which supplies the comparator 335 with the signal compared with the threshold Vref_2) a condition where the current through the main 283, and thus through the load L, has decreased reaching a lower threshold value as defined by Vref_2 (250 mA @ VBAT=+13V, T=25° C., for instance).

In some embodiments, the sensing network 283B, SR may be configured to operate with a very low current density and the resistance SR can be accordingly chosen (a resistance value of 420 KOhm was found to be a sensible choice) to generate Vms=4,15V @Iout=250 mA. Here again, these quantitative figures are merely exemplary and non-limiting of the embodiments. When such detection occurs (see STDBY in FIG. 23), the circuit will automatically enter the ON active stand-by state as represented by block 332 in the flow-chart of FIG. 23 after a fixed time (about 150 µs, for instance).

Here again, during the ON active-standby state, if the current supplied to the load L exceeds a threshold Iout_stdbyon (500 mA @ VBAT+=13V, T=25° C., for instance) as indicated by a positive outcome Y of the check represented by block 334, the logic circuitry 326 may switch back to the (full) ON state. In the presence of a negative outcome N of the check represented by block 334, the circuit simply loops back upstream thus maintaining the ON active-standby state.

In the case exemplified in FIG. 24, the related information on the intensity of the current supplied to the load L can be provided to the logic circuitry 326 via the comparator 328 as discussed previously in connection with FIG. 22, namely as a result of a feedback action based on the voltage at the node OUT. Here again, the circuit 281 can be configured so that if, during the ON active-standby state with, e.g., Iout<350 mA, any pin (with possible exceptions as represented, for instance, by the OSS node) is pulled up, the device 280 will go back to the (full) ON state, re-activating the power 283 and de-activating the secondary 283A.

In some embodiments, the signal stdbyon which is indicative of the ON active-standby state being enabled and is distributed by the logic circuitry to the other parts of the device 280 may be exploited in the voltage regulator 322 to selectively enable: a high-power (and higher consumption) regulator 322A, such as a low dropout (LDO) regulator, activatable during the (full) ON state with the power 283 turned on and the secondary 283A turned off; or a low-power (and low-consumption) voltage pre-regulator 322B, activatable during the ON active-standby state with the power 283 turned off and the secondary 283A turned on.

More generally, as represented also in FIG. 24 by the signal stdbyon from the logic circuitry 326 distributed to the various other functionalities in the architecture 280 of FIG. 21, a current absorption management circuit as illustrated herein facilitates switching to a low-consumption state (notionally turning-off) these functionalities, thus dramatically reducing energy absorption. This advantageously facilitates further reducing energy absorption from the supply source SS during the ON active-standby state. Also, waking-up from such a low-consumption state to a full operating state may take place quickly, with no appreciable discontinuities for the load L and the system as a whole.

In some embodiments, a circuit as exemplified herein (for instance, 281) may include: a first node (for instance, VBAT+) and a second node (for instance, OUT) configured to be coupled (respectively) to an electrical supply source (for instance, SS) and to an electrical load (for instance, L) configured to be supplied by the electrical supply source (for instance, SS) via an electronic switch (for instance, 283) having a control node; and a third node (for instance, GD) configured to be coupled to the control node of the electronic switch to switch the electronic switch between a conductive state (for instance, 330), wherein the electrical load is coupled to the supply source via the electronic switch, and a non-conductive state (for instance, 330A, wherein the electrical load may not be coupled to the supply source via the electronic switch).

A circuit as exemplified herein may (further) comprise: a secondary electronic switch (for instance, 283A) intermediate the first node and the second node; control logic circuitry (for instance, 326) coupled to the third node and the secondary electronic switch to provide a first switch control signal (for instance, Switch_GD-on/off) applied (for instance, via 320) to the third node and a second switch control signal (for instance, Switch_BS-on/off) to the secondary electronic switch, the control logic circuitry (20) configured to provide the first switch control signal and the second switch control signal, alternately: in a first mode of operation (for instance, 330), wherein the first switch control signal drives the electronic switch to the conductive state and the second switch control signal drives the secondary electronic switch to a non-conductive state; and in a second mode of operation (for instance, 332), wherein the first switch control signal drives the electronic switch to the non-conductive state and the second switch control signal drives the secondary electronic switch to a conductive state, wherein the electrical load is coupled to the supply source via the secondary electronic switch.

In some embodiments, the circuit may include a fourth node (for instance, OSS) configured to receive a standby signal (for instance, MC), wherein the circuit control logic circuitry is configured to switch to the second mode of operation (from the first mode of operation, for instance) in response to the standby signal received (for instance, 331) at the fourth node. In some embodiments, the circuit may include current sensing circuitry (for instance, 283B, SR, 335) configured to sense the intensity of the current flowing through the electrical load, the current sensing circuitry coupled to the control logic circuitry, wherein the control logic circuitry is configured to switch from the first mode of operation to the second mode of operation in response to the current flowing through the electrical load dropping to a lower threshold (for instance, Vref_2).

In some embodiments, the current sensing circuitry may comprise a sensing transistor (for instance, 283B) having a control node coupled to the third node and a current path therethrough included in a current feedback line from the first node (for instance, VBAT+) to a further node (for instance, MS) configured to be coupled to ground, preferably via a resistor (for instance, SR). In some embodiments, the circuit may include current sensing circuitry (for instance 328 and 283A) sensitive to the intensity of the current flowing through the electrical load, the current sensing circuitry coupled to the control logic circuitry, wherein the control logic circuitry is configured to switch from the second mode of operation to the first mode of operation in response to the current flowing through the electrical load increasing to an upper threshold (as determined, for instance, by Vref_1). In some embodiments, the circuit may include supply regulator circuitry (for instance, 322) having a first supply regulator section (for instance, 322A) and a second supply regulator section (for instance, 322B), the second supply regulator section having lower energy absorption than the first supply regulator section, wherein the control logic circuitry is coupled (for instance, stdbyon) to the supply regulator circuitry and configured to enable the first supply regulator section during the first mode of operation and the second supply regulator section during the second mode of operation.

In some embodiments, the secondary electronic switch (for instance, 283A) may comprise a low-power electronic switch. An electronic switch such a MOSFET transistor having a RDSon resistance (at full VGS) of about 281 Ohm may be exemplary of such a low-power switch. A circuit as exemplified herein may include the electronic switch having a control node (as assumed in FIG. 21, for instance), and the secondary electronic switch may comprise a low-power electronic switch configured to be traversed during conduction by a current of lower intensity than the current traversing the electronic switch during conduction.

A system as exemplified herein (a power distribution system for use in the automotive sector, for instance) may comprise: an electrical supply source (for instance, SS); an electrical load (for instance, L); an electronic switch (for instance, 283) having a control node to switch the electronic switch between a conductive state, wherein the electrical load is coupled to the supply source via the electronic switch, and a non-conductive state (wherein the electrical load is not coupled to the supply source via the electronic switch); and a circuit (for instance, 281, with the 283 being a distinct component from the circuit—as illustrated in FIGS. 22 and 24, or included in the circuit as assumed in FIG. 21) as exemplified herein wherein the first node (for instance, VBAT+) is coupled to the electrical supply source (for instance, SS), the second node (for instance, OUT) is coupled to the electrical load (for instance, L) and the third node (for instance, GD) is coupled to the control node of the electronic switch (for instance, 283).

In some embodiments, the system may include energy absorbing circuitry (see, for instance, the functionalities I, II, III in the system 280 FIG. 21) supplied by the supply source (for instance, SS), the energy absorbing circuitry settable to a low-energy absorption mode in response to the control logic circuitry (for instance, 326) in the circuit (for instance, 281) being actuated in the second mode of operation (for instance 332, with the signal stdbyon distributed to the functionalities I, II, III in the system 280 in FIG. 21).

A method of operating a circuit or a system as exemplified herein may include actuating the control logic circuitry (for instance, 326), alternately: in the first mode of operation (for instance, 330), wherein the first switch control signal (for instance, Switch_GD-on/off) drives the electronic switch (for instance, 283) to the conductive state and the second switch control signal (for instance, Switch_BS-on/off) drives the secondary electronic switch (for instance, 283A) to a non-conductive state; and in the second mode of operation (for instance, 332), wherein the first switch control signal (for instance, Switch_GD-on/off) drives the electronic switch (for instance, 283) to the non-conductive state and the second switch control signal (for instance, Switch_BS-on/off) drives the secondary electronic switch (for instance, 283A) to a conductive state, wherein the electrical load (for instance, L) is coupled to the supply source (for instance, SS) via the secondary electronic switch.

Figure 25A:
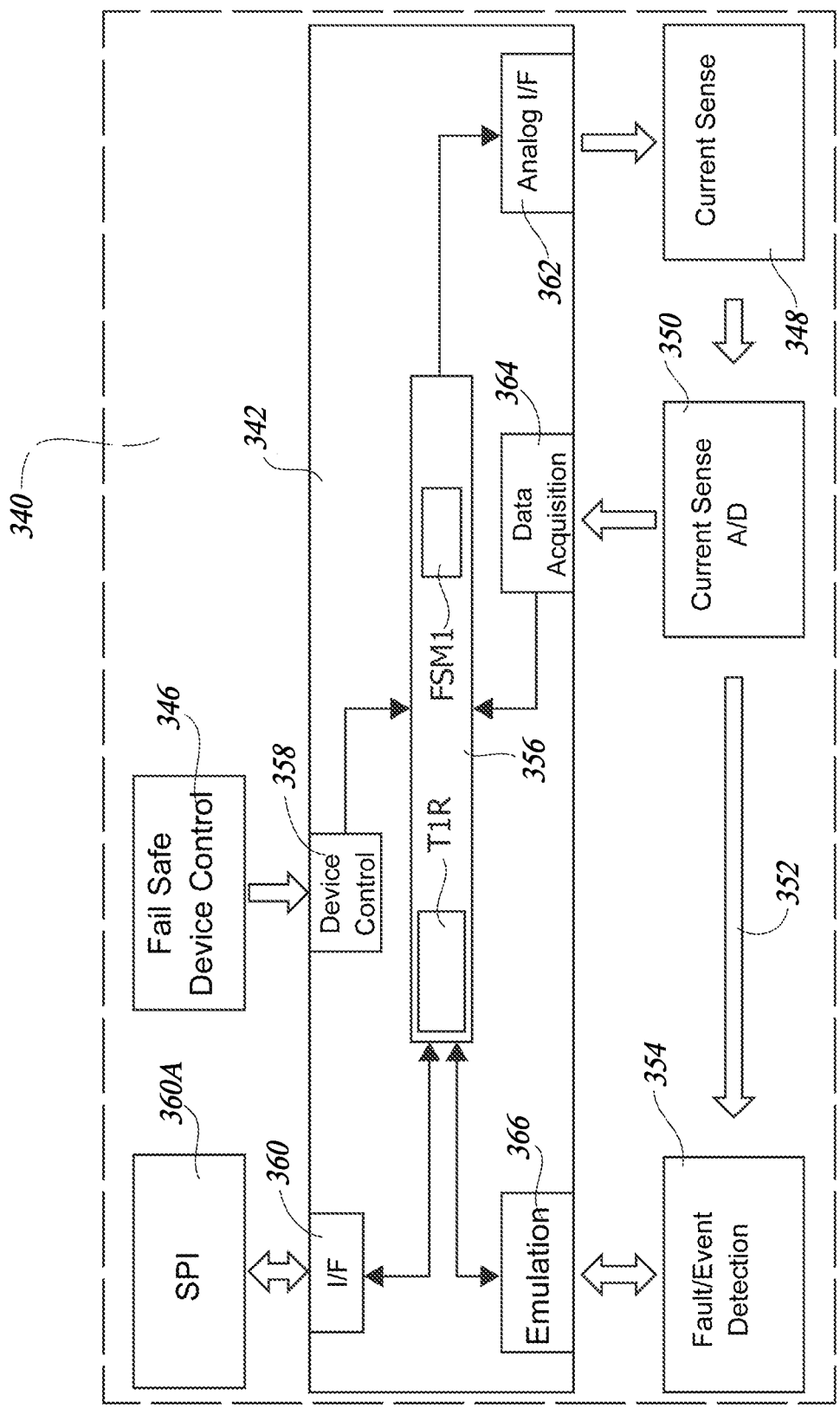
FIGS. 25A and 25B are functional block diagrams, in accordance with one or more embodiments.

FIG. 25A-29 includes components, circuits, systems, and process that can be utilized within or incorporated by any of the self-testing features or circuitry described herein, in some embodiments. FIGS. 25A and 25B are architectural views of the interaction between an (in application) selftest controller 342 and functionalities as available in mixed analog/digital electronic circuits that can be controlled or observed in order to implement monitor and diagnostic checks. Those of skill in the art will otherwise appreciate that certain ones of these functionalities may not be visible in the figures insofar as the instant detailed description relates primarily to functionalities discussed as exemplary of functionalities involved in self-test operation as discussed herein.

Figure 25B:
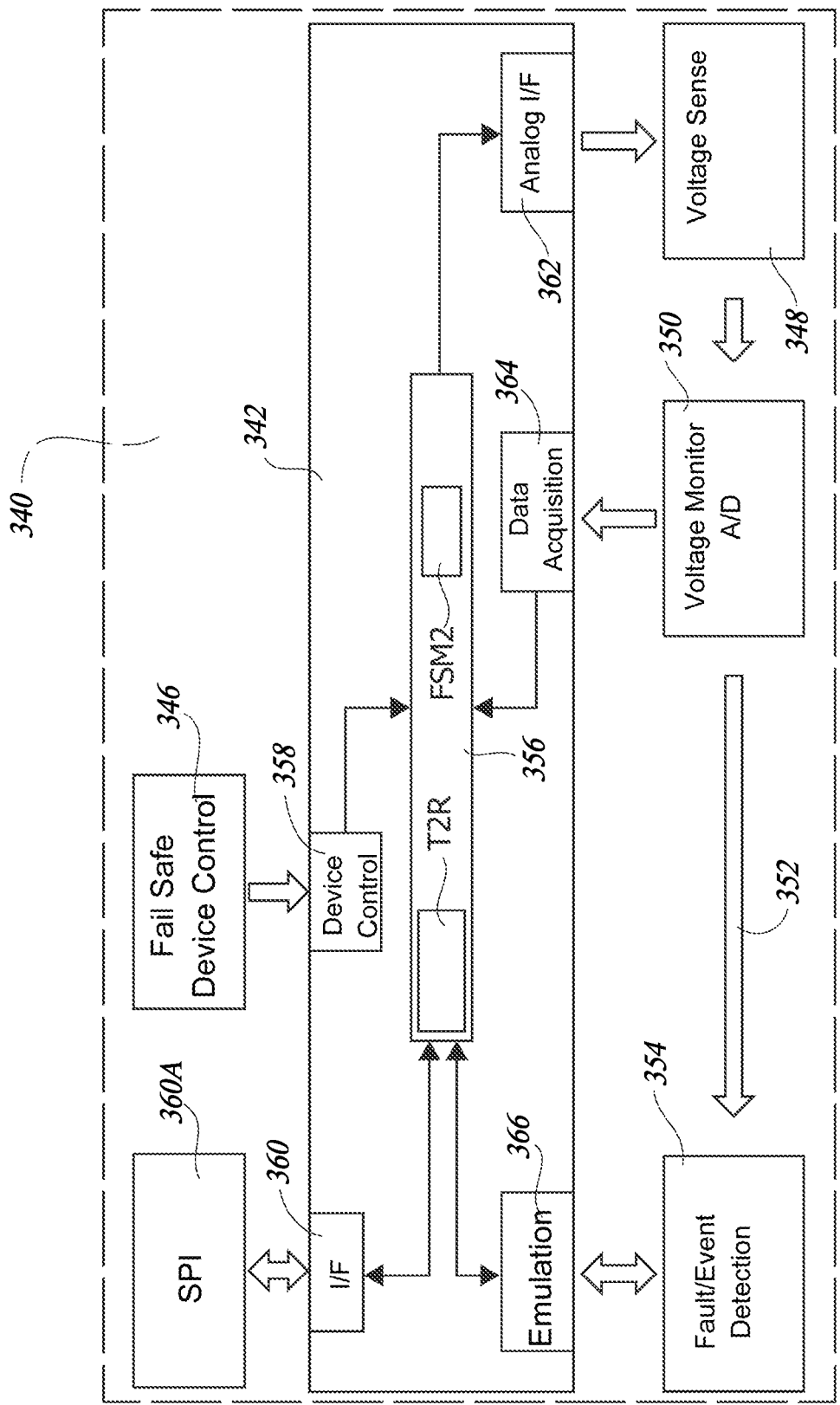

Functionalities as exemplified in FIGS. 25A and 25B can co-operate with a self-test controller such as 342 can be found in a wide variety of electronic devices. While possible application to an e-fuse (electronic fuse) will be discussed in the following by way of example, the embodiments are largely "transparent" to the nature and characteristics of the device 340. One or more embodiments as exemplified herein may include a configurable and programmable digital controller 342 (in-application self-test controller) capable of:

managing a set of control signals with the capability of forcing device configurations, acquisition ports for digitally converted values, data processing and fault/event emulation to execute real-time tests during normal operation of the device 340; and reacting to a possible failure detected, communicating with a host controller (for instance) and/or taking adequate actions for latency/critical situations or specific safety specifications.

In the diagrams of FIGS. 25A and 25B, a block 346 denotes fail-safe device control circuitry which is illustrated here as incorporated to the circuit 10 but may be arranged external to the circuit 10. The circuitry 346 is utilized to co-operate with a control interface 358 in the self-test controller 342 exchanging therewith signals such as, for instance, abort/stop control signals from the fail-safe control circuitry 346 to the self-test controller 342 (in order to control operation of the latter), and/or diagnostic/alarm control signals from the self-test controller 342 to the fail-safe device control circuitry 14 (in order to implement low-latency fail-safe protection mechanisms). Communication can be programmed as desired, for instance, via a programming interface (UF) 360 for host-controller communication in possible co-operation with a serial peripheral interface (SPI) 360A.

In one or more embodiments, the controller 342 may be configured to co-operate with a number of circuit elements or stages in the device including, for instance, an analog sensing stage 348, an analog-to-digital (A/D) conversion stage 350, and a fault/event detection stage 354 that form the functional backbone of the device 340. The diagrams of FIGS. 25A and 25B are exemplary of the flexibility of one or more embodiments in adapting to different devices 10 and different contexts of use. For instance, as exemplified in FIG. 25A, the analog sensing stage 348 may include a current sense circuit; the stage 350 may include a current sense analog-to-digital (A/D) converter. The fault/event detection stage 354 may include a hard short current (HSHT) and over-current (OVC) detection stage.

Conversely, as exemplified in FIG. 25B, the analog sensing stage 348 may include a voltage sense circuit, sensing the drain-to-source of a power field-effect transistor such as a power MOS, for instance. The stage 350 may include a voltage monitor analog-to-digital (A/D) converter; and the fault/event detection stage 354 may include a voltage monitor fault detection stage. The foregoing is also (further) exemplary of the fact that, as discussed previously, a device 340 as exemplified herein may include alternative/additional functionalities which are not visible in the figures for simplicity.

In one or more embodiments, the analog sensing stage 348 may be configured to co-operate with the controller 342 via an analog (configuration) interface (I/F) 362 in issuing control signals to arrange analog circuitry in the device 340 (not expressly visible in the figure) according to selected self-test configurations.

As illustrated in the foregoing, and as discussed by way of example in the following, in the case of an e-fuse, these self-test configurations may include multiple self-test selection options (whose execution may be managed sequentially via corresponding hardware) such as external short circuit fault detection chain monitoring; external power MOS saturation fault detection chain monitoring; and external power MOS stuck-on detection monitoring.

An A/D conversion stage 350 as illustrated herein may be configured for acquisition of digital converted measurements in the device 340 for data elaboration and/or checking. To that effect, data thus collected by the stage 350 can be transferred to the controller 342 via a data acquisition interface 364. As exemplified, a fault/event detection stage 354 as illustrated herein may be configured to cooperate with a fault/event emulation interface 366 in the controller 342 in setting configuration design parameters (thresholds and like, for instance) for fault/event generation and/or emulation. As illustrated, a datapath configuration feature (as schematically represented by 20) can be provided intermediate to the acquisition circuitry 350, 364 and the fault event detection circuitry 354, 366 in order to facilitate a plurality of digital processing datapath configurations for the test signals converted to digital.

Various suitable types of computation (for instance, differential or delta measurements on data acquisition) can be implemented in the self-test controller 342. In one or more embodiments, self-test configuration and execution can be programmed via a Serial Peripheral Interface (SPI) such as 360A. For instance, such an interface can be configured to exchange data between microcontrollers and small peripherals such as shift registers, sensors, and SD cards.

Figure 26:
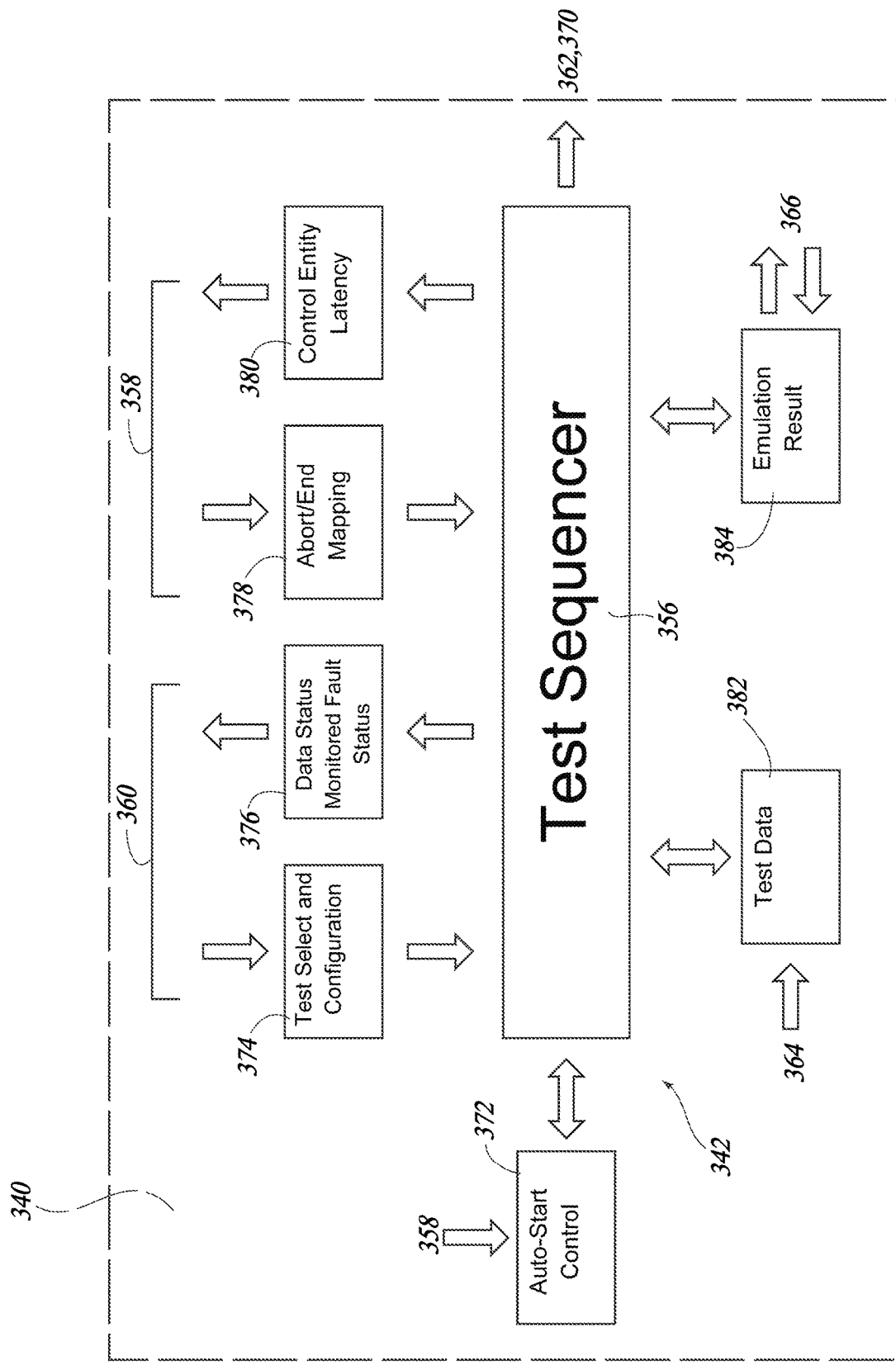
FIG. 26 is a functional block diagram, in accordance with one or more embodiments.

In one or more embodiments, dedicated registers and fields can be mapped within a device address space with the capability of reporting status for each self-test run. For instance, IDLE/RUN/END/ABORT test information may be made available to a host controller through registers mapped in device address space. The block diagram of FIG. 26 is an exemplary representation of a possible embodiment of a controller 342 as included in a device 340 as illustrated in FIGS. 25A and 25B. The main functionality of a controller 342 as illustrated herein may be represented by a test sequencer circuit (briefly, test sequencer) 356. The test sequencer 356 can be configured to control the execution of defined self-tests to be run, with other (internal) functionalities of the self-test controller 342 utilized to interact with the interfaces described previously in connection with FIGS. 25A and 25B.

By way of example, the block diagram of FIG. 26 shows the self-test controller functionality interacting with the device control interface 358 configured to receive and transfer to the test sequencer 356 Abort/End control signals from control sources (at 378) while issuing towards the device control entity latency critical control information (at 380). Similarly, the self-test controller functionality interacting with the programming interface 360 may be configured to receive, decode and transfer to the test sequencer 356 test selection and configuration data (at 374) while collecting into registers and transferring from test sequencer 356 data/status information and monitored fault checks for each executed self test (at 376).

The diagram of FIG. 26 is also exemplary of the device control interface 358 being configured to exchange with the test sequencer 356 auto-start control information at 372, for those cases or tests in which execution is started according to hardware conditions and not controlled by software through a programming interface such as 360, 374. As exemplified in FIG. 26, the self-test controller 342 can also be configured, according to the test under execution, to issue analog and datapath configuration control via the interface 362, to receive test data from digital datapath, via the interface 364, and elaborate/check the information received at 382 (for example, by performing delta measurements). In addition, the self-test controller 342 can be configured to manage the selection of a protection fault under test, by disabling the real fault flag of the device, to avoid false faults signaling, and by collecting the result of the emulation of fault/event detection under test via the interface 366 at 384.

Figure 27:
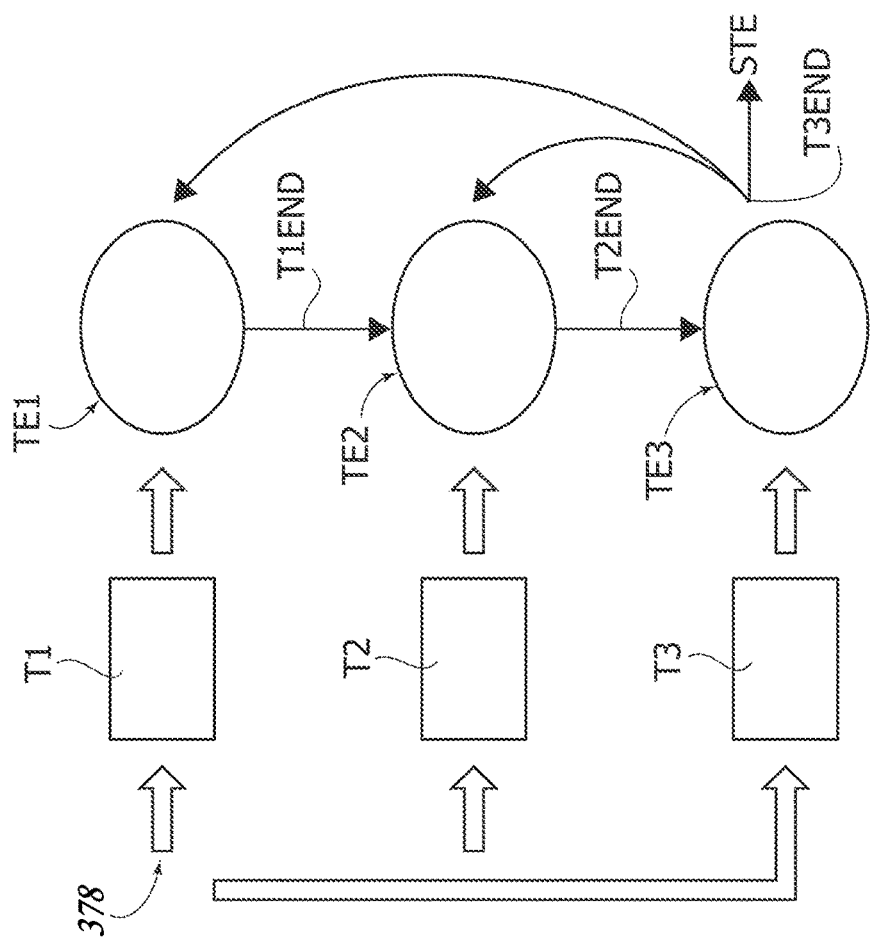
FIG. 27 is a diagram exemplary of possible operation of a test sequencer, in accordance with one or more embodiments.

FIG. 27 is exemplary of a possible solution which may be adopted in the test sequencer 356 in order to provide Abort/End mapping information for various tests starting from information as provided to the controller 342 at 378. FIGS. 25A and 25B as discussed in the foregoing are exemplary of circuits (stages) which may be involved in a self-test procedure in the case of current sensing (FIG. 25A) and in the case of voltage (Vds) monitoring (FIG. 25B). The test sequencer 356 in the self-test controller 342 can be configured to execute such a procedure via a dedicated finite state machine (FSM) for each of these two tests, namely FSM1, cooperating with "Test1" registers T1R in a first test (FIG. 25A), and FSM2, cooperating with "Test2" registers T2R in a second test (FIG. 25B).

FIG. 27 is exemplary of an embodiment of the test sequencer 356 configured to execute three tests, T1, T2, T3, with corresponding test enable signals TE1, TE2, TE3 derived from configuration selection information received at 374. Each test involves a respective finite state machine FSM1, FSM2, and FSM3, with the three FSMs linked together in order to be able to support both single (individual) test runs and sequences of tests (for instance sequences of two or three tests as exemplified herein). As exemplified in FIG. 27, the completion of execution of T1, controlled by FSM1, generates a signal T1END which, in response to being enabled by TE2, starts execution of test T2, controlled by FSM2; likewise, completion of test T2 by FSM2 generates a signal T2END which, in response to being enabled by TE3, starts of execution of T3 controlled by FSM3.

As exemplified in FIG. 27, the completion of the execution of last test (T3 by FSM3, for instance) generates a signal T3END to notify the preceding FSMs (here, FSM1 and FSM2) that the test sequence has been completed. In that way, each FSM can transition to its IDLE state (as discussed in the following in connection with FIG. 28), together with the generation of a self-test end signal STE that notifies the device 340 comprising the self-test controller 342 that the test sequence has been completed with corresponding data/status information available in related registers, accessible through the programming interface 360, 376, as depicted in FIG. 26.

FIG. 27 illustrates exemplary signals exchanged between the FSMs discussed previously and which facilitate starting and/or terminating execution of each self-test. For instance, in response to execution of FSM3 being terminated (T3END), a signal can be generated for FSM2 and FSM1 to complete execution thereof and/or transition to an IDLE state (STE), as discussed in connection with FIG. 28.

Figure 28:
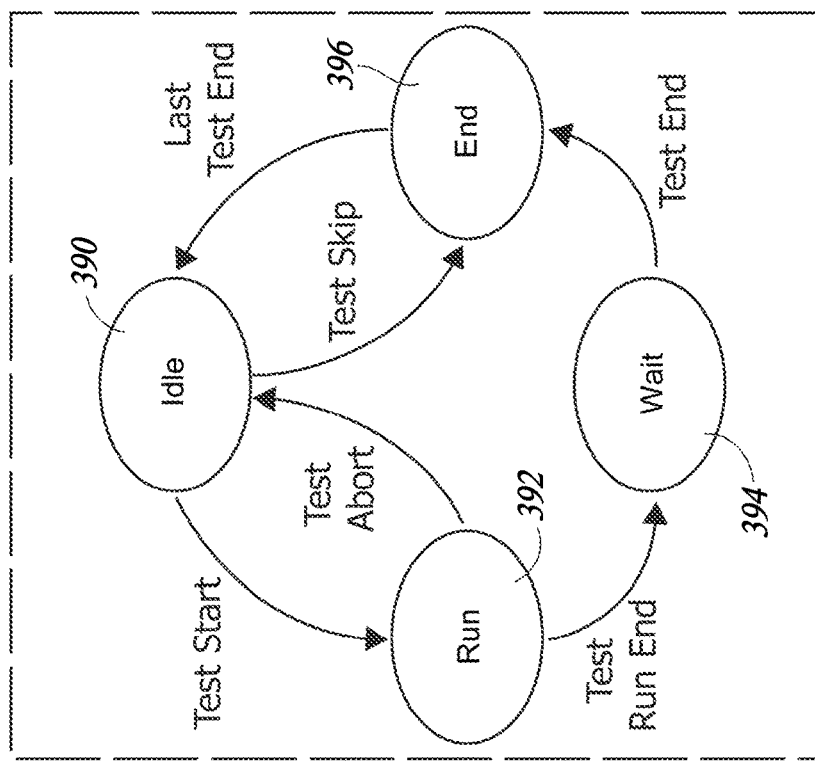
FIG. 28 is a graph exemplary of possible operation of a finite state machine (FSM), in accordance with one or more embodiments.

FIG. 28 is exemplary of a possible arrangement of a finite state machine configured to execute a certain test, that is FSM1 or FSM2 or FSM3 in FIG. 27, and including four states, namely: a self-test idle state at 390; a self-test run state at 392; a self-test wait state at 394; and a self-test end state 396. As exemplified in FIG. 28, the state of the FSM may transition from self-test idle at 390 to self-test run 392 in response to a Test Start signal with the possibility for the FSM to return from the self-test run state 392 to the self-test idle state in response to a Test Abort signal under the control of device fail-safe functionality, in order to stop (immediately) self-test execution. Transitions of the FSM from the self-test run state 392 to the self-test end state 396 via the self-test wait state 394 may result from a Test Run End signal and a Test End signal subsequently issued. A self-test wait state 394 is advantageously introduced to allow (analog) circuits under test to return to their normal configuration and operation after the self-test execution is completed and the specific circuit configuration needed to run the test has been removed.

Finally, transitioning from the self-test end state 396 back to the self-test idle state at 390 may be in response to a Last Test End signal with the possibility for the machine to transition from the selftest idle state 390 to the self-test end state 396 in response to a Test Skip signal received from the "last" FSM of the test sequencer 356, indicating the end of the execution of a programmed/configured self-test sequence. The transition from self-test idle state 390 to the self-test end state 396 in response to a Test Skip signal facilitates skipping the execution of a test in case this is not included in the test sequence as configured. By way of example, referring to FIG. 27, if the programmed self-test sequence comprises the execution of T1 and T3 (not T2), once T1 completed and the T2 FSM (notionally) enabled, assertion of the Test skip signal facilitates moving directly to the respective self-test end state 396 (without T2 being actually executed) enabling the FSM ofr T3 to start.

Figure 29:
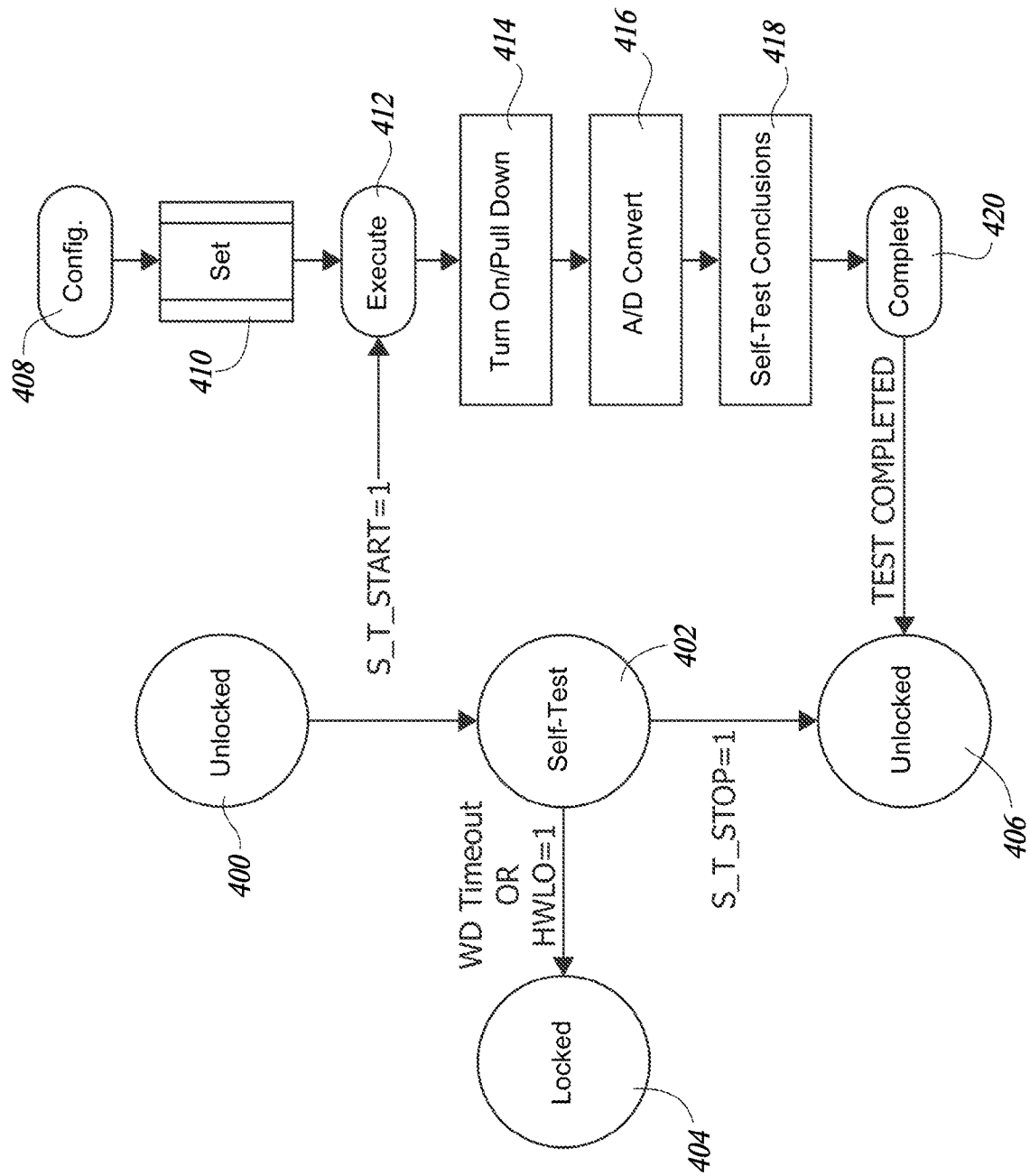
FIG. 29 is a combined graph/flowchart exemplary of performing tests, in accordance with one or more embodiments.

FIG. 29 is a mixed graph/flowchart representation exemplary of an embodiment applied to a device 340 embedding, by way of example, electronic fuse (e-fuse) functionalities. In the exemplary case discussed herein, such a device 340 is equipped with a self-test controller 342 as discussed in the foregoing. For instance, the device (electronic fuse) 10 can be configured to transition from an unlocked state 400 (normal operation) to a self-test state 402, in response to a corresponding (auto) start signal being asserted, for instance S_T_START=1 (see 358, 372 in FIG. 2, for instance). As exemplified in FIG. 29, permanence in the self-test state 402 is conditioned upon a watchdog (WD) for a possible expiration of a timeout interval and/or upon a hardware lockout condition (HWLO=1), both being examples of abort signals as previously mentioned coming from device failsafe control logic. This may result, for instance, in self-test sequence execution being aborted and in a correspondent transition of the device finite state machine from the self-test state 402 to a fail-safe state, a so called locked state 404 in the current example. Otherwise, as result of self-test completed, the system transitions back to an unlocked state 406. For instance, this may be in response to a stop signal S_T_STOP=1 being asserted (see again 358, 372 in FIG. 26, for instance) or in response to a stop signal S_T_STOP=1 being asserted from programming interface or device control (see 360-374 or 358-378 in FIG. 2).

The right-hand side of FIG. 29 is exemplary of a possible sequence of steps or acts performed by the self-test controller 342 after activation by the device 340 (e-fuse in this case) with corresponding device FSM control transitions (UNLOCKED⊓SELFTEST ⊓UNLOCKED). The step or act 408 is exemplary of a current sense self-test configuration for an e-fuse (considered herein as exemplary of the device 340) which leads to current sense self-test configuration parameters being set at 410, for instance CR#1 ⊔, S_T_CFG[2:0]=xx1 (x meaning a "don't care" bit), CR#2 ⊔OVC_THR=<user option>CR#3 ⊔ HSHT_THR=<user option>.

The first parameter CR#1 may be indicative of the selected self-test user wants to perform; in an embodiment, the least significant bit (S_T_CFG(0)) of a configuration word S_T_CFG[2:0] may select a current sense self-test execution. The two latter parameters CR#2 and CR#3 may be indicative of user-selected thresholds OVC_THR and HSHT_THR set for an over current (OVC_THR) fuse limit check or for a hard short current (HSHT_THR) limit check, in order to test proper behavior of current sense protections activation.

The block designated 412 is exemplary of current sense self-test being executed (in response to S_T_START=1 being asserted). The blocks 414, 416 and 418 illustrated in FIG. 29 are exemplary of various acts which may be implemented via the stages 348, 350 and 354 in the device 340 in co-operation with the self-test controller 342 in FIGS. 25A and 25B. Such acts may include: block 414—turn-on/pull-down a current generator in the efuse 10 to produce an (additional) voltage drop on a current sense amplifier input in accordance with a selected self-test configuration; block 416—analog-to-digital (A/D) conversions of current sense circuit measurements, according to 414, with optional differential measurements performed between self-test measures and, for instance, a last measurement performed before the device 340 enters a self-test state, available as stored in device status register, in order to check proper functionality of all current sense measurement circuit chain. Also, A/D conversions may be used in combination with OVC and HSHT threshold settings (CR#2 and CR#3) to verify if fault protection is activated in case the converted values exceed selected thresholds, thus covering with the selected self-test also the protection trigger. Self-test measurements of both differential conversion and protection fault emulation check results can be made available on status registers of the device 340; block 418—self-test conclusion with the current generator in the e-fuse turned off/pulled down to restore normal drop on the current sense amplifier inputs with current sense A/D conversion discontinued during these timeframe.

The blocks 414 and 416 may have a (joint) TS_T_ACTIVE time duration and the block 418 may have TS_T_WAIT time duration in order to have a self-controlled test duration and a safe transition from self-test configuration to normal operating mode configuration. During the TS_T_ACTIVE and TS_T_WAIT timeframes, Fast and Slow trip protections of the e-fuse corresponding to hard short (HSHT) and over current (OVC) conditions as discussed previously may be inhibited in order to allow their functional check, while avoiding to affect the device 340 (e-fuse, for instance), that continues to operate whilst all other protections are active. The block 420 in FIG. 29 is exemplary of the completion of a self-test procedure (current sense, for instance) with a TEST COMPLETED signal sent back to the device control (block 346 and interface 358 in FIGS. 25A and 25B) so that the device (e-fuse, for instance) can be returned to the unlocked state as exemplified by 406. As discussed, FIG. 29 is exemplary of application of embodiments to self-test configurations which are programmable through a serial peripheral interface (SPI) of the device with dedicated registers and fields mapped within device address space and multiple self-test configurations supported with execution managed sequentially via hardware.

The (purely exemplary) case considered refers to an electronic device 340 comprising an electronic fuse (e-fuse). Such a device 340 may include analog sensing circuitry (see block 348 in FIGS. 25A and 25B) configurable (via the interface 362) to a plurality of self-test configurations comprising, for instance: an external short circuit fault detection chain monitor; an external power MOS saturation fault detection chain monitor; and an external power MOS stuck-on detection monitor, with such an analog sensing circuitry capable of sensing respective (voltage and(or current) test signals occurring in the analog circuitry when set to those self-test configurations. Similarly, in the (purely exemplary) case considered herein, digital processing circuitry (of any known type to those of skill in the art for that purpose) may be provided in order to perform processing as desired on data acquisitions (for instance, differential or "delta" measure computation and/or comparison against certain thresholds).

It will be likewise assumed that status reporting for each self-test run as well as IDLE/RUN/END/ABORT test information is available to host controller through registers mapped in device address space. Table I and Table II below are exemplary of (purely indicative and non-limiting) values for control and status register bits and fields which may be adopted in order to control and monitor, via a programmable interface, self-test applications in a device 340 embedding a self-test controller 342 as discussed in the foregoing. Specifically, Table I is exemplary of a device control register view for self-test software configuration and control, with the columns in the table being indicative of: 1st column: bit position in control register dedicated to self-test; 2nd column: default value at reset; 3rd column: bit/field name; and 4th column: functional description according to the embodiment considered.

TABLE I

Device control register view

| Bit position | Default value at reset | Transition signal (Bit/field name) | Functional description |
|---|---|---|---|
| 9 | 0 | S_T_START | When set to 1. starts selected self-test If current state is Unlocked and S_T_GFC is not 0000, then setting this bit causes a transition to Self-Test state. This bit is automatically reset. |
| 8 | 0 | S_T_STOP | When set to 1, stops execution of selected self-test (when applicable). This bit is automatically reset |
| 7:5 | 000 | S_T_CFG | Self-test selection |
| | | | S_T_CFG    Self-test selected |
| | | | 000    No selection |
| | | | 001    Current sense |
| | | | 010    VDS Detection |
| | | | 100    Power Switch Stuck-on |
| | | | 011    Current Sense + VDS Detection |
| | | | 101    Current Sense + Power Switch Stuck-on |

TABLE I-continued

Device control register view

| Bit position | Default value at reset | Transition signal (Bit/field name) | Functional description |
|---|---|---|---|
| | | 110 | VDS Detection + Power Switch Stuck-on |
| | | 111 | Current Sense + VDS Detection + Power Switch Stuck-on |
| | | Others | Reserved |

Conversely, Table II is exemplary of a device status register view for self-test software configuration (current sense, for instance), with the columns in the table being indicative of: 1st column: bit position in device status register; 2nd column: default value at reset; 3rd column: bit/field register name; 4th column: functional description according to the embodiment discussed as example; 5th column: bit/field reset policy (per se not relevant for the embodiments).

TABLE II

Device status register view

| Bit position | Default value at reset | Transition signal (Bit/field name) | Functional description | |
|---|---|---|---|---|
| 14 | 0 | S_T_HSHT | This bit is set if HSHT_THR is reached during CURRENT SENSE self-test (Emulation of hard short fault, as result of comparison between self-test current sense A/D conversion and hard short threshold setting) | R/C |
| 13 | 0 | S_T_OVC | This bit is set if OVC_THR is reached during CURRENT SENSE self-test Emulation of over current protection fault, as result of comparison between self-test current sense A/D conversion and over current threshold setting | R/C |
| 12 to 3 | 0000000000 | S_T_CURR | 10-bit ADC conversion of the CURRENT SENSE, performed during CURRENT SENSE self-test (storage of A/D conversion performed during self-test) | R/C |
| 2 + 1 | 00 | S_T_CURR_STATUS | Status of CURRENT SENSE self-test<br>00 > IDLE: Self-test not started<br>01 > RUN: Self-test execution in progress<br>10 > END: Self-test completed successfully (consistent data available on dedicated registers)<br>00 > ABORT: Self-test aborted (watchdog timeout, HWLO, S_T_STOP when not required) | R/C |

An electronic device (for instance, a device 340 embedding an e-fuse) as exemplified herein may include analog circuitry configured to be set to at least one self-test configuration, as well as self-test controller circuitry (for instance, 12) in turn comprising: an analog configuration and sensing circuit (for instance, 348, 362) configured to set the analog circuitry to at least one self-test configuration and to sense test signals occurring in the analog circuitry set to the at least one self-test configuration; a data acquisition circuit (for instance, 350, 364) configured to acquire and convert to digital the test signals sensed; and a fault event detection circuit (for instance, 354, 366) configured to check the test signals converted to digital against reference parameters.

In some embodiments, the self-test controller circuitry may include test coordination circuitry (for instance, the test sequencer 356) having an input port (for instance, 358, 378) configured to receive device control signals indicative of a set of self-test events, wherein the analog configuration and sensing circuit (for instance, 348, 362) is configured to set (for instance, T1, T2, T3) the analog circuitry to a plurality of self-test configurations (for instance, TE1, TE2, TE3) as a function of device control signals received at the test coordination circuitry.

The test sequencer 356 extensively discussed in the foregoing may be exemplary of such test coordination circuitry configured to co-ordinate performance of plurality of self-tests. This may occur in a certain "serial" sequence as described herein for simplicity. Those of skill in the art will otherwise appreciate that one or more embodiments may contemplate tests performed at least partly concurrently, that is in parallel to one another.

In some embodiments, the test coordination circuitry (as exemplified by the sequencer 356) may include a finite state machine (for instance, 390, 392, 394, 396) sensitive to transition signals (for instance, ST_T_START, S_T_STOP) causing the test coordination circuitry to transition between idle states (for instance, 400, 406) through a self-test state (for instance, 402) during which the analog configuration and sensing circuit (16, 362) sets the analog circuitry to the at least one self-test configuration.

In some embodiments, the finite state machine in the test coordination circuitry may be configured to transition to a locked state (for instance, 404) in response to a self-test being aborted during the self-test state (for instance, 402). In some embodiments, the self-test controller circuitry may include a datapath configuration circuit (for instance, 20), intermediate the data acquisition circuit (18, 364), and the fault event detection circuit (22, 366), the datapath configuration circuit configured to provide a plurality of digital processing datapath configurations for the test signals converted to digital.

A method of operating an electronic device as exemplified herein may include activating (for instance, 358, 372) the self-test controller circuitry wherein, in response to the self-test controller circuitry being activated: the analog configuration and sensing circuit sets the analog circuitry to at least one self-test configuration and senses test signals occurring in the analog circuitry set to the at least one self-test configuration; the data acquisition circuit acquires and converts to digital the test signals sensed; the fault event detection circuit checks the test signals converted to digital against reference parameters and issues at least one fault detection signal (for instance, 376) in response to the checking indicating the test signals converted to digital failing to match the reference parameters. In a method as exemplified herein, activating the self-test controller circuitry may include an auto-start control (for instance, 372) of the self-test controller circuitry. In a method as exemplified herein, activating the self-test controller circuitry may include activating a plurality of self-test events (in a method as exemplified herein, T1, TE1; T2, TE2; T3, TE3), wherein the analog configuration and sensing circuit sets the analog circuitry to a plurality of self-test configurations.

Figure 30:
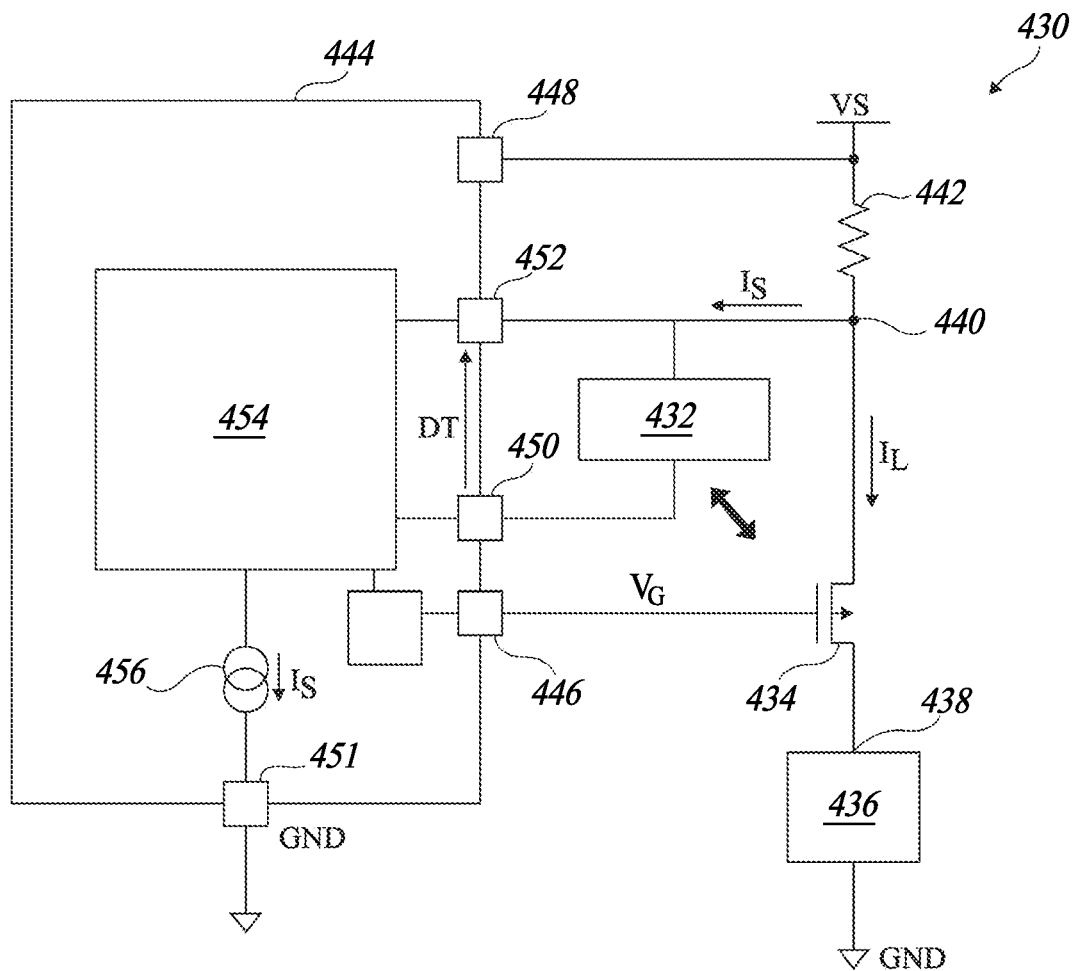
FIG. 30 illustrates a device including a circuit configured to determine the temperature of a transistor, in accordance with one or more embodiments.

FIGS. 30-35 illustrate components, circuits, systems, and processes that can be incorporated within or utilized by the external MOS temperature sensing subsystem 114, in some embodiments. FIG. 30 illustrates an embodiment of a device 430 including a circuit 432 configured to determine the temperature of a transistor 434. The device 430 may include a load 436. The load 436 is powered by a supply voltage VS, applied on a node. The supply voltage is for example a high voltage, in other words, the supply voltage is for example higher than 430V, for example higher than 458 V, for example substantially equal to 468 V.

The load 436 is coupled between the node and a node on which is applied a reference voltage GND, for example the ground. The load may include a terminal 438 coupled to the node and another terminal coupled, preferably connected, to the node. The load 436 is coupled to the node by the transistor 434. The transistor 434 is for example a Metal—oxide—semiconductor field effect transistor (MOSFET). The transistor 434 is for example a power MOSFET. The transistor 434 is for example a transistor with an n-type channel.

A first terminal of the transistor 434, corresponding to the source of the transistor 434, is coupled, preferably connected, to the node 438 and a second terminal 440 of the transistor 434, corresponding to the drain of the transistor 434, is coupled, preferably connected, to the node. In FIG. 30, the drain 440 of the transistor 434 is coupled to the node by a resistor 442. A terminal of the resistor 442 is coupled, preferably connected, to node and another terminal of the resistor 442 is coupled, preferably connected, to the drain 440 of the transistor 434.

The device 430 may include a chip 444. The chip 444 is for example an integrated circuit. The chip 444, for example, may include several circuits not represented, configured to implement one or more functions. The chip 444 may include, in particular, a circuit 447 configured to control the transistor 434. The chip 444 may include an input/output pad 446 on which is applied, by the circuit 447, a control signal VG of the transistor 434. In other words, the circuit 447 may include an output, on which is generated the control signal VG, coupled, preferably connected, to the input/output pad 446 of the chip 444. The output 446 of the chip is coupled, preferably connected, to the gate of the transistor 434. Therefore, the gate of the transistor 434 receives the signal VG.

The chip 444 is for example supplied with the supply voltage VS. The chip 444 may include an input/output pad 448 coupled, preferably connected, to the node. The chip also may include an input/output pad 451 coupled, preferably connected, to a node on which is applied a reference voltage, for example the node on which is applied the voltage GND. The transistor 434 is an external component to the chip 444. In other words, the transistor 434 is not included in the chip 444 or located on the chip 444. Similarly, the load 436 and the resistor 442 are for example external to the chip 444.

The device 430 may include the circuit 432. The circuit 432 is external to the chip 444. The circuit 432 is configured to generate a signal DT, for example a voltage, representing the temperature around the circuit 432. The circuit 432 is configured to generate the signal DT representing the temperature of the transistor 434. The circuit 432 is close, and thermally coupled, enough to the transistor 434 that the variations of the signal DT represents the variation of the temperature of the transistor 434. The circuit 432 may include an electrical component having a feature varying according to its temperature. This component is close enough to the transistor 434 that the variations of the signal DT represent the variation of the temperature of the transistor 434. For example, the component is less than 1 mm from the transistor 434.

A terminal of the circuit 432 is coupled, preferably connected, to the drain 440 of the transistor 434. Another terminal of the circuit 432 is coupled, preferably connected, to an input/output pad 450 of the chip 444. The chip 444 further may include an input/output pad 452 coupled, preferably connected, to the drain 440 of the transistor 434. The signal DT is for example the voltage between the two terminals of the circuit 432. In other words, the signal DT is the voltage between the pads 450 and 452. The transistor 434 for example may include a bulk substrate.

The bulk substrate is the heat dissipating terminal of the transistor 434. Most of the heat generated by the transistor 434 is dissipated by the bulk. Said bulk substrate corresponds to the drain terminal. Therefore, having a terminal of the circuit 432 coupled, preferably connected, to the drain, in other words to the bulk substrate, of the transistor 434 ensures that the circuit 432 is close to the heat generated by the transistor 434 and that it does not need to be electrically insulated from the transistor. Therefore, the signal DT representing the temperature of the transistor 434 is more precise.

The drain of the transistor 434 for example rests on a metal plate, forming the drain electrode. At least one component of the circuit 432 is for example formed in a semiconductor region resting on the metal plate. The heat generated in the transistor is therefore easily and quickly transferred from the transistor 434 to the circuit 432. In consequence, a terminal of the circuit 432 is coupled to the node. The voltage on the input/output pad 452 is for example substantially equal to the voltage VS and the voltage on the input 450 is for example substantially equal to the voltage VS minus the voltage DT. Both values of voltage are high values, for example higher than 20 V. Such values might not be used by any circuit powered by a lower supply voltage, for example a supply voltage lower than 10 V, without damaging the component. For example, analog to digital converter might not be used on such signals.

The chip 444 may include a circuit 454. The circuit 454 is configured to generate a signal, or voltage, representing the temperature of the transistor 434. For example, the circuit 454 is configured to generate a signal corresponding to the voltage DT in a different voltage domain. For example, the circuit 454 is configured to provide the signal to the circuit 447. The circuit 454 is for example coupled, preferably connected, to the circuit 447. Furthermore, the circuit 454 may include a level shifter, not represented. The signal generated by the circuit 454 is for example shifted to a logic level. In other word the voltage generated by the circuit 436 can safely be used by circuit configured to be powered by a supply voltage lower than 10 V, for example substantially equal to 5 V.

The circuit 454 for example may include a terminal coupled to the pad 451 by a current source 456. The circuit 432 could be placed physically close to the transistor 434 without connecting the circuit 432 to the drain of the transistor 434. For example, a terminal of the circuit 432 could be coupled to the node. Therefore, the circuit 432 could have been configured to be supplied with a supply voltage lower than the voltage VS, for example a voltage lower than 10 V, for example the supply voltage of logic circuits. In that case, the control circuit 454 associated to the circuit 432 would be in a different voltage domain than the transistor 434 and would not need to include a level shifter. However, the circuit 432 would need to be electrically insulated from the transistor 434. Any type of electrical insulation would imply some level of thermal insulation. Therefore, the measure of the temperature would be less precise and slower to react in case of overheating.

Figure 31:
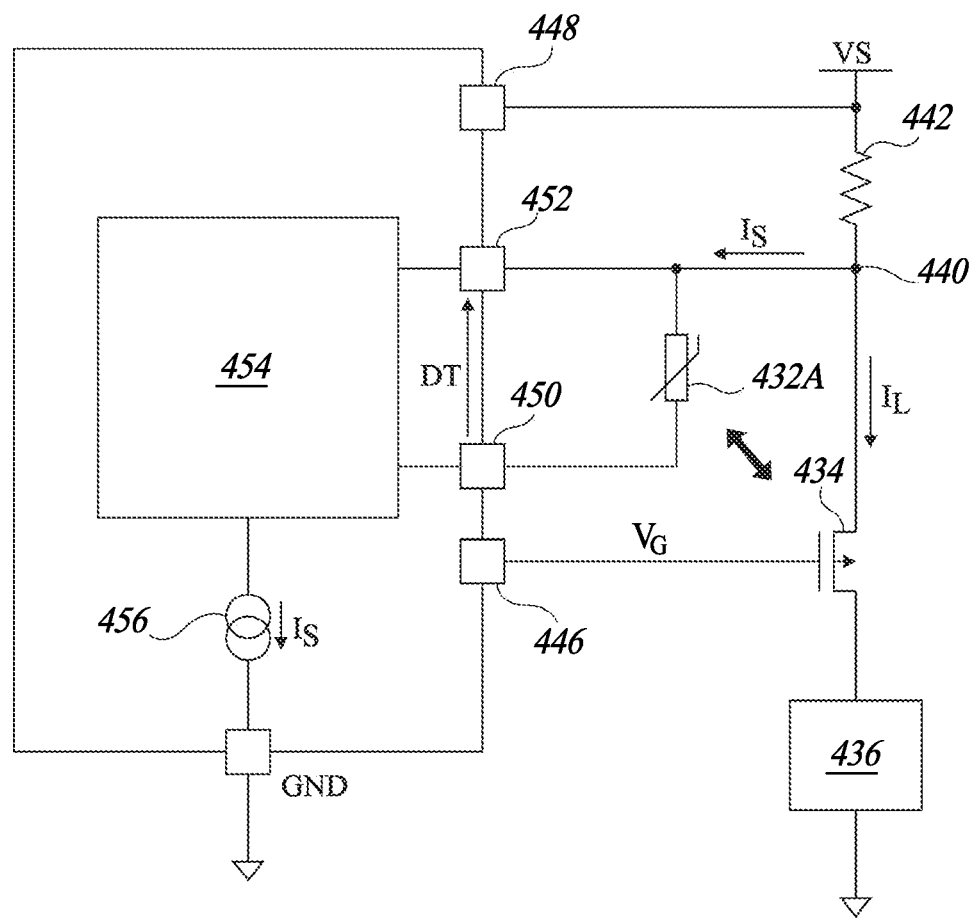
FIG. 31 illustrates another embodiment of a device including a circuit configured to determine the temperature of a transistor, in accordance with one or more embodiments.

FIG. 31 illustrates another embodiment of a device including a circuit configured to determine the temperature of a transistor. More precisely, FIG. 31 illustrates in more detail a version of the embodiment of FIG. 30. FIG. 31 may include all the elements of FIG. 30, which will not be described again.

In the variant of FIG. 31, the circuit 432 may include a thermistor 432a, in other words a type of resistor whose resistance is strongly dependent on temperature. For example, the circuit 432 only may include the thermistor 432a. The thermistor 432a is for example a thermistor with a negative temperature coefficient (NTC). The thermistor 432a is an external component to the chip 444. The thermistor 432a is coupled between the drain 440 of the transistor 434 and the input/output pad 450. In other words, a terminal of the thermistor 432a is coupled, preferably connected, to the drain 440 of the transistor 434. Another terminal of the thermistor is coupled, preferably connected, to the pad 450, and therefore to the circuit 454. For example, the thermistor 432a is less than 1 mm from the transistor 434. As the drain 440 is coupled, preferably connected, to the pad 452, the thermistor 432a is coupled between the pads 450 and 452. The voltage DT representing the temperature of the transistor 434 corresponds to the voltage between the terminals of the thermistor 432a. According to another embodiment, the thermistor 432a could for example be a thermistor with a positive temperature coefficient (PTC).

Figure 32:
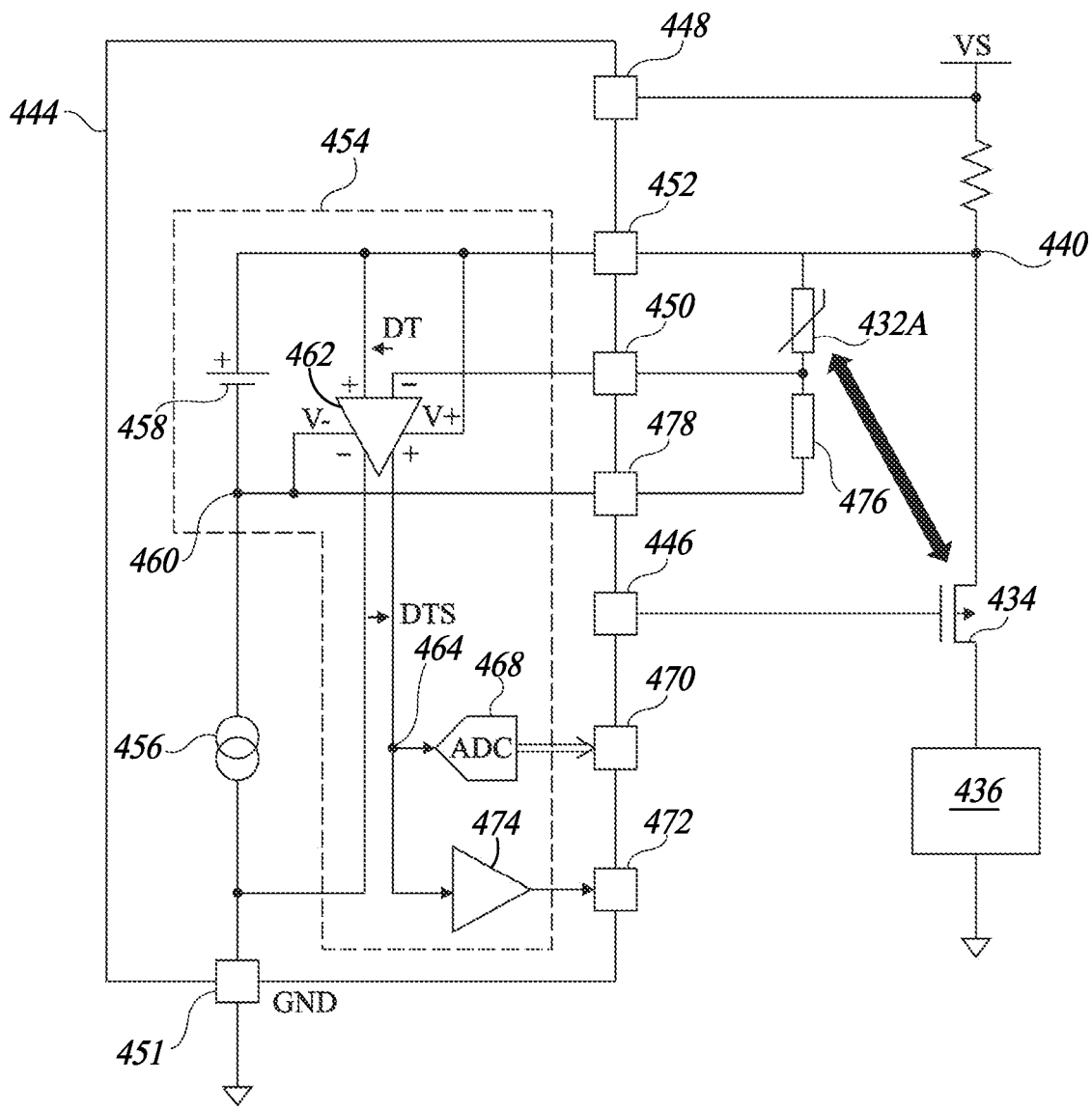
FIG. 32 illustrates in more detail an example of implementation of the embodiment of FIG. 31, in accordance with one or more embodiments.

FIG. 32 illustrates in more detail an example of implementation of the embodiment of FIG. 31. FIG. 32 may include all the elements of FIG. 31, which will not be described again. The circuit 454 may include a floating supply. In the example of FIG. 32, the floating supply is implemented by a voltage source 458 coupled in series with the current source 456. The sources 456 and 458 are coupled between the pads 452 and 451. The source 458 is coupled between the pad 452 and a node 460 and the source 456 is coupled between the node 460 and the pad 451. In other words, a terminal, for example the positive terminal (+) of the source 458 is coupled, preferably connected, to the pad 452 and another terminal, for example the negative terminal, of the source 458 is coupled, preferably connected, to the node 460. A terminal of the source 456 is coupled, preferably connected, to the pad 451 and another terminal of the source 456 is coupled, preferably connected, to the node 460.

The circuit 454 may include a level shifter. The level shifter may include an amplifier 462. The amplifier 462 may include first and second inputs configured to receive the voltage DT. In other words, the first input, for example the negative input (−), is coupled, preferably connected, to the pad 450, in other words to one of the terminals of the thermistor 432a. The second input, for example the positive input (+), is coupled, preferably connected, to the pad 452, in other words to the other one of the terminals of the thermistor 432a.

The amplifier 462 also may include a terminal configured to receive a first supply voltage V+. Said terminal is for example coupled, preferably connected, to the pad 452. The voltage V+ is for example substantially equal to the voltage VS. The amplifier 462 also may include a terminal configured to receive a second supply voltage V−. Said terminal is for example coupled, preferably connected, to the node 460. The voltage V− is for example lower than the first supply voltage V+.

The amplifier 462 may include first and second outputs configured to generate a voltage DTS, corresponding to the voltage DT shifted to another voltage domain. In other words, the first output, for example the negative output (−), is coupled, preferably connected, to the pad 451, in other words to the node of application of the reference voltage GND. The second output, for example the positive output (+), is coupled, preferably connected, to a node 464. Therefore, the voltage DTS on the node 464 is referenced on the reference voltage GND.

In the example of FIG. 32, the circuit 454 may include a converter 468 analog to digital (ADC). The converter 468 may include an input coupled, preferably connected, to the node 464. The converter 468 may include an output on which is generated a digital signal representing the signal DT. Said output is for example coupled, preferably connected, to an input/output pad 470. Therefore, the chip 444 for example generates on the pad 470 a binary signal representing the temperature of the transistor 434. The node 464 is also for example coupled, preferably connected, to an input/output pad 472, for example by an amplifier 474. In other words, the amplifier 474 may include an input coupled, preferably connected, to the node 464 and an output coupled, preferably connected, to the pad 472. Therefore, the chip 444 for example generates on the pad 472 an analog signal representing the temperature of the transistor 434.

According to another embodiment, the chip 444 can include the converter 468 and the pad 470 but not the amplifier 474 and the pad 472. The chip 444 can also include the amplifier 474 and the pad 472 and not the converter 468 and the pad 470. Either or both of the pads 470 and 472 can for example be coupled to a circuit not represented configured to determine if the temperature of the transistor 434 is higher than a given value. If this is the case, the circuit can ensure that the transistor is switched off, for example by changing the value of the control signal on the gate of the transistor 434.

According to another embodiment, the circuit not represented configured to determine if the temperature of the transistor 434 is higher than a given value is located on the chip 444. Therefore, the output of the converter 468 and/or the output of the amplifier 474 can be coupled, preferably connected, to the circuit not represented and may not be coupled to input/output pads. Said circuit not represented can for example be associated with the circuit configured to generate the control signal of the transistor 434.

In the example of FIG. 32, the device also may include a resistor 476. The resistor 476 is for example external to the chip 444. The resistor is coupled in series with the thermistor 432a between the drain 440 and the node 460. More precisely, the resistor 476 is coupled between the input/output pad 450 and an input/output pad 478 of the chip 444. A terminal of the resistor 476 is coupled, preferably connected, to the pad 450 and another terminal of the resistor 476 is coupled, preferably connected, to the pad 478. The pad 478 is coupled, preferably connected, to the node 460.

Figure 33:
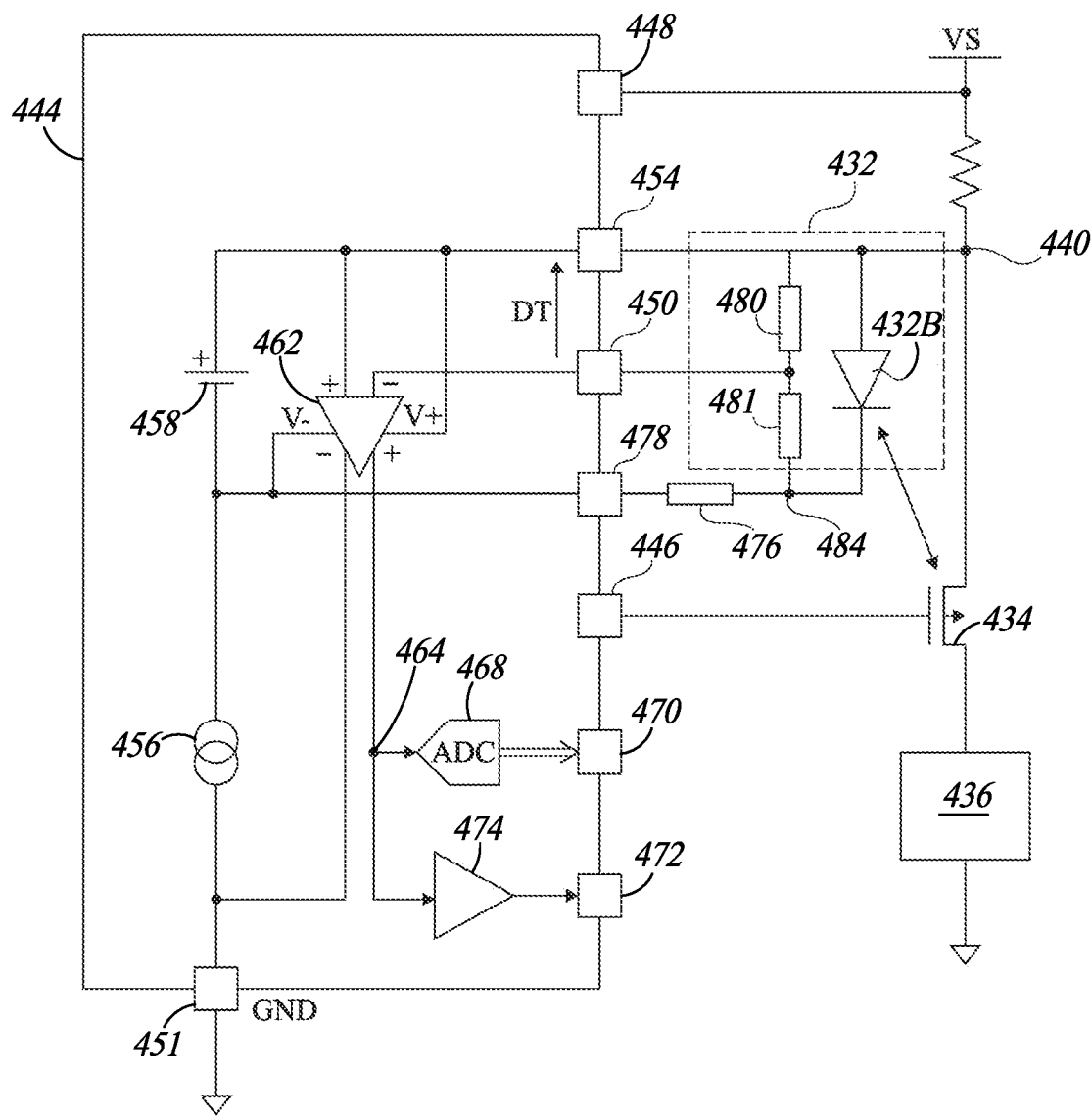
FIG. 33 illustrates another embodiment of a device including a circuit configured to determine the temperature of a transistor, in accordance with one or more embodiments.

FIG. 33 illustrates another embodiment of a device including a circuit configured to determine the temperature of a transistor. FIG. 33 may include all the elements of FIG. 32, which will not be described again. The device of FIG. 33 differs from the device of FIG. 32 in that the thermistor 432a is replaced by resistors 480 and 481 and a diode 432b. Therefore the circuit 432 may include the resistors 480 and 481 and the diode 432b. The resistors 480 and 481 are coupled in series between the node 440 and a node 484. In other words, a terminal of the resistor 480 is coupled, preferably connected, to the drain 440 and to the pad 452. Another terminal of the resistor 480 is coupled, preferably connected, to the pad 450.

A terminal of the transistor 481 is coupled, preferably connected, to the pad 450 and another terminal is coupled, preferably connected, to the node 484. In this embodiment, the resistor 476 is coupled between the node 484 and the pad 478. In other words, a terminal of the resistor 476 is coupled, preferably connected, to the node 484 and another terminal of the resistor 476 is coupled, preferably connected, to the pad 478. The pad is therefore coupled to the pad 450 by two resistors in series.

The diode 432b of circuit 432 may include a terminal, for example the anode, coupled, preferably connected, to the drain 440. The diode 432b may include another terminal, for example the cathode, for example coupled, preferably connected, to the node 484. Therefore, the diode 432b is coupled in parallel with the association of the resistors 480 and 481. The voltage between the terminals of the diode 432b, corresponding substantially to the voltage between the pads 452 and 58, is dependent on the temperature of the transistor 434. Furthermore, the voltage DT, corresponding to the voltage between the pads 450 and 452, depends on the voltage between the terminals of the diode 432b and therefore on the temperature. The diode 432b is preferably located as close as possible to the transistor 434. For example, the semiconductor region corresponding to the anode of the diode 432b lays, and is preferably in contact with, the metal plate on which lays the semiconductor region corresponding to the drain of the transistor 434.

Figure 34:
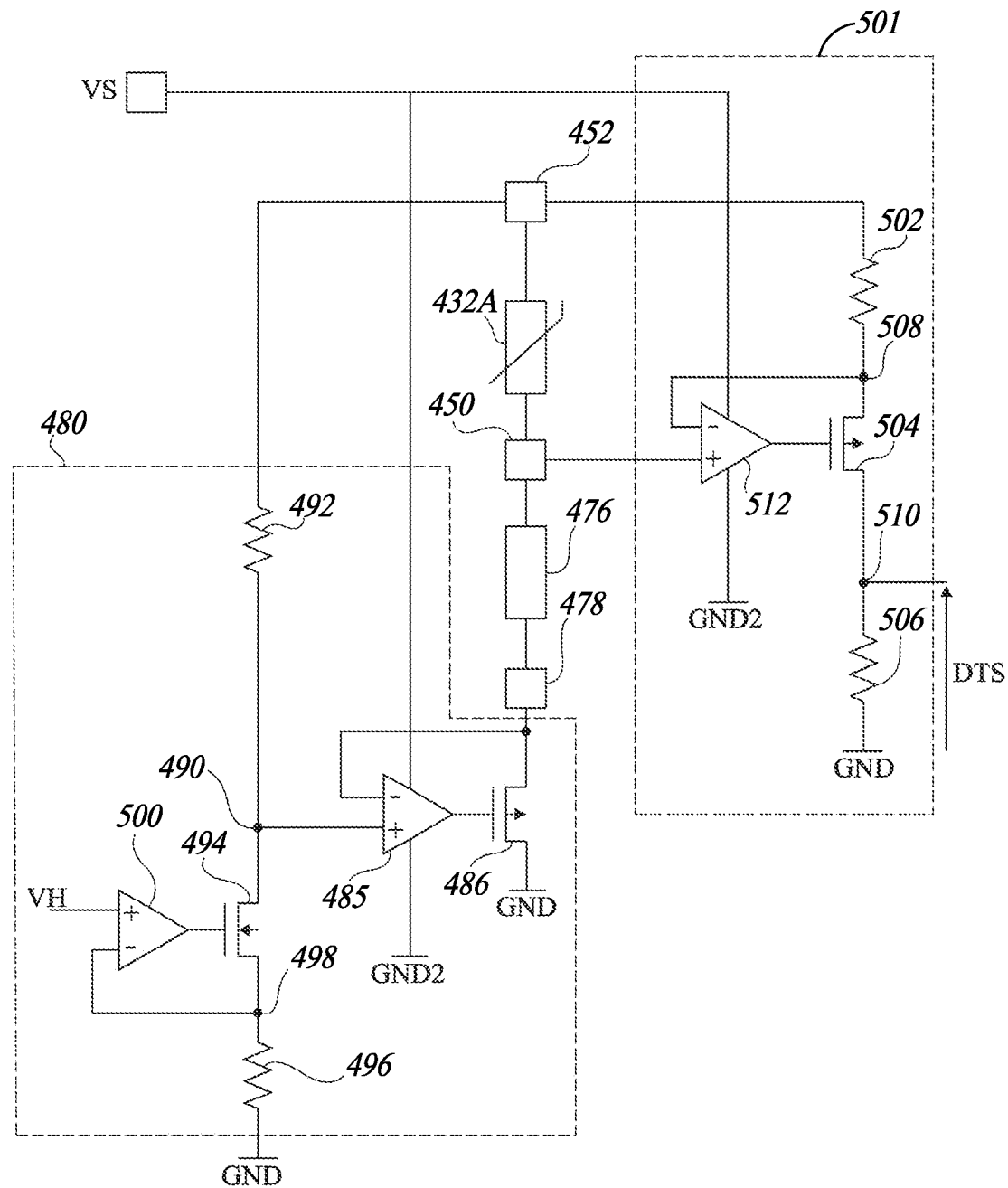
FIG. 34 illustrates in more detail components associated with FIGS. 30-31, in accordance with one or more embodiments.

FIG. 34 illustrates in more detail a part of the embodiments of FIGS. 448 to 451. More precisely, FIG. 34 represents in more detail a part of the circuit 454. FIG. 34 represents the pads 448, 450, 452 and 478 as well as the thermistor 432a and the resistor 476 of FIG. 32. These elements are the same as in FIG. 32 and will not be described again.

FIG. 34 represents a floating supply 480 and a level shifter 501. The floating supply 480 and the level shifter 501 are included in the circuit 454. The floating supply 480 and the level shifter 501 are preferably located on the chip 444. The floating supply 480 for example replaces the sources 456 and 458 of FIG. 32. The level shifter for example replaces the amplifier 462. The floating supply 480 may include a transistor 486. The transistor 486 is for example a MOSFET. The transistor 486 has for example a p-type channel. The transistor 486 is coupled between the pad 478 and the node of application of the reference voltage GND. In other words, a terminal of the transistor 486, drain or source, for example the source, is coupled, preferably connected, to the pad 478 and another terminal of the transistor 486, drain or source, for example the drain, is coupled, preferably connected, to the node.

The floating supply 480 may include an operational amplifier 488. The amplifier 488 is configured to generate the control signal of the transistor 486. The amplifier 488 may include an output coupled, preferably connected, to the control terminal, or gate, of the transistor 486. The amplifier 488 may include a non-inverting input coupled, preferably connected, to a node 490. The amplifier 488 may include an inverting input coupled, preferably connected, to the pad 478. The amplifier 488 receives the supply voltage VS. More precisely, the amplifier may include an input coupled, preferably connected, to the node 448 and another input coupled, preferably connected, to a node of application of a reference voltage GND2. The voltage GND2 is for example different from the reference voltage GND.

The floating supply 480 also may include a resistor 492, a transistor 494 and a resistor 496 coupled in series between the pad 452 and the node. More precisely, the resistor 492 is coupled between the pad 452 and the node 490. In other words, a terminal of the resistor 492 is coupled, preferably connected, to the pad 452 and another terminal of the resistor 492 is coupled, preferably connected, to the node 490.

The transistor 494 is for example a MOSFET. The transistor 494 has for example an n-type channel. The transistor 494 is coupled between the node 490 and a node 498. In other words, a terminal of the transistor 494, drain or source, for example the source, is coupled, preferably connected, the node 498 and another terminal of the transistor 494, drain or source, for example the drain, is coupled, preferably connected, to the node 490.

The resistor 496 is coupled between the node 498 and the node. In other words, a terminal of the resistor 496 is coupled, preferably connected, to the node 498 and another terminal of the resistor 496 is coupled, preferably connected, to the node. The floating supply 480 further may include an operational amplifier 500. The amplifier 500 is configured to generate the control signal of the transistor 494. The amplifier 500 may include an output coupled, preferably connected, to the control terminal, or gate, of the transistor 494. The amplifier 500 may include a non-inverting input configured to receive a set voltage VH. The amplifier 500 may include an inverting input coupled, preferably connected, to the node 498.

The current source 456 of FIG. 32 is replaced in FIG. 34 by the amplifier 500, the transistor 494 and the resistor 496. The voltage source of FIG. 32 is replaced in FIG. 34 by the resistor 492, the operational amplifier 488 and the transistor 486. The level shifter 501 may include a resistor 502, a transistor 504 and a resistor 506 coupled in series between the pad 452 and the node. More precisely, the resistor 502 is coupled between the pad 452 and a node 508. In other words, a terminal of the resistor 502 is coupled, preferably connected, to the pad 452 and another terminal of the resistor 502 is coupled, preferably connected, to the node 508.

The transistor 504 is for example a MOSFET. The transistor 504 has for example a p-type channel. The transistor 504 is coupled between the node 508 and a node 510. In other words, a terminal of the transistor 504, drain or source, for example the source, is coupled, preferably connected, to the node 508 and another terminal of the transistor 504, drain or source, for example the drain, is coupled, preferably connected, to the node 510. The resistor 506 is coupled between the node 510 and the node. In other words, a terminal of the resistor 506 is coupled, preferably connected, to the node 510 and another terminal of the resistor 506 is coupled, preferably connected, to the node. The node 510 correspond to the output of the level shifter. Therefore, the voltage DTS of FIG. 32 corresponds to the voltage between the nodes 510 and. The node 510 is for example coupled to a converter analog to digital, such as the converter 468 of FIG. 32, and/or to an amplifier, such as the amplifier 474 of FIG. 32.

The level shifter 501 further may include an operational amplifier 512. The amplifier 512 is configured to generate the control signal of the transistor 504. The amplifier 512 may include an output coupled, preferably connected, to the control terminal, or gate, of the transistor 504. The amplifier 512 may include a non-inverting input coupled, preferably connected, to the pad 450. The amplifier 512 may include an inverting input coupled, preferably connected, to the node 508. The amplifier 512 receives the supply voltage VS. More precisely, the amplifier 512 may include an input coupled, preferably connected, to the node 448 and another input coupled, preferably connected, to the node of application of the reference voltage GND2.

Figure 35:
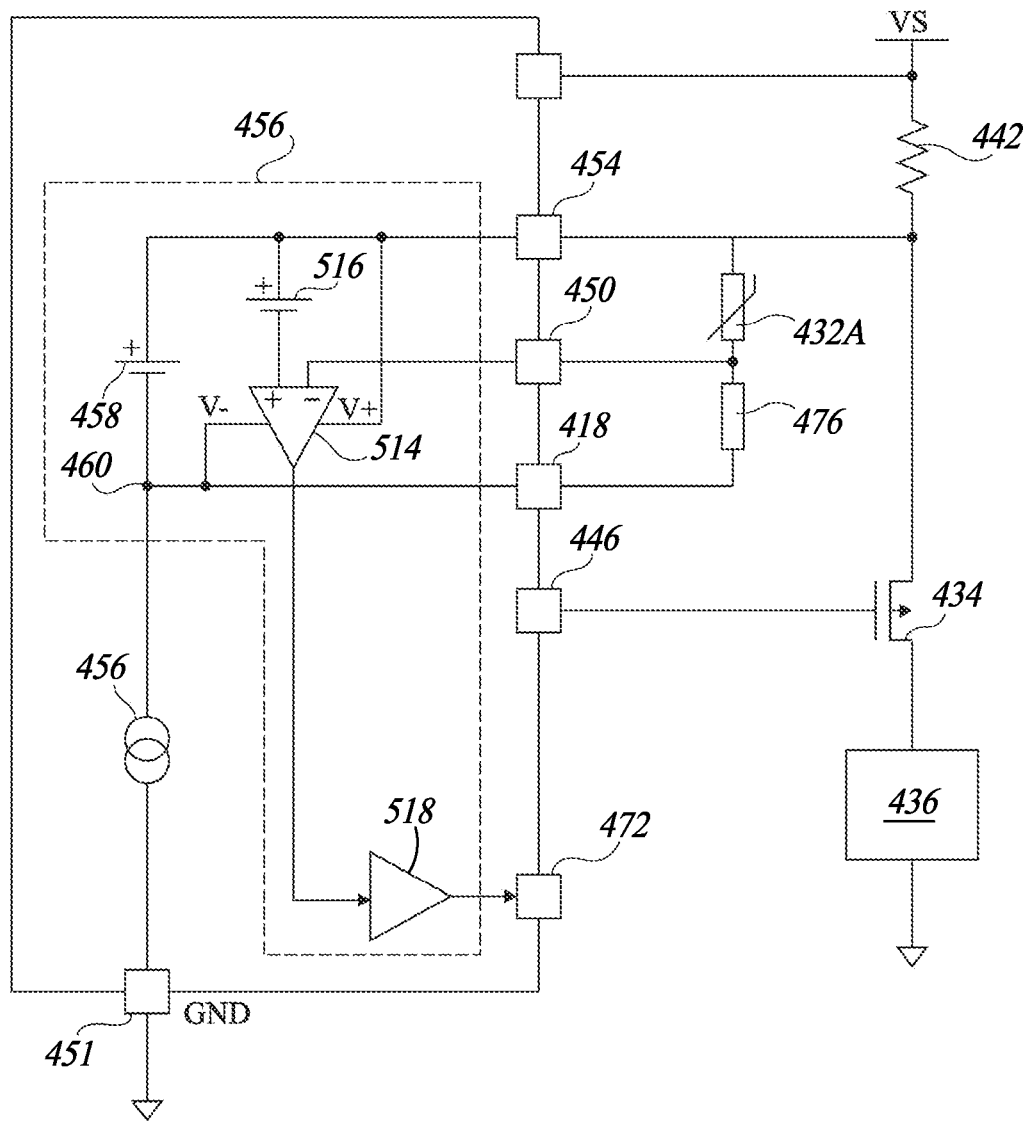
FIG. 35 illustrates another embodiment of a device including a circuit configured to determine the temperature of a transistor, in accordance with one or more embodiments.

FIG. 35 illustrates another embodiment of a device including a circuit 432a configured to determine the temperature of a transistor 434. More precisely, FIG. 35 represents an alternative to the circuit 454 of FIG. 32. The device of FIG. 35 may include several elements of the device of FIG. 32, which will not be described again. In particular, the device of FIG. 35 may include the resistor 442, the thermistor 432a, the resistor 476, the transistor 434, the load 436 and the sources 456 and 458.

The device of FIG. 35 differs from the device of FIG. 32 in that the circuit 454 does not include the converter 468, that the amplifier 462 of FIG. 32 is replaced by a comparator 514 and the amplifier 474 is replaced by a digital output buffer 518. The chip 444 does not, therefore, include the pad 470 configured in FIG. 32 to provide the binary output signal. The comparator 514 may include an output, for example a single output, coupled to the pad 472 by the buffer 518. The output of the comparator is coupled, preferably connected, to an input of the buffer 518. An output of the buffer is coupled, preferably connected, to the pad 472.

The comparator 514 may include, like the amplifier 462 of FIG. 32, a terminal configured to receive a first supply voltage V+. Said terminal is for example coupled, preferably connected, to the pad 452. The voltage V+ is for example substantially equal to the voltage VS. The comparator 514 also may include a terminal configured to receive a second supply voltage V−. Said terminal is for example coupled, preferably connected, to the node 460. The voltage V− is for example lower than the first supply voltage V+.

The comparator 514 may include an input, for example a negative input (−), coupled, preferably connected, to the pad 450. The comparator 514 may include another input, for example a positive (+) input, coupled to the pad 452 by a voltage source 516. In other words, a terminal of the source 516, for example the positive (+) terminal, is coupled, preferably connected, to the node 452 and another terminal of the source 516 is coupled, preferably connected, to the input of the amplifier 462, for example the positive input. The embodiment of FIG. 35 compares the temperature of the transistor 434 to a given threshold. More precisely, the circuit 444 compares, with the comparator 514, a voltage value on the pad 450 representing the temperature of the transistor 434 to a voltage, provided by the source 516. Therefore, the circuit 444 provides on the pad 472 a first value if the temperature of the transistor 434 is below the threshold and a second value if the temperature of the transistor 434 is above the threshold. An advantage of the embodiments describes is that the detection of the temperature is more precise and faster.

Figure 36:
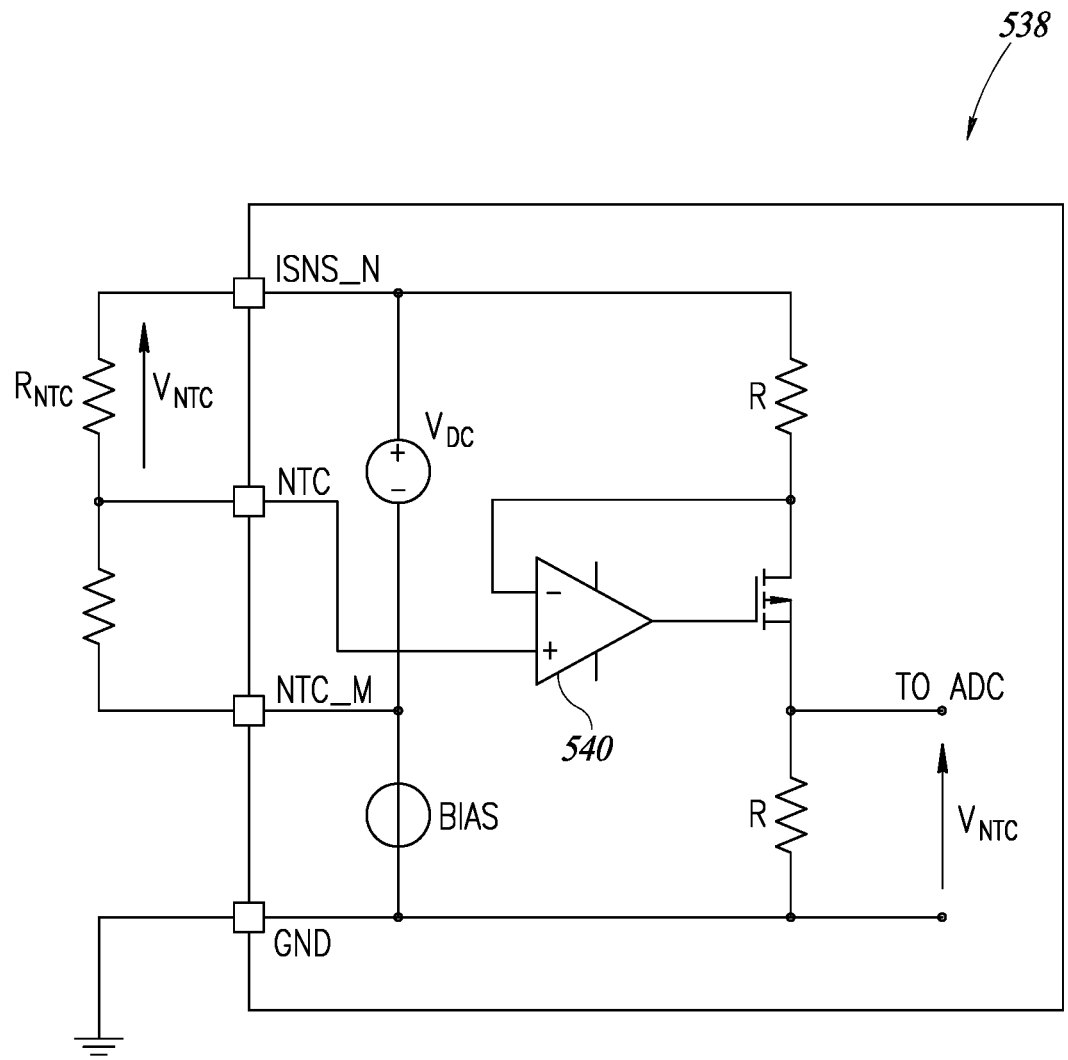
FIG. 36 illustrates and NTC bridge, in accordance with one or more embodiments.

FIG. 36 illustrates an NTC bridge circuit 538, in accordance with some embodiments. The NTC bridge 538 is coupled to external resistors Rntc and Rt via terminals ISNS_N, NTC, and NTC_M. The NTC bridge 538 includes voltage source VDC and a bias generator BIAS. The NTC bridge 538 includes a transistor coupled between resistors R. The output of the NTC bridge 538 corresponds to the node between the source terminal of the transistor and the lower resistor R. The voltage drop VNTC across the lower resistor R corresponds to the output of the NTC bridge 538 and is provided to an ADC for conversion. Other components and configurations can be utilized without departing from the scope of the present disclosure.

Some embodiments utilize a universal $I^2t$ control curve (or universal eFuse) that is defined with a finite number of points (current, reaction time) where all the values of the current are normalized to the maximum current in DC (when reaction time=∞). In other words the curve is described with a two column matrix where the element of the first column are the normalized currents (1, K1, K2, . . . Kn) and the second column are the reaction times (∞, t1, t2, . . . , tn). Any safety area defined in the IT diagram to specify the $i^2t$ capability of a given conductor size can be expressed by multiplying each K parameter by INOM where INOM is the MAX DC current specified for the given conductor size (or wire harness). In some embodiments, a series of reaction times may be expressed as a multiple of $\frac{1}{2}^{(n+1)}$, however, it is possible to obtain the same result with different selection of the reaction times. In other words, the reaction times can be selected in an arbitrary way, in some embodiments, and for each arbitrary reaction time we can define a normalized value of the current.

In some embodiments, normalized (1, K1, K2, . . . Kn) parameters applied to the method to allow the system to react when the current IRMS (Current Mean Square Root) flows in the conductor for a time higher than the time defined by the safety area limited by the obtained $I^2t$ curve. This is valid for any shape of current waveform (square wave, triangular, any random behavior).

In some embodiments, a method for setting the timing of the $I^2t$ control so that the speed of the E-Fuse can be changed respect to a nominal value without changing the nominal DC current. This allow the $I^2t$ curve to be adapted to cables with different thermal capacity (ex: Al instead of Cu) but with the same nominal current.

The various embodiments described herein can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electronic fuse, comprising:
   current sensing circuitry configured to sense a current in a conductor coupled between a power supply and a load and to generate a current sensing signal indicative of the sensed current;
   current squared times time (I2t) circuitry that emulates an I2t curve of the conductor, the I2t circuitry configured to receive the current sensing signal and determine whether the sensed current exceeds the I2t curve of the conductor; and
   at least one of:
      external MOSFET temperature sensing circuitry configured to sense a temperature of an external MOSFET coupled to the conductor;
      low current bypass circuitry configured to supply a reduced current to the load in a low power consumption mode during which the external MOSFET is in a non-conductive state; or
      desaturation sensing circuitry configured to sense a drain-source voltage of the external MOSFET.

2. The electronic fuse of claim 1, further comprising a gate driver configured to receive a control signal from the I2t circuitry in response to the I2t circuitry determining that the sensed current exceeds the I2t curve of the conductor, and switch the external MOSFET into the non-conductive state in response to receiving the control signal.

3. The electronic fuse of claim 1 wherein the I2t circuitry includes:
   logic circuitry configured to compare the sensed current to a plurality of first thresholds, each of the plurality of first thresholds being different from one another; and
   counter circuitry configured to adjust a counting value speed and direction based on the comparison of the sensed current to each of the plurality of first thresholds, and generate an overflow signal in response to the counting value reaching or exceeding a threshold counting value.

4. The electronic fuse of claim 3 wherein the I2t circuitry further includes:
   latch-off circuitry including a comparator configured to compare the sensed current to a second threshold, and generate an interrupt signal in response to the sensed current exceeding the second threshold.

5. The electronic fuse of claim 4, further comprising:
   a gate driver,
   wherein the latch-off circuitry includes a logical OR gate, including:
      a first input coupled to an output of the counter circuitry,
      a second input coupled to an output of the comparator, and
      an output coupled to an input of the gate driver,
   wherein the logical OR gate is configured to output a control signal to the gate driver in response to receiving the overflow signal or the interrupt signal, the gate driver configured to switch the external MOSFET into the non-conductive state in response to receiving the control signal.

6. The electronic fuse of claim 1 wherein the current sensing circuitry is configured to sense the current in the conductor by sensing the current through a shunt resistor that is electrically coupled in series to the conductor between the power supply and the load, and to generate a voltage indicative of the sensed current.

7. The electronic fuse of claim 6 wherein the current sensing circuitry includes an analog-to-digital converter (ADC) configured to convert the voltage indicative of the sensed current into a digital voltage signal.

8. The electronic fuse of claim 7 wherein the current sensing circuitry includes self-testing circuitry configured to test a current sensing function of the current sensing circuitry, and generate a test signal indicating a result of the test.

9. The electronic fuse of claim 8 wherein the self-testing circuitry includes:
   a first comparator configured to perform a first comparison of the digital voltage signal to a first voltage threshold; and
   a second comparator configured to perform a second comparison of the digital voltage signal to a second voltage threshold,
   wherein the self-testing circuitry is configured to generate the test signal based on the first and second comparisons.

10. The electronic fuse of claim 1, comprising the external MOSFET temperature sensing circuitry, the external MOSFET temperature sensing circuitry including temperature sensitive resistor circuitry configured to sense a voltage across a temperature sensitive resistor, the temperature sensitive resistor having a first terminal coupled to a drain of the external MOSFET,
   wherein the electronic fuse is configured to switch the external MOSFET into the non-conductive state based on the sensed voltage across the temperature sensitive resistor.

11. The electronic fuse of claim 10, further comprising:
   temperature monitoring logic circuitry coupled to an output of the external MOSFET temperature sensing circuitry, the temperature monitoring logic circuitry including a comparator configured to:

receive a signal indicative of the sensed voltage across the temperature sensitive resistor, compare the received signal to a threshold, and generate an external MOSFET switch-off signal in response to the received signal exceeding the threshold.

12. The electronic fuse of claim 10 wherein the electronic fuse is configured to switch the external MOSFET into the non-conductive state based on the sensed voltage across the temperature sensitive resistor autonomously and without intervention or instruction from circuitry or devices external to the electronic fuse.

13. The electronic fuse of claim 1, comprising the low current bypass circuitry, the low current bypass circuitry including:
a bypass transistor selectively operable to supply the reduced current to the load in the low power consumption mode;
Vds sensing circuitry configured to sense a voltage drop across the bypass transistor; and
a comparator configured to compare the sensed voltage drop across the bypass transistor to a reference voltage and generate a control signal in response to the sensed voltage drop across the bypass transistor exceeding the reference voltage.

14. The electronic fuse of claim 13, further comprising bypass logic circuitry coupled to an output of the comparator, the bypass logic circuitry configured to:
generate a bypass transistor switch off signal in response to receiving the control signal; and
generate an external MOSFET switch on signal in response to receiving the control signal.

15. The electronic fuse of claim 14 wherein the bypass logic circuitry is configured to generate the external MOSFET switch on signal autonomously and without intervention or instruction from circuitry or devices external to the electronic fuse.

16. The electronic fuse of claim 1, comprising the desaturation sensing circuitry, the desaturation sensing circuitry including:
an analog-to-digital converter (ADC) configured to generate a digital signal indicative of the sensed drain-source voltage of the external MOSFET.

17. The electronic fuse of claim 16, further comprising desaturation logic circuitry, the desaturation logic circuitry including a comparator configured to compare the digital signal to a threshold, and generate an external MOSFET switch off signal in response to the comparison.

18. The electronic fuse of claim 16 wherein the desaturation sensing circuitry further includes self-testing circuitry configured to test a voltage sensing function of the desaturation sensing circuitry, and to generate a test signal indicating a result of the test.

19. The electronic fuse of claim 1, comprising each of the external MOSFET temperature sensing circuitry, the low current bypass circuitry, and the desaturation sensing circuitry.

20. The electronic fuse of claim 1, further comprising:
register circuitry configured to store information associated with a status or condition of the electronic fuse, a status or condition of the external MOSFET, or a measured parameter value received from one of the current sensing circuitry, the I2t circuitry, the external MOSFET temperature sensing circuitry, the low current bypass circuitry, or the desaturation sensing circuitry; and a communication interface communicatively coupled to the register circuitry, the communication interface configured to facilitate communication between a microcontroller and the register circuitry.

21. A device, comprising:
current sensing circuitry configured to sense a current in a conductor coupled between a power supply and a load, and generate a current sensing signal indicative of the sensed current;
current squared times time (I2t) circuitry that emulates an I2t curve of the conductor, the I2t circuitry configured to receive the current sensing signal and determine whether the sensed current exceeds the I2t curve of the conductor; and
self-testing circuitry configured to test a current sensing function of the current sensing circuitry, and generate a test signal indicating a result of the test.

22. The device of claim 21 wherein the self-testing circuitry includes:
a first comparator configured to compare a signal indicative of the sensed current to a first threshold, and output a first comparison signal; and
a second comparator configured to compare the signal indicative of the sensed current to a second threshold, and output a second comparison signal,
wherein the self-testing circuitry is configured to generate the test signal based on the first and second comparison signals.

23. A system, comprising:
a power supply;
a load;
a conductor electrically coupled to the power supply and the load;
current sensing circuitry configured to sense a current in the conductor, and generate a current sensing signal indicative of the sensed current; and
current squared times time (I2t) circuitry, including:
logic circuitry configured to compare the sensed current to a plurality of first thresholds, each of the plurality of first thresholds being different from one another;
counter circuitry configured to adjust a counting value speed and direction based on the comparison of the sensed current to each of the plurality of first thresholds, and generate an overflow signal in response to the counting value reaching or exceeding a threshold counting value; and
latch-off circuitry including a comparator configured to compare the sensed current to a second threshold, and generate an interrupt signal in response to the sensed current exceeding the second threshold.

24. The system of claim 23, further comprising:
a gate driver,
wherein the latch-off circuitry includes a logical OR gate, including:
a first input coupled to an output of the counter circuitry,
a second input coupled to an output of the comparator, and
an output coupled to an input of the gate driver,
wherein the logical OR gate is configured to output a control signal to the gate driver in response to receiving the overflow signal or the interrupt signal, the gate driver configured to switch the external MOSFET into the non-conductive state in response to receiving the control signal.

25. A method, comprising:
- sensing, with current sensing circuitry, a current in a conductor coupled between a power supply and a load;
- generating a current sensing signal indicative of the sensed current;
- emulating, with current squared times time (I2t) circuitry, an I2t curve of the conductor,
- determining whether the sensed current exceeds the I2t curve of the conductor;
- testing, with self-testing circuitry, a current sensing function of the current sensing circuitry; and
- generating a test signal indicating a result of the test.

26. The method of claim 25, wherein the self-testing circuitry includes:
- a first comparator configured to compare a signal indicative of the sensed current to a first threshold, and output a first comparison signal; and
- a second comparator configured to compare the signal indicative of the sensed current to a second threshold, and output a second comparison signal,
- wherein the self-testing circuitry is configured to generate the test signal based on the first and second comparison signals.

\* \* \* \* \*